United States Patent
Tanabe et al.

(10) Patent No.: US 11,335,541 B2
(45) Date of Patent: *May 17, 2022

(54) PLASMA PROCESSING APPARATUS, PLASMA PROCESSING METHOD, AND MEMORY MEDIUM

(71) Applicant: Canon Anelva Corporation, Kawasaki (JP)

(72) Inventors: Masaharu Tanabe, Fuchu (JP); Kazunari Sekiya, Hachioji (JP); Tadashi Inoue, Sagamihara (JP); Hiroshi Sasamoto, Tachikawa (JP); Tatsunori Sato, Hachioji (JP); Nobuaki Tsuchiya, Hamura (JP); Atsushi Takeda, Yokohama (JP)

(73) Assignee: CANON ANELVA CORPORATION, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/023,675

(22) Filed: Sep. 17, 2020

(65) Prior Publication Data

US 2021/0005429 A1 Jan. 7, 2021

Related U.S. Application Data

(63) Continuation of application No. PCT/JP2018/047319, filed on Dec. 21, 2018.

(30) Foreign Application Priority Data

Jun. 26, 2018 (WO) .................. PCT/JP2018/024146
Jun. 26, 2018 (WO) .................. PCT/JP2018/024147

(Continued)

(51) Int. Cl.
*H01J 37/32* (2006.01)
*H05H 1/46* (2006.01)

(52) U.S. Cl.
CPC .. *H01J 37/32183* (2013.01); *H01J 37/32577* (2013.01); *H01J 37/32715* (2013.01); *H05H 1/46* (2013.01); *H01J 2237/334* (2013.01)

(58) Field of Classification Search
None
See application file for complete search history.

(56) References Cited

U.S. PATENT DOCUMENTS 4,131,533 A 12/1978 Bialko et al.
4,284,489 A 8/1981 Weber
(Continued)

FOREIGN PATENT DOCUMENTS

CN 1155748 A 7/1997
CN 2907173 Y 5/2007
(Continued)

OTHER PUBLICATIONS

Office Action Summary dated Jan. 6, 2021, by the U.S Patent and Trademark Office in U.S. Appl. No. 16/720,154. (27 pages).

(Continued)

*Primary Examiner* — Srinivas Sathiraju
(74) *Attorney, Agent, or Firm* — Buchanan Ingersoll & Rooney PC

(57) ABSTRACT

A plasma processing apparatus includes an impedance matching circuit, a balun having a first unbalanced terminal connected to the impedance matching circuit, a grounded second unbalanced terminal, a first balanced terminal and a second balanced terminal, a grounded vacuum container, a first electrode electrically connected to the first balanced terminal, a second electrode electrically connected to the second balanced terminal, an adjustment reactance configured to affect a relationship between a first voltage applied to the first electrode and a second voltage applied to the second electrode, a high-frequency power supply configured (Continued)

to supply a high frequency between the first unbalanced terminal and the second unbalanced terminal via the impedance matching circuit, and a controller configured to control an impedance of the impedance matching circuit and a reactance of the adjustment reactance.

27 Claims, 63 Drawing Sheets

(30) Foreign Application Priority Data

Jun. 26, 2018 (WO) .................. PCT/JP2018/024148
Jun. 26, 2018 (WO) .................. PCT/JP2018/024149

(56) References Cited

U.S. PATENT DOCUMENTS

| | | | |
|---|---|---|---|
| 4,584,079 A | 4/1986 | Lee et al. | |
| 4,802,080 A | 1/1989 | Bossi et al. | |
| 4,871,421 A | 10/1989 | Ogle et al. | |
| 4,887,005 A | 12/1989 | Rough et al. | |
| 4,956,582 A * | 9/1990 | Bourassa | H05H 1/46 313/231.41 |
| 5,121,067 A | 6/1992 | Marsland | |
| 5,147,493 A | 9/1992 | Nishimura et al. | |
| 5,169,509 A | 12/1992 | Latz et al. | |
| 5,330,578 A | 7/1994 | Sakama et al. | |
| 5,733,511 A | 3/1998 | De | |
| 5,807,470 A | 9/1998 | Szczyrbowski et al. | |
| 5,932,116 A | 8/1999 | Matsumoto et al. | |
| 5,989,999 A | 11/1999 | Levine et al. | |
| 5,990,016 A | 11/1999 | Kim et al. | |
| 6,017,221 A * | 1/2000 | Flamm | H01J 37/321 438/14 |
| 6,046,641 A | 4/2000 | Chawla et al. | |
| 6,239,404 B1 | 5/2001 | Lea et al. | |
| 6,252,354 B1 * | 6/2001 | Collins | H01J 37/32174 315/111.51 |
| 6,703,080 B2 | 3/2004 | Reyzelman et al. | |
| 7,298,091 B2 | 11/2007 | Pickard et al. | |
| 7,445,690 B2 * | 11/2008 | Kasai | H05B 6/705 118/723 MW |
| 7,586,210 B2 | 9/2009 | Wiedemuth et al. | |
| 7,670,455 B2 * | 3/2010 | Keller | H01J 37/32669 156/345.48 |
| 7,777,567 B2 * | 8/2010 | Polizzo | H01J 37/32082 330/251 |
| 8,293,068 B2 | 10/2012 | Koshimizu et al. | |
| 8,450,635 B2 | 5/2013 | Dhindsa | |
| 8,647,585 B2 | 2/2014 | Hancock | |
| 9,121,786 B2 | 9/2015 | Tie | |
| 9,401,265 B2 | 7/2016 | Michel et al. | |
| 9,455,126 B2 | 9/2016 | Valcore et al. | |
| 9,564,360 B2 | 2/2017 | Akasaka et al. | |
| 9,607,810 B2 | 3/2017 | Valcore et al. | |
| 9,620,337 B2 | 4/2017 | Valcore et al. | |
| 9,675,716 B2 | 6/2017 | Hancock | |
| 9,779,196 B2 | 10/2017 | Valcore et al. | |
| 10,157,729 B2 | 12/2018 | Valcore, Jr. | |
| RE47,276 E | 3/2019 | Benjamin | |
| 10,224,463 B2 | 3/2019 | Daigo | |
| 10,231,321 B2 | 3/2019 | Valcore, Jr. et al. | |
| 10,354,838 B1 | 7/2019 | Mopidevi et al. | |
| 10,553,406 B2 | 2/2020 | Chang et al. | |
| 10,685,810 B2 | 6/2020 | Mopidevi et al. | |
| 10,879,043 B2 | 12/2020 | Selmo | |
| 11,013,075 B2 * | 5/2021 | Lester | H05B 6/688 |
| 2002/0022836 A1 * | 2/2002 | Goble | A61B 18/12 606/34 |
| 2003/0215373 A1 * | 11/2003 | Reyzelman | H01J 37/32082 422/186.29 |
| 2004/0262156 A1 | 12/2004 | Seymour et al. | |
| 2005/0138577 A1 | 6/2005 | Adamian | |
| 2005/0160987 A1 | 7/2005 | Kasai et al. | |
| 2008/0050537 A1 | 2/2008 | Godyak | |
| 2008/0258411 A1 | 10/2008 | Miura et al. | |
| 2009/0075597 A1 * | 3/2009 | Degani | H03F 1/26 455/63.1 |
| 2009/0085597 A1 | 4/2009 | Burns et al. | |
| 2009/0242135 A1 | 10/2009 | Koshimizu et al. | |
| 2010/0252199 A1 | 10/2010 | Marakhtanov et al. | |
| 2010/0294433 A1 | 11/2010 | Jianhui | |
| 2011/0300694 A1 | 12/2011 | Matsumoto et al. | |
| 2013/0017315 A1 | 1/2013 | Lai et al. | |
| 2013/0105082 A1 | 5/2013 | Melikyan et al. | |
| 2013/0337657 A1 | 12/2013 | Savas et al. | |
| 2015/0165752 A1 | 6/2015 | Plach et al. | |
| 2015/0170882 A1 | 6/2015 | Yamawaku et al. | |
| 2015/0255258 A1 | 9/2015 | Nozawa et al. | |
| 2016/0240351 A1 | 8/2016 | Burgess et al. | |
| 2016/0289837 A1 | 10/2016 | Savas et al. | |
| 2016/0307743 A1 | 10/2016 | Brown et al. | |
| 2016/0336084 A1 | 11/2016 | Laguardia et al. | |
| 2017/0213734 A9 | 7/2017 | Marakhtanov et al. | |
| 2018/0269035 A1 | 9/2018 | Selmo | |
| 2018/0318459 A1 | 11/2018 | Hancock et al. | |
| 2020/0126763 A1 * | 4/2020 | Sekiya | H01L 21/3065 |
| 2020/0126764 A1 * | 4/2020 | Inoue | H01J 37/32165 |
| 2020/0126766 A1 * | 4/2020 | Sekiya | H01L 21/3065 |
| 2020/0126767 A1 * | 4/2020 | Takeda | H01J 37/32174 |
| 2020/0126768 A1 * | 4/2020 | Inoue | H01J 37/3255 |
| 2020/0161096 A1 | 5/2020 | Chang et al. | |
| 2021/0005429 A1 * | 1/2021 | Tanabe | H01J 37/32577 |

FOREIGN PATENT DOCUMENTS

| | | |
|---|---|---|
| CN | 101478857 A | 7/2009 |
| CN | 101546697 A | 9/2009 |
| CN | 102479657 A | 5/2012 |
| CN | 103091042 A | 5/2013 |
| CN | 103094042 A | 5/2013 |
| CN | 104024471 A | 9/2014 |
| CN | 105887050 A | 8/2016 |
| CN | 106024568 A | 10/2016 |
| EP | 1748687 A1 | 1/2007 |
| JP | S53141937 U | 11/1978 |
| JP | S55035465 B2 | 9/1980 |
| JP | S62133065 A | 6/1987 |
| JP | H02501608 A | 5/1990 |
| JP | H02156080 A | 6/1990 |
| JP | H02156081 A | 6/1990 |
| JP | H02156082 A | 6/1990 |
| JP | H02156083 A | 6/1990 |
| JP | H04-317325 A | 11/1992 |
| JP | H11307299 A | 11/1999 |
| JP | 2000-195851 A | 7/2000 |
| JP | 2001122690 A | 5/2001 |
| JP | 2002004040 A | 1/2002 |
| JP | 2003155556 A | 5/2003 |
| JP | 2005026540 A | 1/2005 |
| JP | 2005130376 A | 5/2005 |
| JP | 2005303257 A | 10/2005 |
| JP | 2006336084 A | 12/2006 |
| JP | 2008294465 A | 12/2008 |
| JP | 2008300322 A | 12/2008 |
| JP | 2009021634 A | 1/2009 |
| JP | 2009105030 A | 5/2009 |
| JP | 2009302566 A | 12/2009 |
| JP | 2010045664 A | 2/2010 |
| JP | 2010255061 A | 11/2010 |
| JP | 2011144450 A | 7/2011 |
| JP | 4909523 B2 | 4/2012 |
| JP | 2012142332 A | 7/2012 |
| JP | 2012174682 A | 9/2012 |
| JP | 2013139642 A | 7/2013 |
| JP | 2014049541 A | 3/2014 |
| JP | 5824072 B2 | 11/2015 |
| JP | 2016225376 A | 12/2016 |
| JP | 2017211144 A | 11/2017 |
| JP | 6280677 B1 | 2/2018 |
| JP | 6309683 B1 | 4/2018 |
| TW | 201311059 A | 3/2013 |

(56) References Cited

FOREIGN PATENT DOCUMENTS

| TW | 201423827 A | 6/2014 |
|---|---|---|
| TW | I492294 B | 7/2015 |
| TW | 201532220 A | 8/2015 |
| TW | 201643932 A | 12/2016 |
| TW | I560767 B | 12/2016 |
| TW | I575107 B | 3/2017 |
| TW | I601309 B | 10/2017 |
| WO | 8902695 A1 | 3/1989 |
| WO | 2010024128 A1 | 3/2010 |
| WO | 2010041679 A1 | 4/2010 |

OTHER PUBLICATIONS

Office Action Summary dated Mar. 15, 2021, by the U.S Patent and Trademark Office in U.S. Appl. No. 16/720,154. (19 pages).
International Search Report (PCT/ISA/210) and translation and Written Opinion (PCT/ISA/237) dated Sep. 11, 2018, by the Japanese Patent Office as the International Searching Authority for International Application No. PCT/JP2018/024150.
Supplementary European Search Report dated Apr. 30, 2020, by the European Patent Office in corresponding European Application No. 11824433. (8 pages).
Supplementary European Search Report dated May 25, 2020, by the European Patent Office in corresponding European Application No. 11823378.7. (8 pages).
Office Action (Notice of Preliminary Rejection) dated Apr. 19, 2021, by the Korean Patent Office in corresponding Korean Patent Application No. 10-2020-7001366, and an English Translation of the Office Action. (14 pages).
Office Action (Notice of Preliminary Rejection) dated Apr. 26, 2021, by the Korean Patent Office in corresponding Korean Patent Application No. 10-2020-7001366, and an English Translation of the Office Action. (9 pages).
Office Action (Grant of Patent) dated Apr. 27, 2021, by the Korean Patent Office in corresponding Korean Patent Application No. 10-2020-7001397, and an English Translation of the Office Action. (4 pages).
International Search Report (PCT/ISA/210) dated Mar. 12, 2019, by the Japanese Patent Office as the International Searching Authority for International Application No. PCT/JP2018/047319.
Written Opinion (PCT/ISA/237) dated Mar. 12, 2019, by the Japanese Patent Office as the International Searching Authority for International Application No. PCT/JP2018/047319.
First Office Action dated Jun. 2, 2021, by the Chinese Patent Office in Chinese Patent Application No. 201880042465, and an English Translation of the Office Action. (23 pages).
First Office Action dated Jun. 2, 2021, by the Chinese Patent Office in Chinese Patent Application No. 201880042477.2, and an English Translation of the Office Action. (20 pages).
First Office Action dated Jun. 2, 2021, by the Chinese Patent Office in Chinese Patent Application No. 201780092518.4, and an English Translation of the Office Action. (21 pages).
First Office Action dated Jun. 2, 2021, by the Chinese Patent Office in Chinese Patent Application No. 201780092519.9, and an English Translation of the Office Action. (23 pages).
First Office Action dated Jun. 3, 2021, by the Chinese Patent Office in Chinese Patent Application No. 201880042506.5, and an English Translation of the Office Action. (21 pages).
Notice of Allowance dated Sep. 20, 2021, by the U.S Patent and Trademark Office in U.S. Appl. No. 16/720,154.
Office Action dated Sep. 22, 2021, by the U.S Patent and Trademark Office in U.S. Appl. No. 16/720,262.
Office Action issued in corresponding U.S. Appl. No. 16/720,156, dated Oct. 25, 2021 (71 pages).
Extended European Search Report issued in corresponding European Patent Application No. 18924031.0, dated Feb. 15, 2022, (9 pages).
Office Action issued in U.S. Appl. No. 16/720,156, dated Apr. 1, 2022 (19 pages).
Office Action issued in U.S. Appl. No. 16/720,087, dated Apr. 7, 2022 (84 pages).

* cited by examiner

F I G. 2A
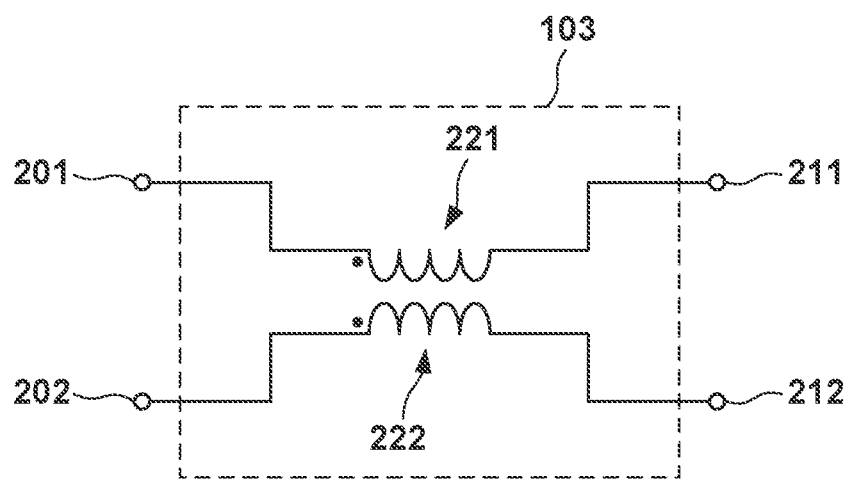
F I G. 2B
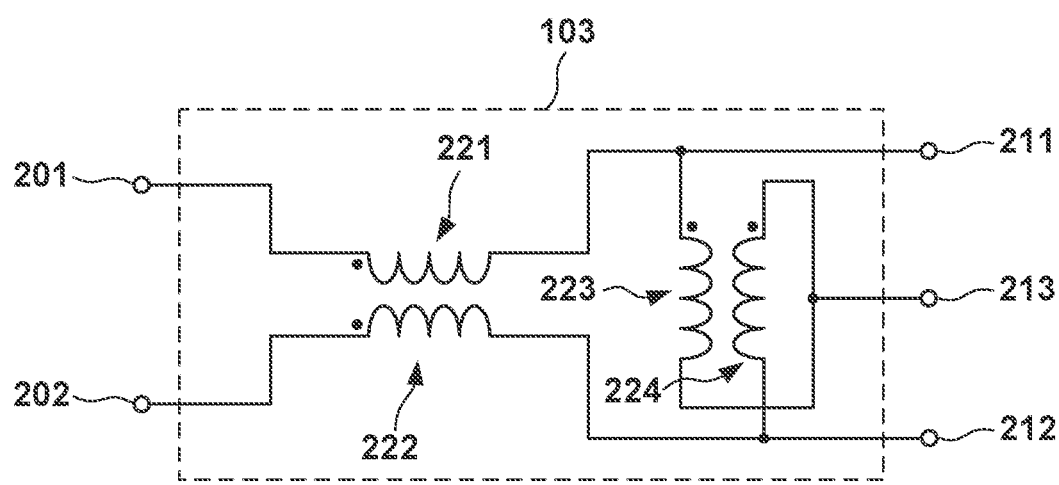

FIG. 4

| TOTAL CURRENT I1 | 1 | 1 | 1 | 1 | 1 | 1 | 1 | 1 | 1 | 1 | 1 |
|---|---|---|---|---|---|---|---|---|---|---|---|
| CURRENT I2' | 1 | 0.9999 | 0.9997 | 0.999 | 0.997 | 0.99 | 0.97 | 0.9 | 0.68 | 0.55 | 0.29 |
| CURRENT I3 | 0 | 0.0001 | 0.0003 | 0.001 | 0.003 | 0.01 | 0.03 | 0.1 | 0.32 | 0.45 | 0.71 |
| ISO[dB]= 20log(I3/I2) | $-\infty$ | -80.0 | -70.0 | -60.0 | -50.0 | -40.0 | -30.0 | -20.0 | -10.0 | -7.0 | -3.0 |
| α=X/Rp | $\infty$ | 5000 | 1582 | 500 | 158 | 50 | 15.8 | 5.0 | 1.5 | 1.0 | 0.5 |

F I G. 6A
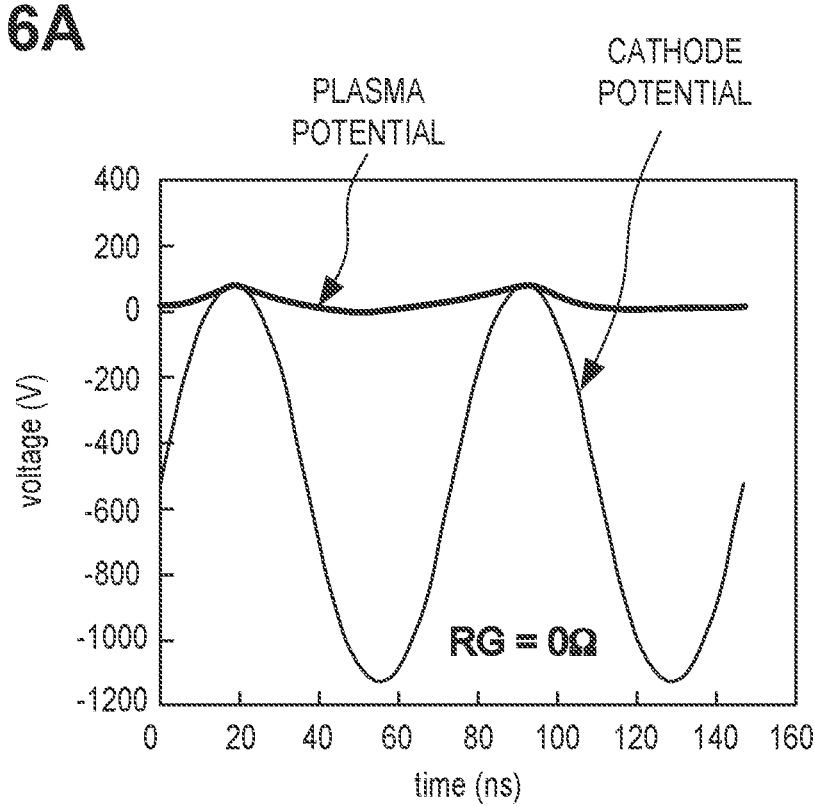
F I G. 6B
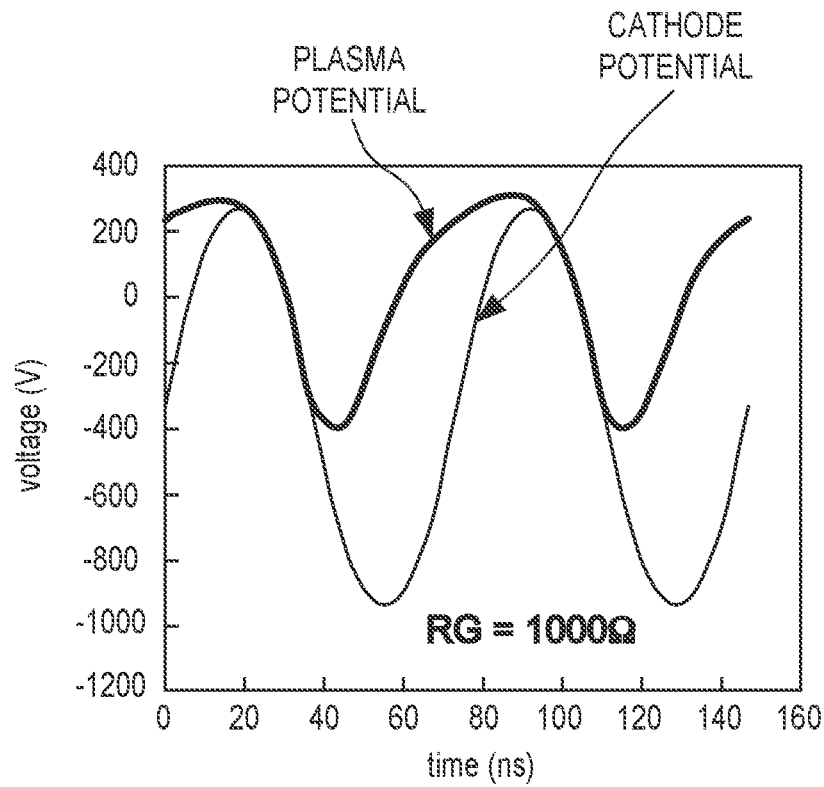

F I G. 6C
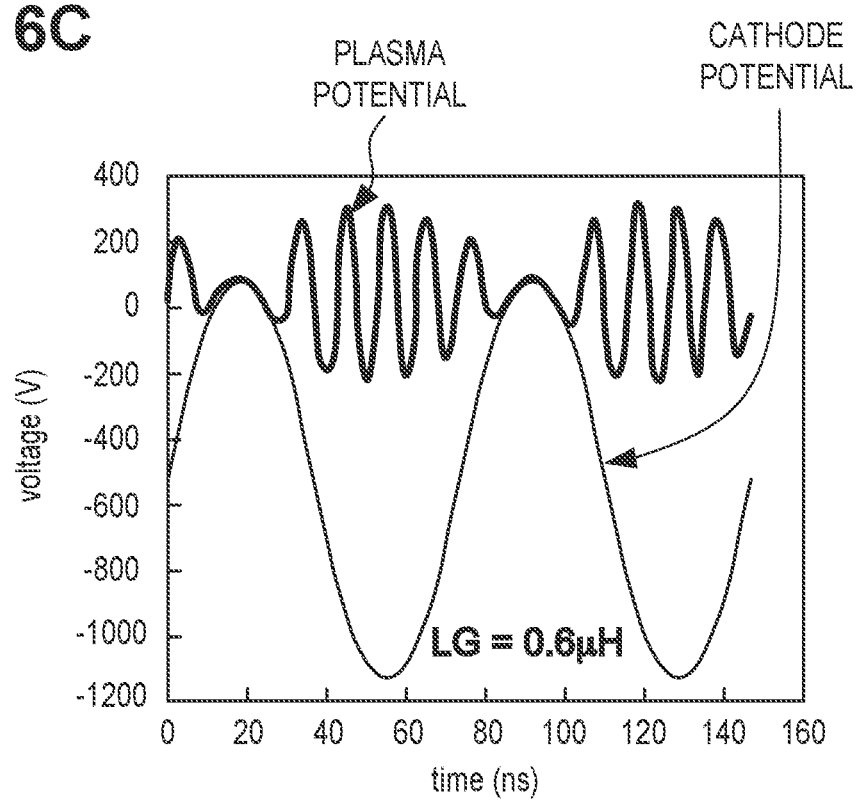
F I G. 6D
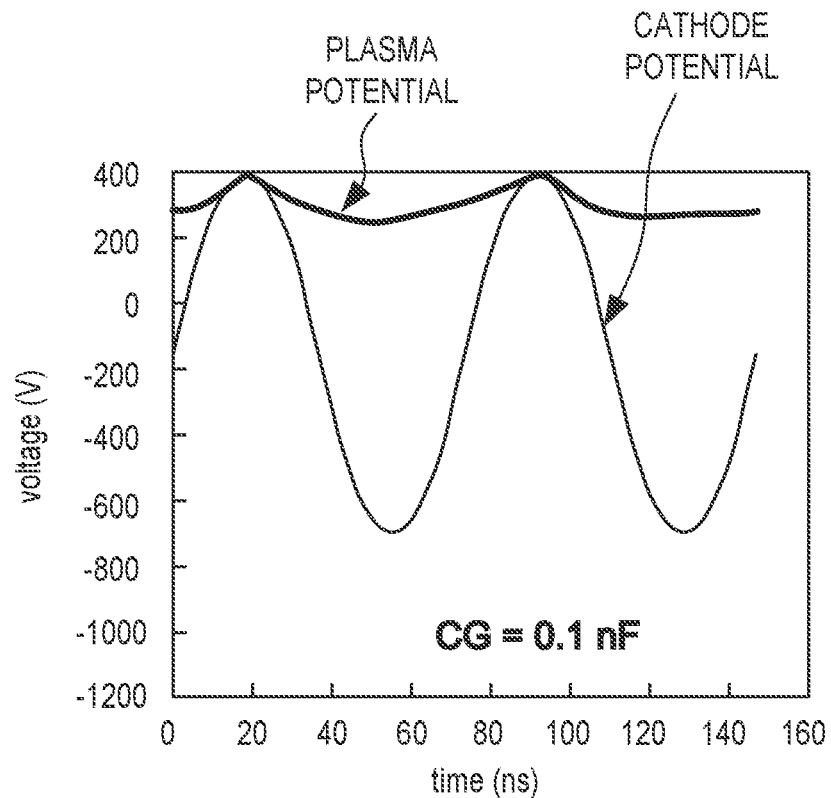

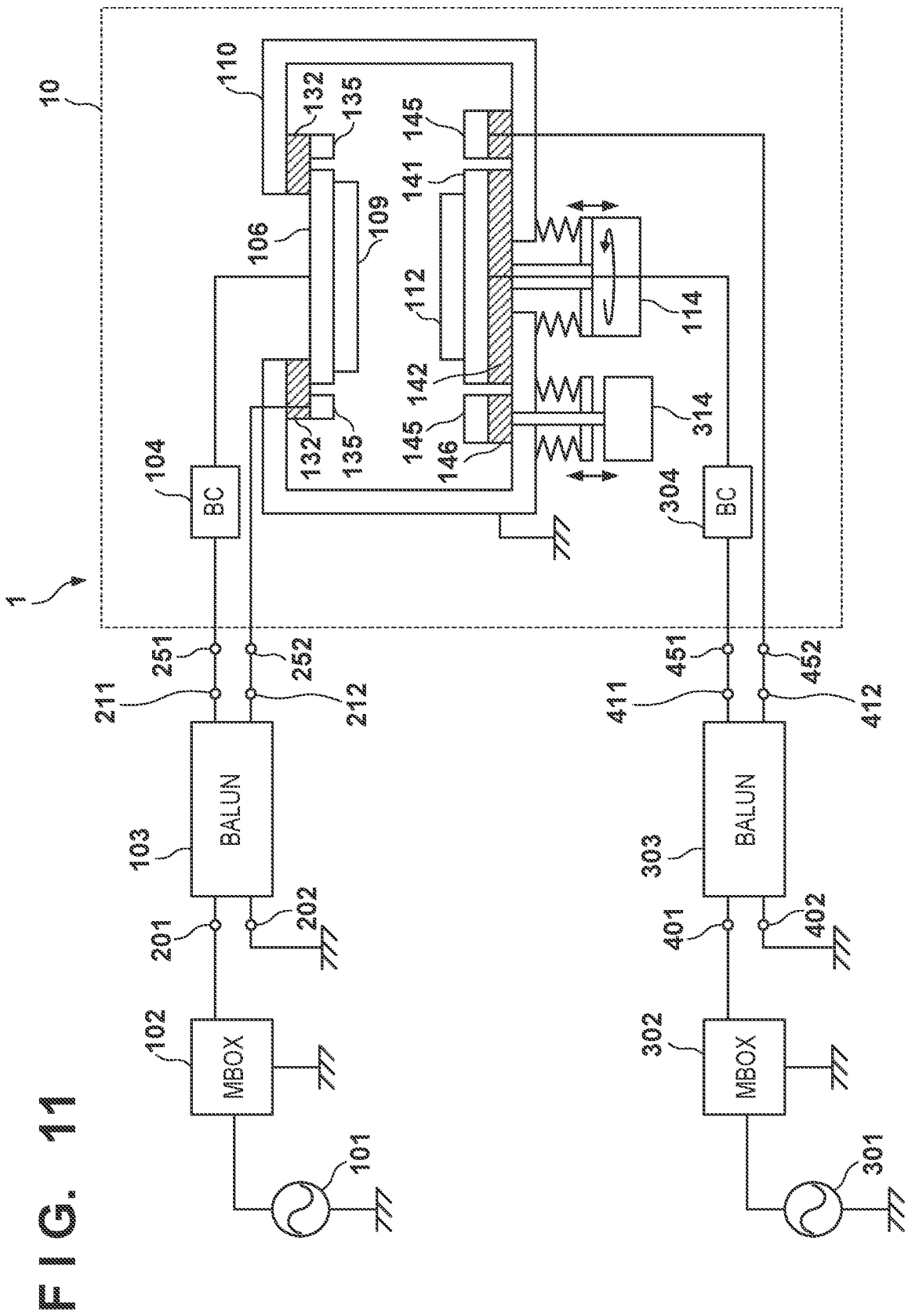
F I G. 11

PLASMA PROCESSING APPARATUS, PLASMA PROCESSING METHOD, AND MEMORY MEDIUM

CROSS-REFERENCE TO RELATED APPLICATION(S)

This application is a continuation of International Patent Application No. PCT/JP2018/047319 filed on Dec. 21, 2018, which claims priority to and the benefit of International Patent Application No. PCT/JP2018/024146 filed on Jun. 26, 2018, International Patent Application No. PCT/JP2018/024147 filed on Jun. 26, 2018, International Patent Application No. PCT/JP2018/024148 filed on Jun. 26, 2018, and International Patent Application No. PCT/JP2018/024149 filed on Jun. 26, 2018, the entire disclosures of which are incorporated herein by reference.

TECHNICAL FIELD

The present invention relates to a plasma processing apparatus, a plasma processing method, and a memory medium.

BACKGROUND ART

PTL 1 describes a sputtering apparatus including a high-frequency transformer (Tr7), a matching box (MB7), a vacuum container (10), a first target (T5), a second target (T6), a high-frequency voltage generator (OSC5), a voltage amplifier (PA5), a substrate holder (21), and a motor (22). In the sputtering apparatus described in Japanese Patent Laid-Open No. 2-156080, the voltages of the two targets (T5 and T6) are parameters that are determined by a plasma generation condition and the like and cannot be adjusted.

CITATION LIST

Patent Literature

PTL 1: Japanese Patent Laid-Open No. 2-156080

SUMMARY OF INVENTION

The present invention has been made based on the above-described problem recognition, and provides a technique advantageous in adjusting the voltages of two electrodes used to generate plasma.

According to the first aspect of the present invention, there is provided a plasma processing apparatus comprising an impedance matching circuit, a balun including a first unbalanced terminal connected to the impedance matching circuit, a grounded second unbalanced terminal, a first balanced terminal, and a second balanced terminal, a grounded vacuum container, a first electrode electrically connected to the first balanced terminal, a second electrode electrically connected to the second balanced terminal, an adjustment reactance configured to affect a relationship between a first voltage applied to the first electrode and a second voltage applied to the second electrode, a high-frequency power supply configured to supply a high frequency between the first unbalanced terminal and the second unbalanced terminal via the impedance matching circuit, and a controller configured to control an impedance of the impedance matching circuit and a reactance of the adjustment reactance.

According to the second aspect of the present invention, there is provided a plasma processing method of processing a substrate in a plasma processing apparatus, the plasma processing apparatus including an impedance matching circuit, a balun including a first unbalanced terminal connected to the impedance matching circuit, a grounded second unbalanced terminal, a first balanced terminal, and a second balanced terminal, a grounded vacuum container, a first electrode electrically connected to the first balanced terminal, a second electrode electrically connected to the second balanced terminal, an adjustment reactance configured to affect a relationship between a first voltage applied to the first electrode and a second voltage applied to the second electrode, and a high-frequency power supply configured to supply a high frequency between the first unbalanced terminal and the second unbalanced terminal via the impedance matching circuit, and the plasma processing method comprising a matching step of controlling an impedance of the impedance matching circuit such that the impedance matches an impedance when a side of the first electrode and the second electrode is viewed from a side of the first balanced terminal and the second balanced terminal, an adjustment step of adjusting the adjustment reactance to adjust the relationship, and a processing step of processing the substrate after the adjustment step.

According to the third aspect of the present invention, there is provided a plasma processing apparatus comprising an impedance matching circuit, a balun including a first unbalanced terminal connected to the impedance matching circuit, a grounded second unbalanced terminal, a first balanced terminal, and a second balanced terminal, a grounded vacuum container, a first electrode electrically connected to the first balanced terminal, a second electrode electrically connected to the second balanced terminal, an adjustment reactance configured to affect a relationship between a first voltage applied to the first electrode and a second voltage applied to the second electrode, a high-frequency power supply configured to supply a high frequency between the first unbalanced terminal and the second unbalanced terminal via the impedance matching circuit, and a measurement unit configured to measure a voltage of the first electrode and a voltage of the second electrode, wherein a reactance of the adjustment reactance is adjusted based on the voltage of the first electrode and the voltage of the second electrode, which are measured by the measurement unit.

BRIEF DESCRIPTION OF DRAWINGS

FIG. 2A is a view showing an arrangement example of a balun;

FIG. 2B is a view showing another arrangement example of the balun;

FIG. 4 is a view showing the relationship between currents I1 (=I2), I2', and I3, ISO, and α (=X/Rp);

FIG. 6A is a view showing a result of simulating a plasma potential and a cathode potential in a case in which $1.5 \leq X/Rp \leq 5000$ is not satisfied;

FIG. 6B is a view showing a result of simulating a plasma potential and a cathode potential in a case in which $1.5 \leq X/Rp \leq 5000$ is not satisfied;

FIG. 6C is a view showing a result of simulating a plasma potential and a cathode potential in a case in which $1.5 \leq X/Rp \leq 5000$ is not satisfied;

FIG. 6D is a view showing a result of simulating a plasma potential and a cathode potential in a case in which $1.5 \leq X/Rp \leq 5000$ is not satisfied;

FIG. 11 is a view schematically showing the arrangement of a plasma processing apparatus 1 according to the fifth embodiment of the present invention;

DESCRIPTION OF EMBODIMENTS

The present invention will now be described by way of exemplary embodiments with reference to the accompanying drawings.

Figure 1:
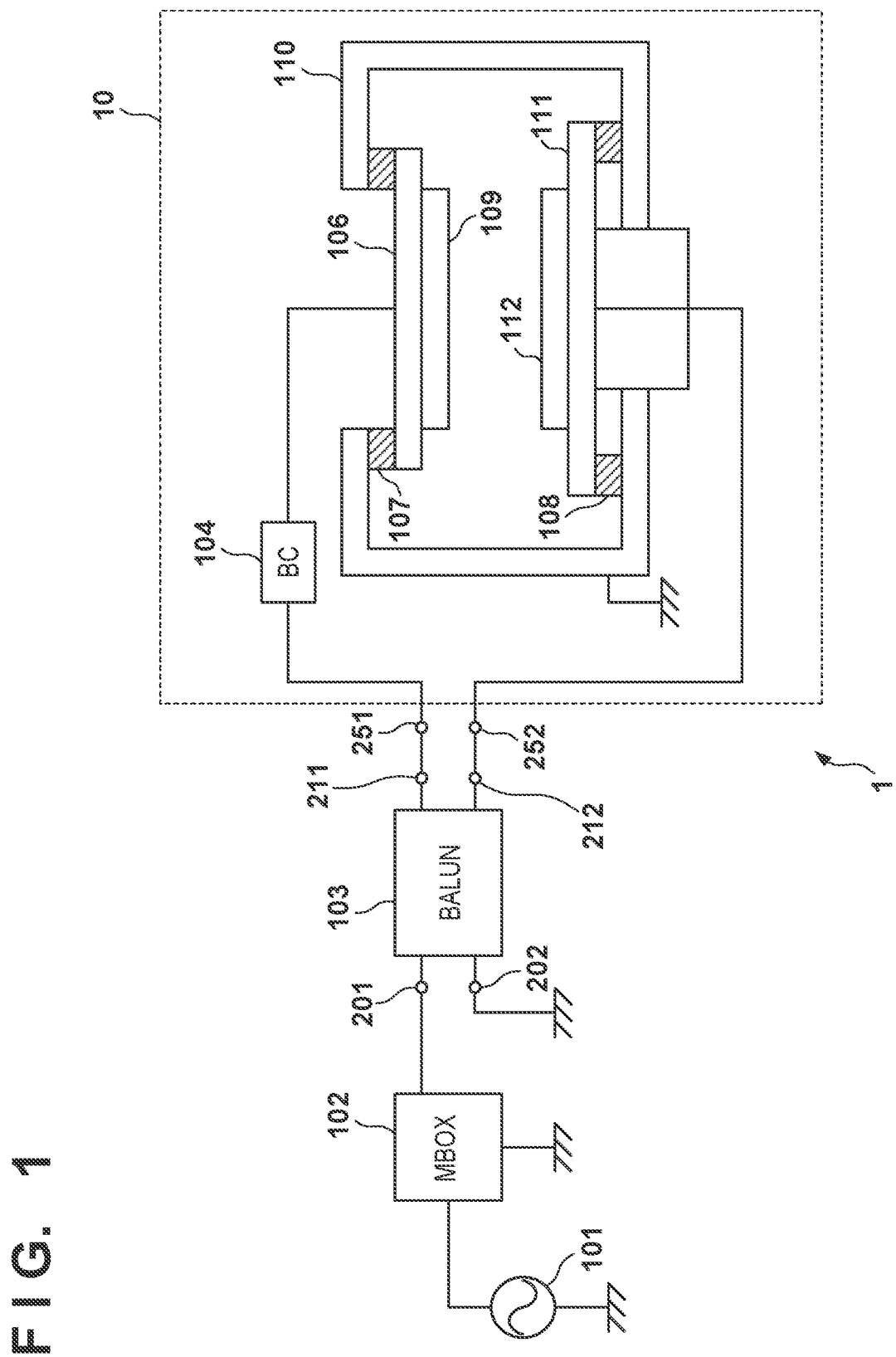
FIG. 1 is a view schematically showing the arrangement of a plasma processing apparatus 1 according to the first embodiment of the present invention.

FIG. 1 schematically shows the arrangement of a plasma processing apparatus 1 according to the first embodiment of the present invention. The plasma processing apparatus according to the first embodiment can operate as a sputtering apparatus for forming a film on a substrate 112 by sputtering. The plasma processing apparatus 1 includes a balun (balanced/unbalanced conversion circuit) 103, a vacuum container 110, a first electrode 106, and a second electrode 111. Alternatively, it may be understood that the plasma processing apparatus 1 includes the balun 103 and a main body 10, and the main body 10 includes the vacuum container 110, the first electrode 106, and the second electrode 111. The main body 10 includes a first terminal 251 and a second terminal 252. The first electrode 106 may be arranged to separate a vacuum space and an external space in cooperation with the vacuum container 110 (that is, form a part of a vacuum partition), or may be arranged in the vacuum container 110. The second electrode 111 may be arranged to separate a vacuum space and an external space in cooperation with the vacuum container 110 (that is, form a part of a vacuum partition), or may be arranged in the vacuum container 110.

The balun 103 includes a first unbalanced terminal 201, a second unbalanced terminal 202, a first balanced terminal 211, and a second balanced terminal 212. An unbalanced circuit is connected to the side of the first unbalanced terminal 201 and the second unbalanced terminal 202 of the balun 103, and a balanced circuit is connected to the side of the first balanced terminal 211 and the second balanced terminal 212 of the balun 103. The vacuum container 110 is made of a conductor and grounded.

In the first embodiment, the first electrode 106 is a cathode and holds a target 109. The target 109 can be, for example, an insulating material or a conductive material. In the first embodiment, the second electrode 111 is an anode and holds the substrate 112. The plasma processing apparatus 1 according to the first embodiment can operate as a sputtering apparatus for forming a film on the substrate 112 by sputtering of the target 109. The first electrode 106 is electrically connected to the first balanced terminal 211, and the second electrode 111 is electrically connected to the second balanced terminal 212. That the first electrode 106 and the first balanced terminal 211 are electrically connected means that a current path is formed between the first electrode 106 and the first balanced terminal 211 such that a current flows between the first electrode 106 and the first balanced terminal 211. Similarly, in this specification, that a and b are electrically connected means that a current path is formed between a and b such that a current flows between a and b.

The above-described arrangement can also be understood as an arrangement in which the first electrode 106 is electrically connected to the first terminal 251, the second electrode 111 is electrically connected to the second terminal 252, the first terminal 251 is electrically connected to the first balanced terminal 211, and the second terminal 252 is electrically connected to the second balanced terminal 212.

In the first embodiment, the first electrode 106 and the first balanced terminal 211 (first terminal 251) are electrically connected via a blocking capacitor 104. The blocking capacitor 104 blocks a DC current between the first balanced terminal 211 and the first electrode 106 (or between the first balanced terminal 211 and the second balanced terminal 212). Instead of providing the blocking capacitor 104, an impedance matching circuit 102 to be described later may be configured to block a DC current flowing between the first unbalanced terminal 201 and the second unbalanced terminal 202. The first electrode 106 can be supported by the vacuum container 110 via an insulator 107. The second electrode 111 can be supported by the vacuum container 110 via an insulator 108. Alternatively, the insulator 108 can be arranged between the second electrode 111 and the vacuum container 110.

The plasma processing apparatus 1 can further include a high-frequency power supply 101, and the impedance matching circuit 102 arranged between the high-frequency power supply 101 and the balun 103. The high-frequency power supply 101 supplies a high frequency (a high-frequency current, a high-frequency voltage, or a high-frequency power) between the first unbalanced terminal 201 and the second unbalanced terminal 202 of the balun 103 via the impedance matching circuit 102. In other words, the high-frequency power supply 101 supplies a high frequency (a high-frequency current, a high-frequency voltage, or a high-frequency power) between the first electrode 106 and the second electrode 111 via the impedance matching circuit 102, the balun 103, and the blocking capacitor 104. Alternatively, it can be understood that the high-frequency power supply 101 supplies a high frequency between the first terminal 251 and the second terminal 252 of the main body 10 via the impedance matching circuit 102 and the balun 103.

A gas (for example, Ar, Kr, or Xe gas) is supplied to the internal space of the vacuum container 110 via a gas supply unit (not shown) provided on the vacuum container 110. In addition, the high-frequency power supply 101 supplies a high frequency between the first electrode 106 and the second electrode 111 via the impedance matching circuit 102, the balun 103, and the blocking capacitor 104. Accordingly, plasma is generated between the first electrode 106 and the second electrode 111, a self-bias voltage is generated on the surface of the target 109, ions in the plasma collide against the surface of the target 109, and particles of the material of the target 109 are emitted from the target 109. A film is formed on the substrate 112 by the particles.

FIG. 2A shows an arrangement example of the balun 103. The balun 103 shown in FIG. 2A includes a first coil 221 that connects the first unbalanced terminal 201 and the first balanced terminal 211, and a second coil 222 that connects the second unbalanced terminal 202 and the second balanced terminal 212. The first coil 221 and the second coil 222 are coils of the same number of windings and share an iron core.

FIG. 2B shows another arrangement example of the balun 103. The balun 103 shown in FIG. 2B includes the first coil 221 that connects the first unbalanced terminal 201 and the first balanced terminal 211, and the second coil 222 that connects the second unbalanced terminal 202 and the second balanced terminal 212. The first coil 221 and the second coil 222 are coils of the same number of windings and share an iron core. The balun 103 shown in FIG. 2B further include a third coil 223 and a fourth coil 224, which are connected between the first balanced terminal 211 and the second balanced terminal 212. The third coil 223 and the fourth coil 224 are configured to set the voltage of a connection node 213 between the third coil 223 and the fourth coil 224 to the middle point between the voltage of the first balanced terminal 211 and the voltage of the second balanced terminal 212. The third coil 223 and the fourth coil 224 are coils of the same number of windings and share an iron core. The connection node 213 may be grounded, connected to the vacuum container 110, or set in a floating state.

The function of the balun 103 will be described with reference to FIG. 3. Let I1 be a current flowing to the first unbalanced terminal 201, I2 be a current flowing to the first balanced terminal 211, I2' be a current flowing to the second unbalanced terminal 202, and I3 be a current flowing to ground in the current I2. If I3=0, that is, the current does not flow to ground on the side of the balanced circuit, the isolation performance of the balanced circuit to ground is best. If I3=I2, that is, the current I2 flowing to the first balanced terminal 211 wholly flows to ground, the isolation performance of the balanced circuit to ground is poorest. An index ISO representing the degree of isolation performance can be given by the following expression. Under this definition, when the absolute value of the value of ISO is large, the isolation performance is high.

ISO [dB]=20 log(I3/I2')

Figure 3:
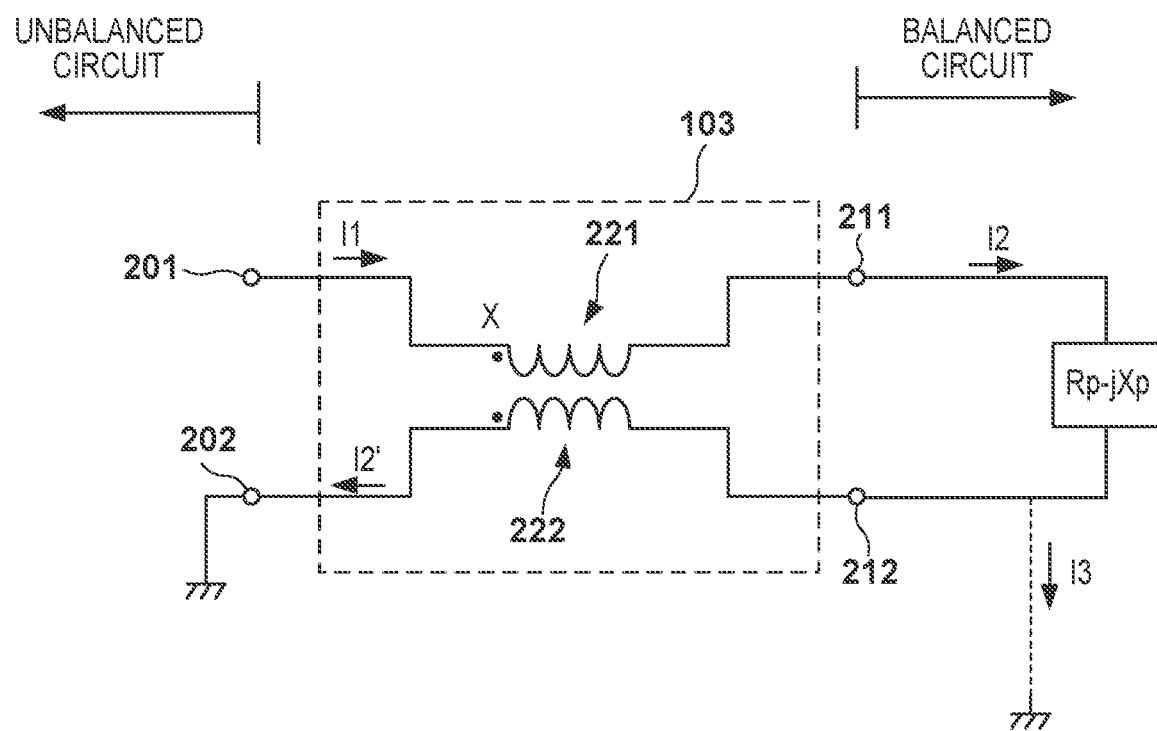
FIG. 3 is a view for explaining the function of a balun 103.

In FIG. 3, Rp−jXp represents an impedance (including the reactance of the blocking capacitor 104) when the side of the first electrode 106 and the second electrode 111 (the side of the main body 10) is viewed from the side of the first balanced terminal 211 and the second balanced terminal 212 in a state in which plasma is generated in the internal space of the vacuum container 110. Rp represents a resistance component, and −Xp represents a reactance component. Additionally, in FIG. 3, X represents the reactance component (inductance component) of the impedance of the first coil 221 of the balun 103. ISO has correlation with X/Rp.

FIG. 4 shows the relationship between the currents I1 (=I2), I2', and I3, ISO, and α(=X/Rp). The present inventor found that the arrangement that supplies a high frequency from the high-frequency power supply 101 between the first electrode 106 and the second electrode 111 via the balun 103, particularly, satisfying 1.5≤X/Rp≤5000 in the arrangement is advantageous in making the potential (plasma potential) of plasma formed in the internal space of the vacuum container 110 (the space between the first electrode 106 and the second electrode 111) insensitive to the state of the inner surface of the vacuum container 110. Here, that the plasma potential is insensitive to the state of the inner surface of the vacuum container 110 means that the plasma potential can be stabilized even if the plasma processing apparatus 1 is used for a long time. 1.5≤X/Rp≤5000 corresponds to −10.0 dB≥ISO≥−80 dB.

Figure 5A:
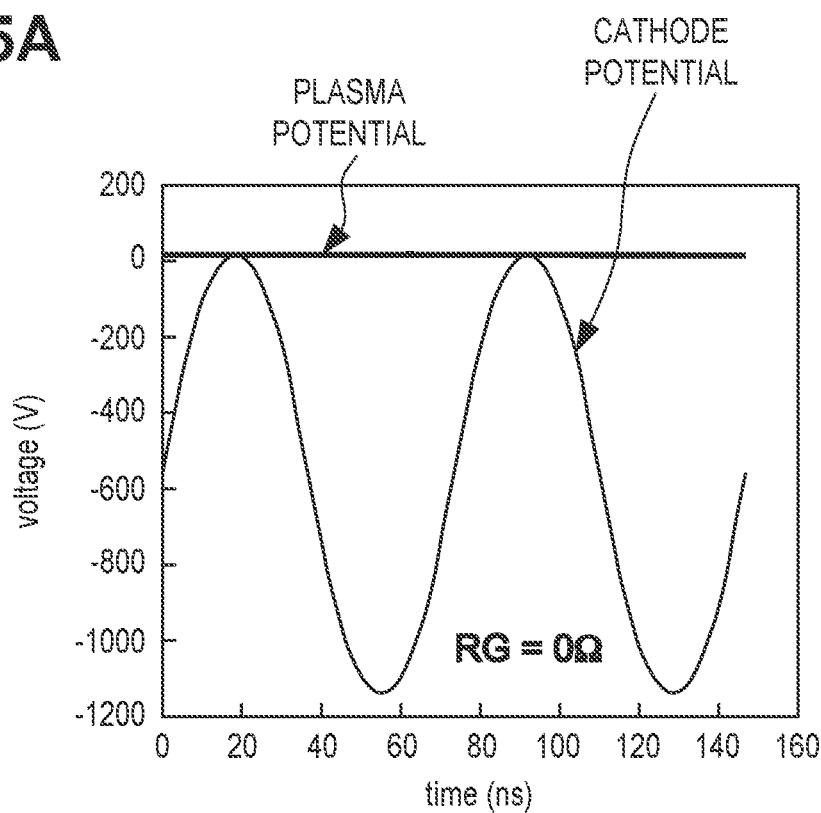
FIG. 5A is a view showing a result of simulating a plasma potential and a cathode potential in a case in which $1.5 \leq X/Rp \leq 5000$ is satisfied.
Figure 5B:
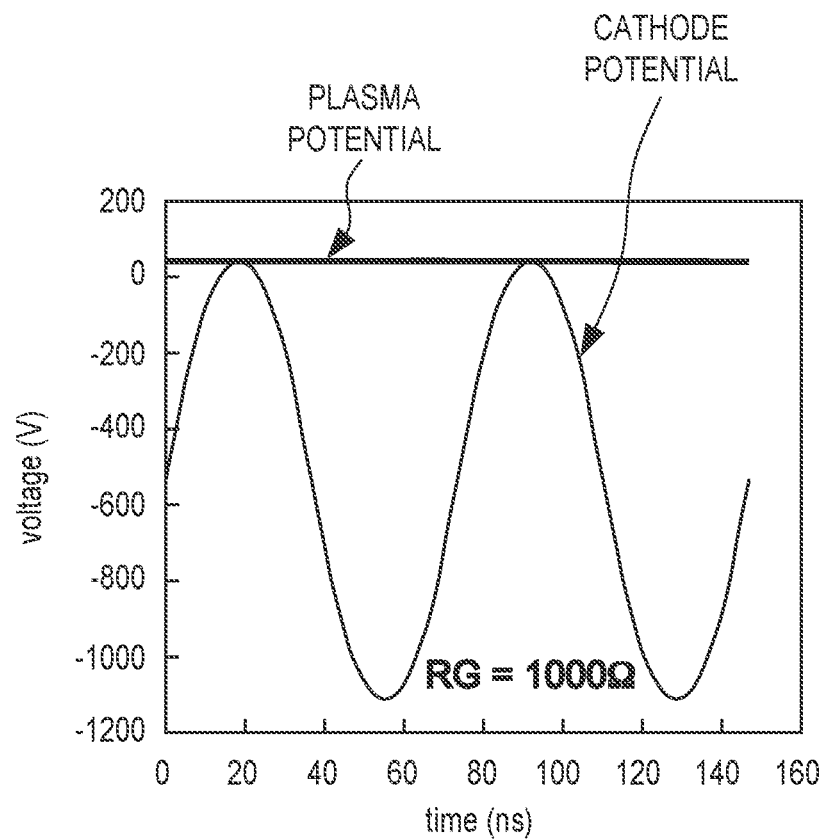
FIG. 5B is a view showing a result of simulating a plasma potential and a cathode potential in a case in which $1.5 \leq X/Rp \leq 5000$ is satisfied.
Figure 5C:
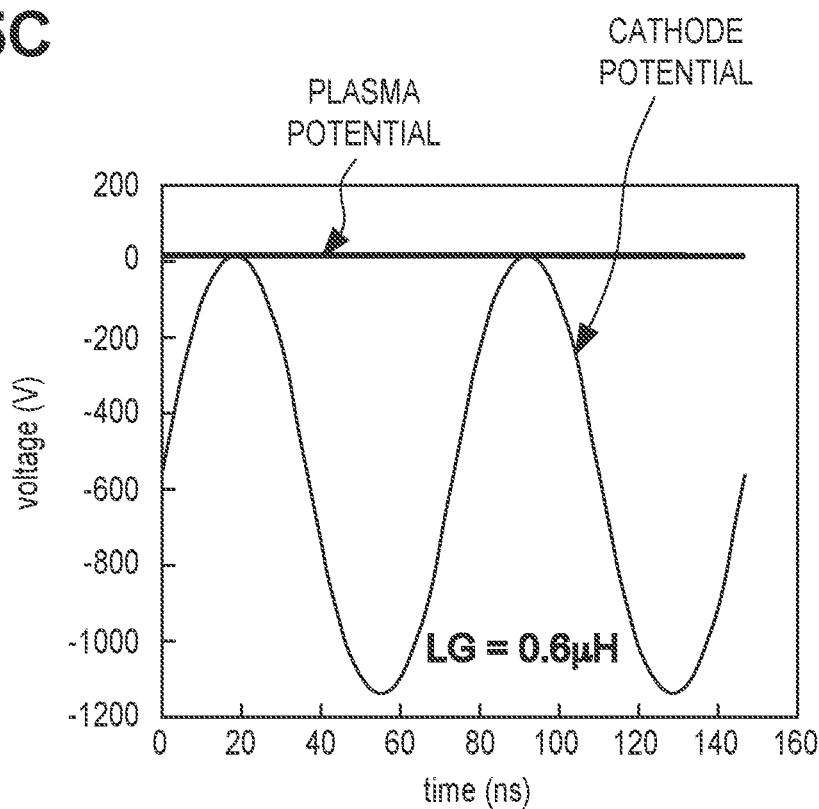
FIG. 5C is a view showing a result of simulating a plasma potential and a cathode potential in a case in which $1.5 \leq X/Rp \leq 5000$ is satisfied.
Figure 5D:
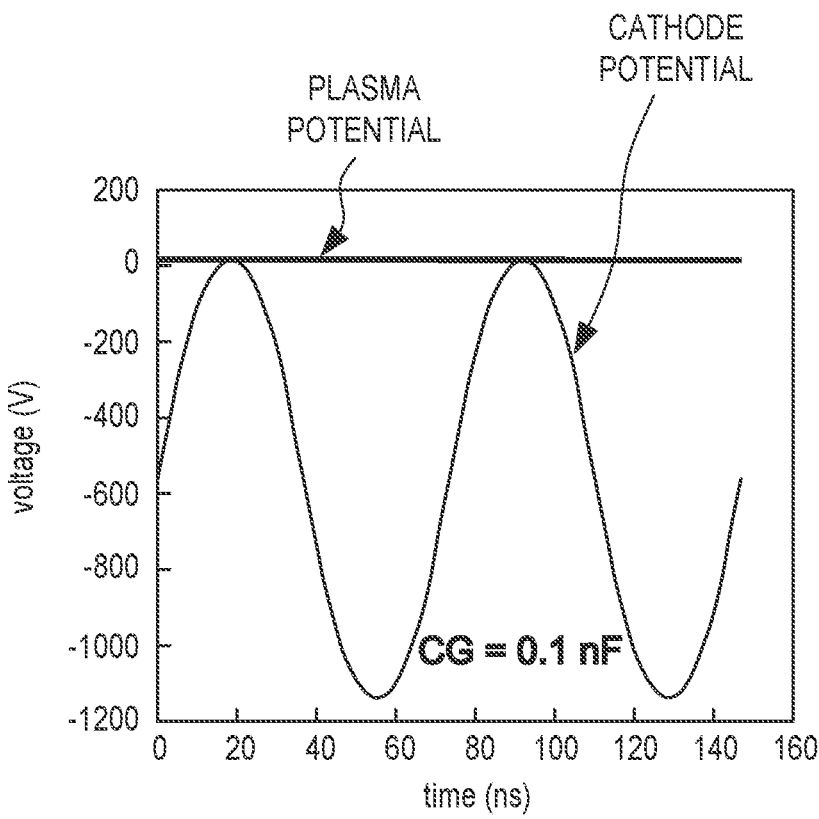
FIG. 5D is a view showing a result of simulating a plasma potential and a cathode potential in a case in which $1.5 \leq X/Rp \leq 5000$ is satisfied.

FIGS. 5A to 5D show results of simulating the plasma potential and the potential (cathode potential) of the first electrode 106 in a case in which 1.5≤X/Rp≤5000 is satisfied. FIG. 5A shows the plasma potential and the cathode potential in a state in which no film is formed on the inner surface of the vacuum container 110. FIG. 5B shows the plasma potential and the cathode potential in a state in which a resistive film (1,000Ω) is formed on the inner surface of the vacuum container 110. FIG. 5C shows the plasma potential and the cathode potential in a state in which an inductive film (0.6 μH) is formed on the inner surface of the vacuum container 110. FIG. 5D shows the plasma potential and the cathode potential in a state in which a capacitive film (0.1 nF) is formed on the inner surface of the vacuum container 110. It can be understood from FIGS. 5A to 5D that satisfying 1.5≤X/Rp≤5000 is advantageous in stabilizing the plasma potential in various states of the inner surface of the vacuum container 110.

FIGS. 6A to 6D show results of simulating the plasma potential and the potential (cathode potential) of the first electrode 106 in a case in which 1.5≤X/Rp≤5000 is not satisfied. FIG. 6A shows the plasma potential and the cathode potential in a state in which no film is formed on the inner surface of the vacuum container 110. FIG. 6B shows the plasma potential and the cathode potential in a state in which a resistive film (1,000Ω) is formed on the inner surface of the vacuum container 110. FIG. 6C shows the plasma potential and the cathode potential in a state in which an inductive film (0.6 μH) is formed on the inner surface of the vacuum container 110. FIG. 6D shows the plasma potential and the cathode potential in a state in which a capacitive film (0.1 nF) is formed on the inner surface of the vacuum container 110. It can be understood from FIGS. 6A to 6D that if 1.5≤X/Rp≤5000 is not satisfied, the plasma potential can change depending on the state of the inner surface of the vacuum container 110.

The plasma potential readily changes depending on the state of the inner surface of the vacuum container 110 in both a case in which X/Rp>5000 (for example, X/Rp=∞) and a case in which X/Rp<1.5 (for example, X/Rp=1.0, X/Rp=0.5). If X/Rp>5000, in a state in which no film is formed on the inner surface of the vacuum container 110, discharge occurs only between the first electrode 106 and the second electrode 111. However, if X/Rp>5000, when a film starts being formed on the inner surface of the vacuum container 110, the plasma potential sensitively reacts to this, and a result as shown in FIG. 6A to 6D is obtained. On the other hand, if X/Rp<1.5, the current flowing to ground via the vacuum container 110 is large. For this reason, the influence of the state of the inner surface of the vacuum container 110 (the electrical characteristic of the film formed on the inner surface) is conspicuous, and the plasma potential changes depending on the formation of a film. Hence, it is advantageous that the plasma processing apparatus 1 is configured such that 1.5≤X/Rp≤5000 is satisfied, as described above.

Figure 7:
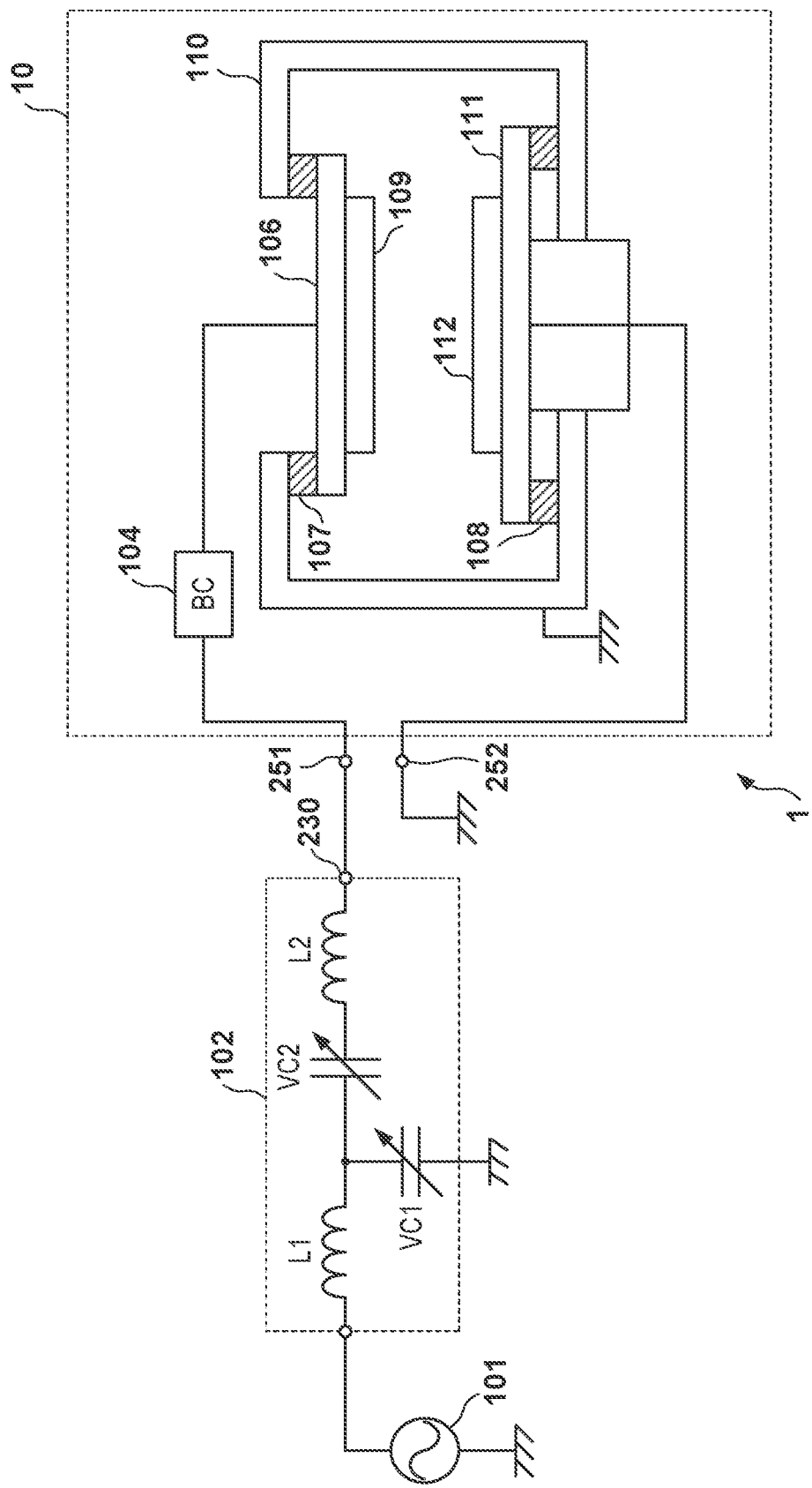
FIG. 7 is a view showing a method of confirming Rp−jXp.

A method of deciding Rp−jXp (the value needed to be actually known is only Rp) will be exemplified with reference to FIG. 7. First, the balun 103 is detached from the plasma processing apparatus 1, and an output terminal 230 of the impedance matching circuit 102 is connected to the first terminal 251 (blocking capacitor 104) of the main body 10. In addition, the second terminal 252 (second electrode 111) of the main body 10 is grounded. In this state, a high frequency is supplied from the high-frequency power supply 101 to the first terminal 251 of the main body 10 via the impedance matching circuit 102. In the example shown in FIG. 7, the impedance matching circuit 102 is equivalently formed by coils L1 and L2 and variable capacitors VC1 and VC2. Plasma can be generated by adjusting the capacitive values of the variable capacitors VC1 and VC2. In a state in which the plasma is stable, the impedance of the impedance matching circuit 102 matches the impedance Rp−jXp on the side of the main body 10 (the side of the first electrode 106 and the second electrode 111) when plasma is generated. The impedance of the impedance matching circuit 102 at this time is Rp+jXp.

Hence, Rp−jXp (the value needed to be actually known is only Rp) can be obtained based on the impedance Rp+jXp of the impedance matching circuit 102 when the impedances match. Rp−jXp can also be obtained by simulations based on, for example, design data.

Based on Rp obtained in this way, X/Rp can be specified. For example, a reactance component (inductance component) X of the impedance of the first coil 221 of the balun 103 can be decided based on Rp such that 1.5≤X/Rp≤5000 is satisfied.

Figure 8:
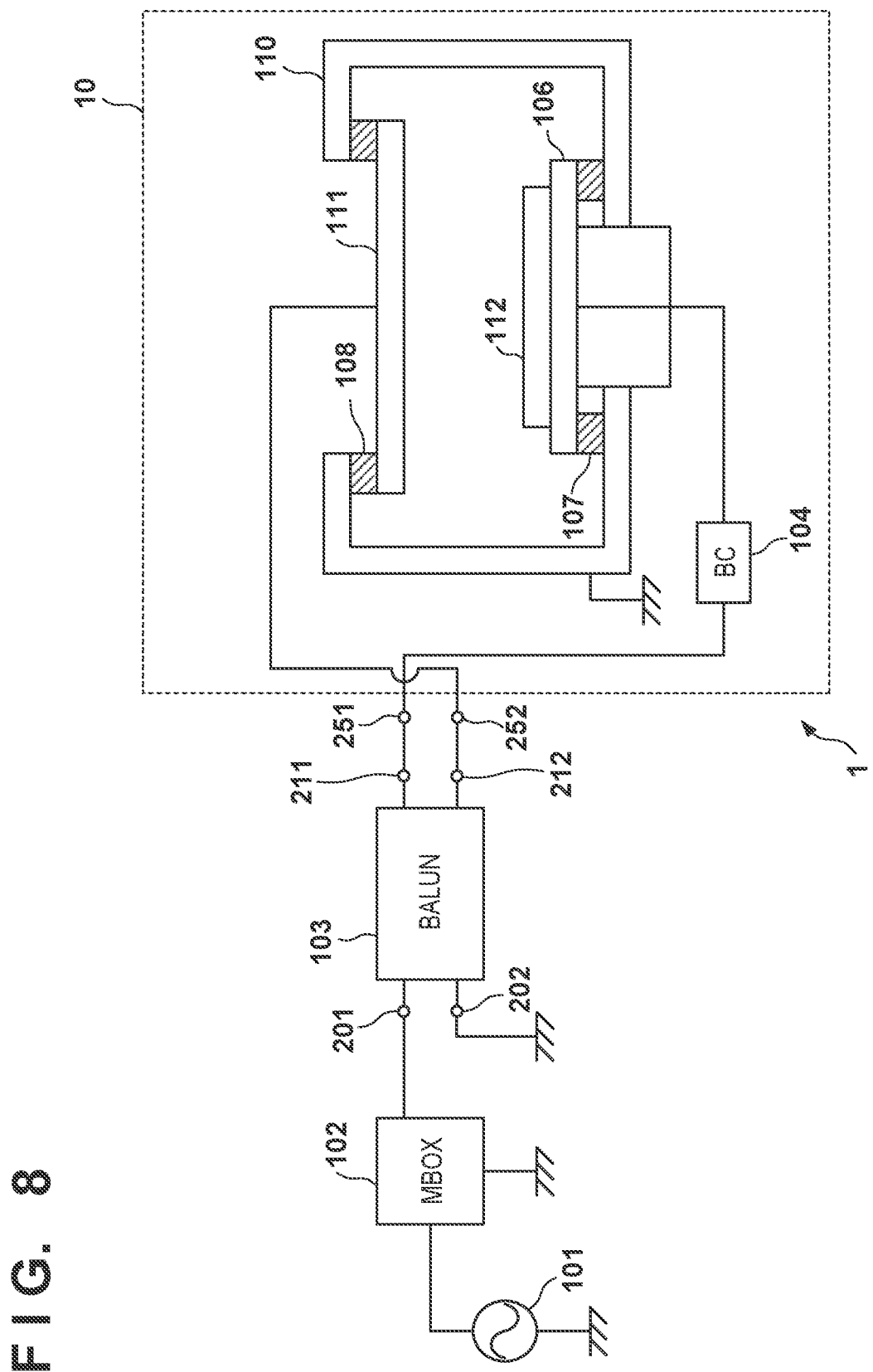
FIG. 8 is a view schematically showing the arrangement of a plasma processing apparatus 1 according to the second embodiment of the present invention.

FIG. 8 schematically shows the arrangement of a plasma processing apparatus 1 according to the second embodiment of the present invention. The plasma processing apparatus 1 according to the second embodiment can operate as an etching apparatus for etching a substrate 112. In the second embodiment, a first electrode 106 is a cathode and holds the substrate 112. In the second embodiment, a second electrode 111 is an anode. In the plasma processing apparatus 1 according to the second embodiment, the first electrode 106 and a first balanced terminal 211 are electrically connected via a blocking capacitor 104. In other words, in the plasma processing apparatus 1 according to the second embodiment, the blocking capacitor 104 is arranged in the electrical connection path between the first electrode 106 and the first balanced terminal 211.

Figure 9:
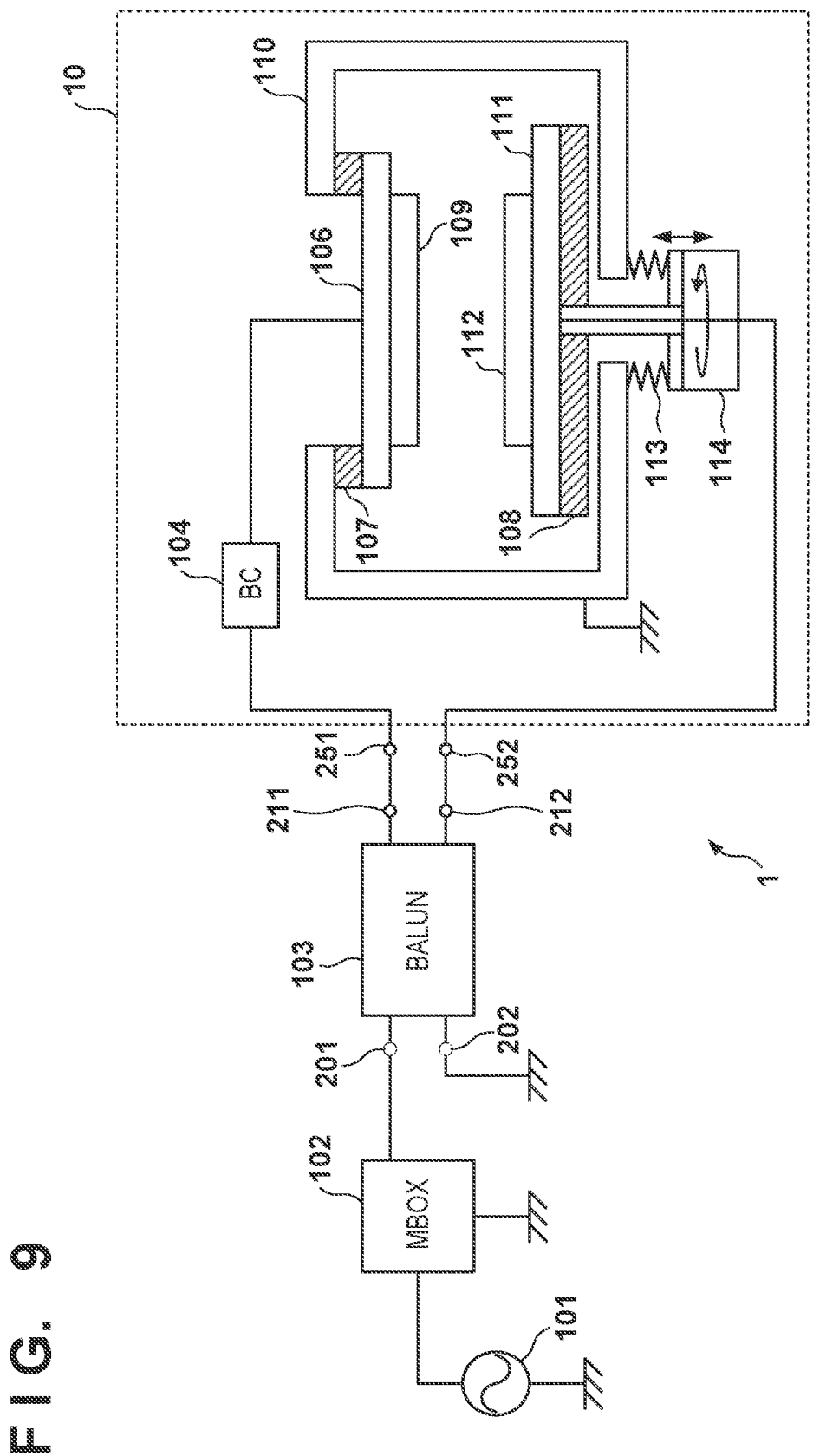
FIG. 9 is a view schematically showing the arrangement of a plasma processing apparatus 1 according to the third embodiment of the present invention.

FIG. 9 schematically shows the arrangement of a plasma processing apparatus 1 according to the third embodiment of the present invention. The plasma processing apparatus 1 according to the third embodiment is a modification of the plasma processing apparatus 1 according to the first embodiment, and further includes at least one of a mechanism configured to move a second electrode 111 up and down and a mechanism configured to rotate the second electrode 111. In the example shown in FIG. 9, the plasma processing apparatus 1 includes a driving mechanism 114 including both the mechanism configured to move the second electrode 111 up and down and the mechanism configured to rotate the second electrode 111. A bellows 113 that forms a vacuum partition can be provided between a vacuum container 110 and the driving mechanism 114.

Similarly, the plasma processing apparatus 1 according to the second embodiment can further include at least one of a mechanism configured to move the first electrode 106 up and down and a mechanism configured to rotate the second electrode 106.

Figure 10:
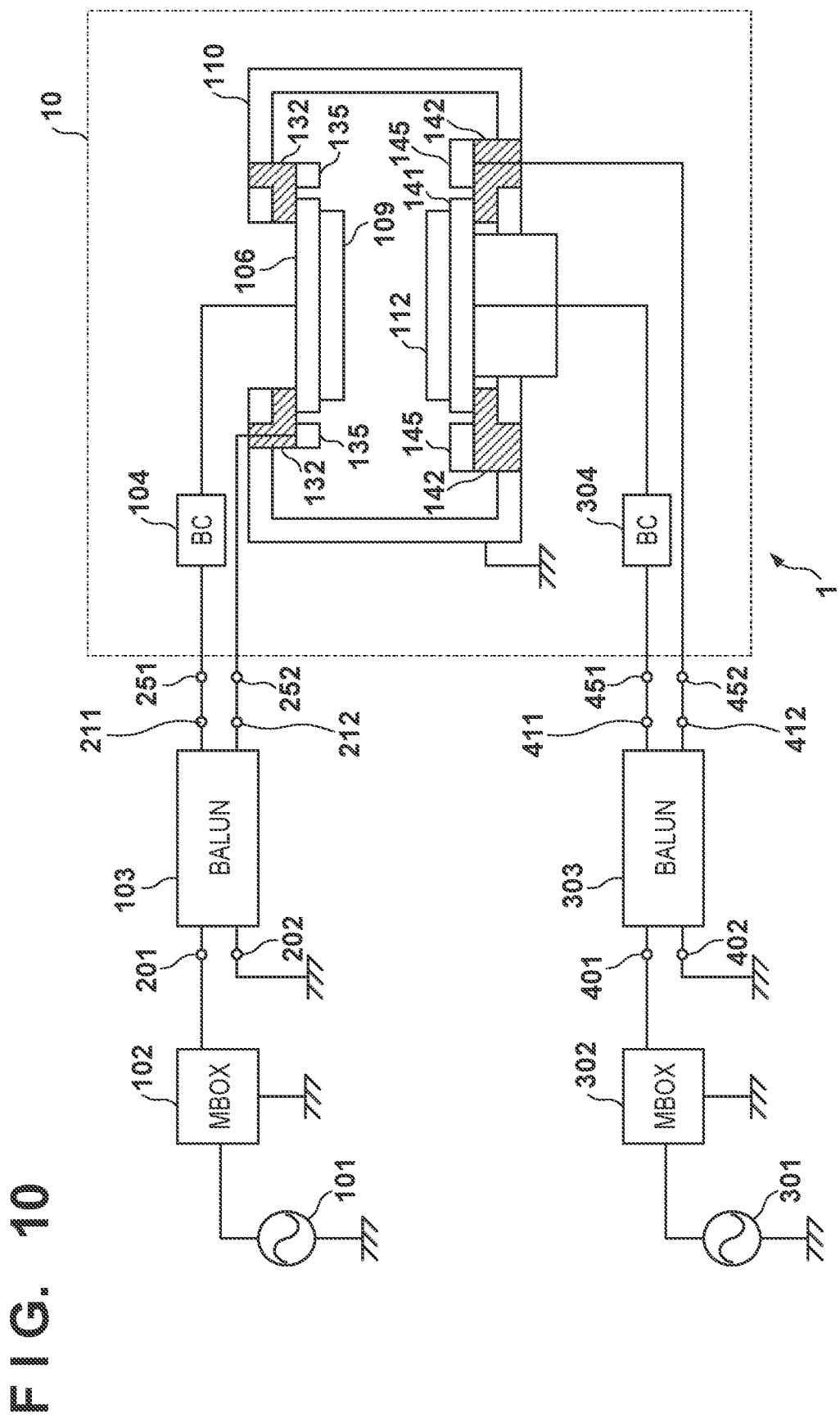
FIG. 10 is a view schematically showing the arrangement of a plasma processing apparatus 1 according to the fourth embodiment of the present invention.

FIG. 10 schematically shows the arrangement of a plasma processing apparatus 1 according to the fourth embodiment of the present invention. The plasma processing apparatus according to the fourth embodiment can operate as a sputtering apparatus for forming a film on a substrate 112 by sputtering. Matters that are not mentioned as the plasma processing apparatus 1 according to the fourth embodiment can comply with the first to third embodiments. The plasma processing apparatus 1 includes a first balun 103, a second balun 303, a vacuum container 110, a first electrode 106 and a second electrode 135 which form a first set, and a first electrode 141 and a second electrode 145 which form a second set. Alternatively, it may be understood that the plasma processing apparatus 1 includes the first balun 103, the second balun 303, and a main body 10, and the main body 10 includes the vacuum container 110, the first electrode 106 and the second electrode 135 which form the first set, and the first electrode 141 and the second electrode 145 which form the second set. The main body 10 includes a first terminal 251, a second terminal 252, a third terminal 451, and a fourth terminal 452.

The first balun 103 includes a first unbalanced terminal 201, a second unbalanced terminal 202, a first balanced terminal 211, and a second balanced terminal 212. An unbalanced circuit is connected to the side of the first unbalanced terminal 201 and the second unbalanced terminal 202 of the first balun 103, and a balanced circuit is connected to the side of the first balanced terminal 211 and the second balanced terminal 212 of the first balun 103. The second balun 303 can have an arrangement similar to the first balun 103. The second balun 303 includes a first unbalanced terminal 401, a second unbalanced terminal 402, a first balanced terminal 411, and a second balanced terminal 412. An unbalanced circuit is connected to the side of the first unbalanced terminal 401 and the second unbalanced terminal 402 of the second balun 303, and a balanced circuit is connected to the side of the first balanced terminal 411 and the second balanced terminal 412 of the second balun 303. The vacuum container 110 is grounded.

The first electrode 106 of the first set holds a target 109. The target 109 can be, for example, an insulating material or a conductive material. The second electrode 135 of the first set is arranged around the first electrode 106. The first electrode 106 of the first set is electrically connected to the first balanced terminal 211 of the first balun 103, and the second electrode 135 of the first set is electrically connected to the second balanced terminal 212 of the first balun 103. The first electrode 141 of the second set holds the substrate 112. The second electrode 145 of the second set is arranged around the first electrode 141. The first electrode 141 of the second set is electrically connected to the first balanced terminal 411 of the second balun 303, and the second electrode 145 of the second set is electrically connected to the second balanced terminal 412 of the second balun 303.

The above-described arrangement can be understood as an arrangement in which the first electrode 106 of the first set is electrically connected to the first terminal 251, the second electrode 135 of the first set is electrically connected to the second terminal 252, the first terminal 251 is electrically connected to the first balanced terminal 211 of the first balun 103, and the second terminal 252 is electrically connected to the second balanced terminal 212 of the first balun 103. Additionally, the above-described arrangement can be understood as an arrangement in which the first electrode 141 of the second set is electrically connected to the third terminal 451, the second electrode 145 of the second set is electrically connected to the fourth terminal 452, the third terminal 451 is electrically connected to the first balanced terminal 411 of the second balun 303, and the fourth terminal 452 is electrically connected to the second balanced terminal 412 of the second balun 303.

The first electrode 106 of the first set and the first balanced terminal 211 (first terminal 251) of the first balun 103 can electrically be connected via a blocking capacitor 104. The blocking capacitor 104 blocks a DC current between the first balanced terminal 211 of the first balun 103 and the first electrode 106 of the first set (or between the first balanced terminal 211 and the second balanced terminal 212 of the first balun 103). Instead of providing the blocking capacitor 104, a first impedance matching circuit 102 may be configured to block a DC current flowing between the first unbalanced terminal 201 and the second unbalanced terminal 202 of the first balun 103. The first electrode 106 and the second electrode 135 of the first set can be supported by the vacuum container 110 via an insulator 132.

The first electrode 141 of the second set and the first balanced terminal 411 (third terminal 451) of the second balun 303 can electrically be connected via a blocking capacitor 304. The blocking capacitor 304 blocks a DC current between the first balanced terminal 411 of the second balun 303 and the first electrode 141 of the second set (or between the first balanced terminal 411 and the second balanced terminal 412 of the second balun 303). Instead of providing the blocking capacitor 304, a second impedance matching circuit 302 may be configured to block a DC current flowing between the first unbalanced terminal 201 and the second unbalanced terminal 202 of the second balun 303. The first electrode 141 and the second electrode 145 of the second set can be supported by the vacuum container 110 via an insulator 142.

The plasma processing apparatus 1 can include a first high-frequency power supply 101, and the first impedance matching circuit 102 arranged between the first high-frequency power supply 101 and the first balun 103. The first high-frequency power supply 101 supplies a high frequency between the first unbalanced terminal 201 and the second unbalanced terminal 202 of the first balun 103 via the first impedance matching circuit 102. In other words, the first high-frequency power supply 101 supplies a high frequency between the first electrode 106 and the second electrode 135 via the first impedance matching circuit 102, the first balun 103, and the blocking capacitor 104. Alternatively, the first high-frequency power supply 101 supplies a high frequency between the first terminal 251 and the second terminal 252 of the main body 10 via the first impedance matching circuit 102 and the first balun 103. The first balun 103 and the first electrode 106 and the second electrode 135 of the first set form a first high-frequency supply unit configured to supply a high frequency to the internal space of the vacuum container 110.

The plasma processing apparatus 1 can include a second high-frequency power supply 301, and the second impedance matching circuit 302 arranged between the second high-frequency power supply 301 and the second balun 303. The second high-frequency power supply 301 supplies a high frequency between the first unbalanced terminal 401 and the second unbalanced terminal 402 of the second balun 303 via the second impedance matching circuit 302. In other words, the second high-frequency power supply 301 supplies a high frequency between the first electrode 141 and the second electrode 145 of the second set via the second impedance matching circuit 302, the second balun 303, and the blocking capacitor 304. Alternatively, the second high-frequency power supply 301 supplies a high frequency between the third terminal 451 and the fourth terminal 452 of the main body 10 via the second impedance matching circuit 302 and the second balun 303. The second balun 303 and the first electrode 141 and the second electrode 145 of the second set form a second high-frequency supply unit configured to supply a high frequency to the internal space of the vacuum container 110.

Let $Rp1-jXp1$ be an impedance when the side of the first electrode 106 and the second electrode 135 of the first set (the side of the main body 10) is viewed from the side of the first balanced terminal 211 and the second balanced terminal 212 of the first balun 103 in a state in which plasma is generated in the internal space of the vacuum container 110 by supply of a high frequency from the first high-frequency power supply 101. In addition, let X1 be the reactance component (inductance component) of the impedance of a first coil 221 of the first balun 103. In this definition, satisfying $1.5 \le X1/Rp1 \le 5000$ is advantageous in stabilizing the potential of plasma formed in the internal space of the vacuum container 110.

Additionally, let $Rp2-jXp2$ be an impedance when the side of the first electrode 141 and the second electrode 145 of the second set (the side of the main body 10) is viewed from the side of the first balanced terminal 411 and the second balanced terminal 412 of the second balun 303 in a state in which plasma is generated in the internal space of the vacuum container 110 by supply of a high frequency from the second high-frequency power supply 301. In addition, let X2 be the reactance component (inductance component) of the impedance of the first coil 221 of the second balun 303. In this definition, satisfying $1.5 \leq X2/Rp2 \leq 5000$ is advantageous in stabilizing the potential of plasma formed in the internal space of the vacuum container 110.

FIG. 11 schematically shows the arrangement of a plasma processing apparatus 1 according to the fifth embodiment of the present invention. The plasma processing apparatus 1 according to the fifth embodiment has an arrangement in which driving mechanisms 114 and 314 are added to the plasma processing apparatus 1 according to the fourth embodiment. The driving mechanism 114 can include at least one of a mechanism configured to move a first electrode 141 up and down and a mechanism configured to rotate the first electrode 141. The driving mechanism 314 can include a mechanism configured to move a second electrode 145 up and down.

Figure 12:
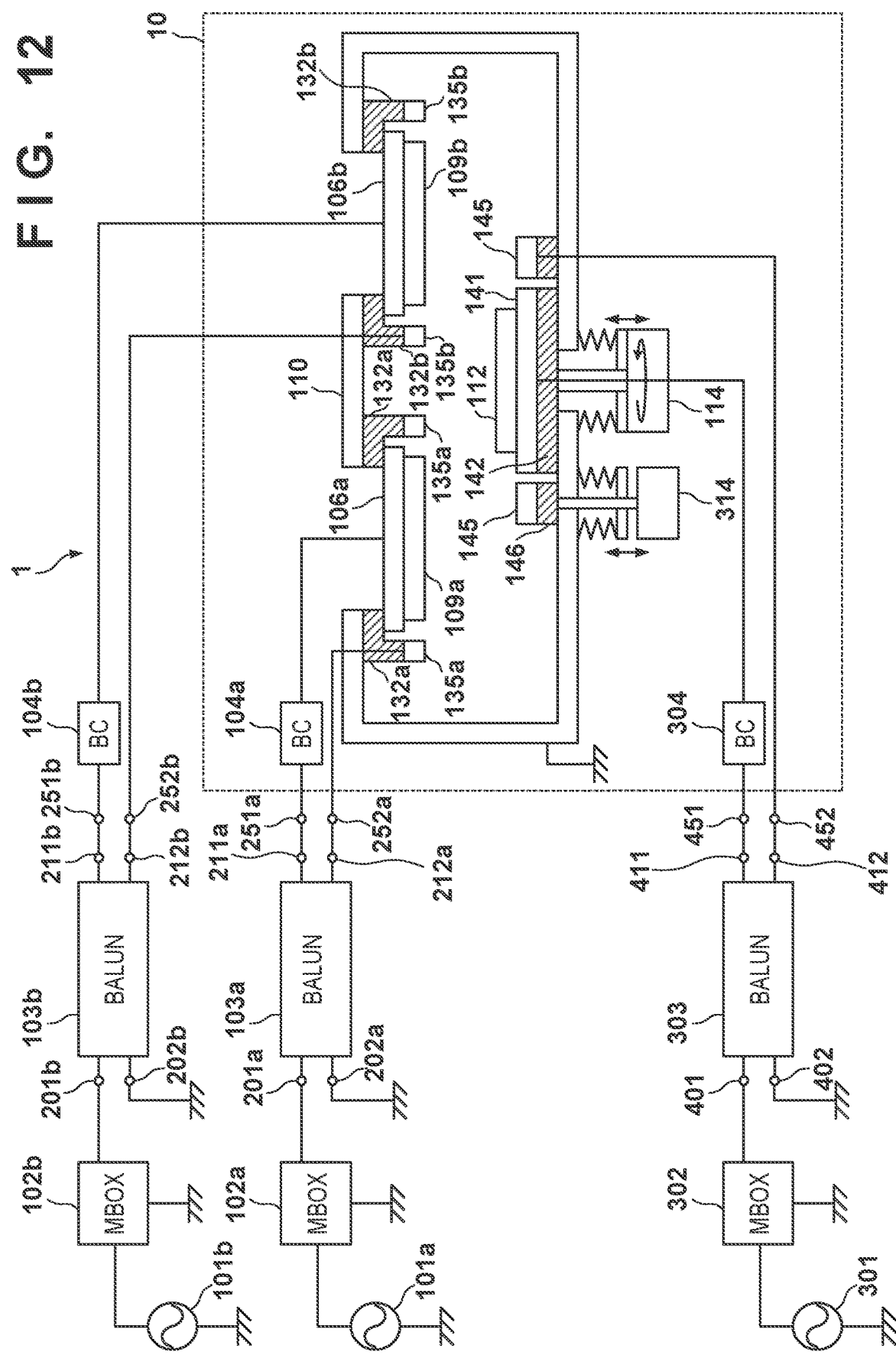
FIG. 12 is a view schematically showing the arrangement of a plasma processing apparatus 1 according to the sixth embodiment of the present invention.

FIG. 12 schematically shows the arrangement of a plasma processing apparatus 1 according to the sixth embodiment of the present invention. The plasma processing apparatus according to the sixth embodiment can operate as a sputtering apparatus for forming a film on a substrate 112 by sputtering. Matters that are not mentioned as the sixth embodiment can comply with the first to fifth embodiments. The plasma processing apparatus 1 according to the sixth embodiment includes a plurality of first high-frequency supply units and at least one second high-frequency supply unit. One of the plurality of first high-frequency supply units can include a first electrode 106a, a second electrode 135a, and a first balun 103a. The other of the plurality of first high-frequency supply units can include a first electrode 106b, a second electrode 135b, and a first balun 103b. An example in which the plurality of first high-frequency supply units include two high-frequency supply units will be described here. The two high-frequency supply units and constituent elements associated with these will be discriminated from each other by suffixes a and b. Similarly, two targets will also be discriminated from each other by suffixes a and b.

In another viewpoint, the plasma processing apparatus 1 includes the plurality of first baluns 103a and 103b, a second balun 303, a vacuum container 110, the first electrode 106a and the second electrode 135a, the first electrode 106b and the second electrode 135b, a first electrode 141, and a second electrode 145. Alternatively, it may be understood that the plasma processing apparatus 1 includes the plurality of first baluns 103a and 103b, the second balun 303, and a main body 10, and the main body 10 includes the vacuum container 110, the first electrode 106a and the second electrode 135a, the first electrode 106b and the second electrode 135b, the first electrode 141, and the second electrode 145. The main body 10 includes first terminals 251a and 251b, second terminals 252a and 252b, a third terminal 451 and a fourth terminal 452.

The first balun 103a includes a first unbalanced terminal 201a, a second unbalanced terminal 202a, a first balanced terminal 211a, and a second balanced terminal 212a. An unbalanced circuit is connected to the side of the first unbalanced terminal 201a and the second unbalanced terminal 202a of the first balun 103a, and a balanced circuit is connected to the side of the first balanced terminal 211a and the second balanced terminal 212a of the first balun 103a. The first balun 103b includes a first unbalanced terminal 201b, a second unbalanced terminal 202b, a first balanced terminal 211b, and a second balanced terminal 212b. An unbalanced circuit is connected to the side of the first unbalanced terminal 201b and the second unbalanced terminal 202b of the first balun 103b, and a balanced circuit is connected to the side of the first balanced terminal 211b and the second balanced terminal 212b of the first balun 103b.

The second balun 303 can have an arrangement similar to the first baluns 103a and 103b. The second balun 303 includes a first unbalanced terminal 401, a second unbalanced terminal 402, a first balanced terminal 411, and a second balanced terminal 412. An unbalanced circuit is connected to the side of the first unbalanced terminal 401 and the second unbalanced terminal 402 of the second balun 303, and a balanced circuit is connected to the side of the first balanced terminal 411 and the second balanced terminal 412 of the second balun 303. The vacuum container 110 is grounded.

The first electrodes 106a and 106b hold targets 109a and 109b, respectively. The targets 109a and 109b can be, for example, an insulating material or a conductive material. The second electrodes 135a and 135b are arranged around the first electrodes 106a and 106b, respectively. The first electrodes 106a and 106b are electrically connected to the first balanced terminals 211a and 211b of the first baluns 103a and 103b, respectively, and the second electrodes 135a and 135b are electrically connected to the second balanced terminals 212a and 212b of the first baluns 103a and 103b, respectively.

The first electrode 141 holds the substrate 112. The second electrode 145 is arranged around the first electrode 141. The first electrode 141 is electrically connected to the first balanced terminal 411 of the second balun 303, and the second electrode 145 is electrically connected to the second balanced terminal 412 of the second balun 303.

The above-described arrangement can be understood as an arrangement in which the first electrodes 106a and 106b are electrically connected to the first terminals 251a and 251b, respectively, the second electrodes 135a and 135b are electrically connected to the second terminals 252a and 252b, respectively, the first terminals 251a and 251b are electrically connected to the first balanced terminals 211a and 111b of the first baluns 103a and 103b, respectively, and the second terminals 252a and 252b are electrically connected to the second balanced terminals 212a and 212b of the first baluns 103a and 103b, respectively. Additionally, the above-described arrangement can be understood as an arrangement in which the first electrode 141 is electrically connected to the third terminal 451, the second electrode 145 is electrically connected to the fourth terminal 452, the third terminal 451 is electrically connected to the first balanced terminal 411 of the second balun 303, and the fourth terminal 452 is electrically connected to the second balanced terminal 412 of the second balun 303.

The first electrodes 106a and 106b and the first balanced terminals 211a and 211b (first terminals 251a and 251b) of the first baluns 103a and 103b can electrically be connected via blocking capacitors 104a and 104b, respectively. The blocking capacitors 104a and 104b block a DC current between the first balanced terminals 211a and 211b of the first baluns 103a and 103b and the first electrodes 106a and 106b (or between the first balanced terminals 211a and 211b and the second balanced terminals 212a and 212b of the first baluns 103a and 103b). Instead of providing the blocking capacitors 104a and 104b, first impedance matching circuits 102a and 102b may be configured to block a DC current flowing between the first unbalanced terminals 201a and 201b and the second unbalanced terminals 202a and 202b of the first baluns 103a and 103b. Alternatively, the blocking capacitors 104a and 104b may be arranged between the second electrodes 135a and 135b and the second balanced terminals 212a and 212b (second terminals 252a and 252b) of the first baluns 103a and 103b. The first electrodes 106a and 106b and the second electrodes 135a and 135b can be supported by the vacuum container 110 via insulators 132a and 132b, respectively.

The first electrode 141 and the first balanced terminal 411 (third terminal 451) of the second balun 303 can electrically be connected via a blocking capacitor 304. The blocking capacitor 304 blocks a DC current between the first balanced terminal 411 of the second balun 303 and the first electrode 141 (or between the first balanced terminal 411 and the second balanced terminal 412 of the second balun 303). Instead of providing the blocking capacitor 304, a second impedance matching circuit 302 may be configured to block a DC current flowing between the first unbalanced terminal 201 and the second unbalanced terminal 202 of the second balun 303. Alternatively, the blocking capacitor 304 may be arranged between the second electrode 145 and the second balanced terminal 412 (fourth terminal 452) of the second balun 303. The first electrode 141 and the second electrode 145 can be supported by the vacuum container 110 via an insulator 142.

The plasma processing apparatus 1 can include a plurality of first high-frequency power supplies 101a and 101b, and the first impedance matching circuits 102a and 102b arranged between the plurality of first high-frequency power supplies 101a and 101b and the plurality of first baluns 103a and 103b, respectively. The first high-frequency power supplies 101a and 101b supply a high frequency between the first unbalanced terminals 201a and 201b and the second unbalanced terminals 202a and 202b of the first baluns 103a and 103b via the first impedance matching circuits 102a and 102b, respectively. In other words, the first high-frequency power supplies 101a and 101b supply a high frequency between the first electrodes 106a and 106b and the second electrodes 135a and 135b via the first impedance matching circuits 102a and 102b, the first baluns 103a and 103b, and the blocking capacitors 104a and 104b, respectively. Alternatively, the first high-frequency power supplies 101a and 101b supply a high frequency between the first terminals 251a and 251b and the second terminals 252a and 252b of the main body 10 via the first impedance matching circuits 102a and 102b and the first baluns 103a and 103b.

The plasma processing apparatus 1 can include a second high-frequency power supply 301, and the second impedance matching circuit 302 arranged between the second high-frequency power supply 301 and the second balun 303. The second high-frequency power supply 301 supplies a high frequency between the first unbalanced terminal 401 and the second unbalanced terminal 402 of the second balun 303 via the second impedance matching circuit 302. In other words, the second high-frequency power supply 301 supplies a high frequency between the first electrode 141 and the second electrode 145 via the second impedance matching circuit 302, the second balun 303, and the blocking capacitor 304. Alternatively, the second high-frequency power supply 301 supplies a high frequency between the third terminal 451 and the fourth terminal 452 of the main body 10 via the second impedance matching circuit 302 and the second balun 303.

Figure 13:
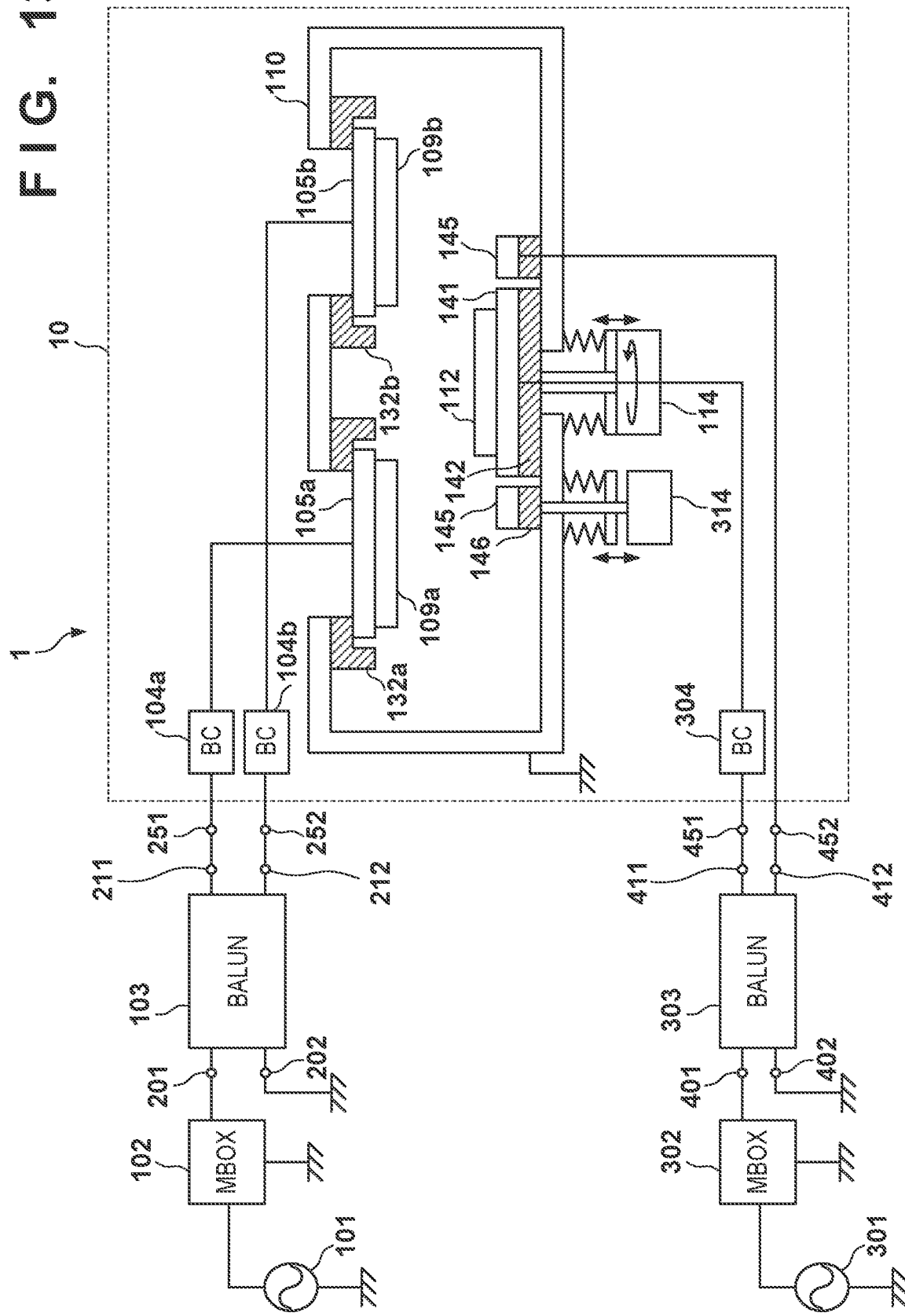
FIG. 13 is a view schematically showing the arrangement of a plasma processing apparatus 1 according to the seventh embodiment of the present invention.

FIG. 13 schematically shows the arrangement of a plasma processing apparatus 1 according to the seventh embodiment of the present invention. The plasma processing apparatus 1 according to the seventh embodiment can operate as a sputtering apparatus for forming a film on a substrate 112 by sputtering. Matters that are not mentioned as the plasma processing apparatus 1 according to the seventh embodiment can comply with the first to sixth embodiments. The plasma processing apparatus 1 includes a first balun 103, a second balun 303, a vacuum container 110, a first electrode 105a and a second electrode 105b which form a first set, and a first electrode 141 and a second electrode 145 which form a second set. Alternatively, it may be understood that the plasma processing apparatus 1 includes the first balun 103, the second balun 303, and a main body 10, and the main body 10 includes the vacuum container 110, the first electrode 105a and the second electrode 105b which form the first set, and the first electrode 141 and the second electrode 145 which form the second set. The main body 10 includes a first terminal 251, a second terminal 252, a third terminal 451, and a fourth terminal 452.

The first balun 103 includes a first unbalanced terminal 201, a second unbalanced terminal 202, a first balanced terminal 211, and a second balanced terminal 212. An unbalanced circuit is connected to the side of the first unbalanced terminal 201 and the second unbalanced terminal 202 of the first balun 103, and a balanced circuit is connected to the side of the first balanced terminal 211 and the second balanced terminal 212 of the first balun 103. The second balun 303 can have an arrangement similar to the first balun 103. The second balun 303 includes a first unbalanced terminal 401, a second unbalanced terminal 402, a first balanced terminal 411, and a second balanced terminal 412. An unbalanced circuit is connected to the side of the first unbalanced terminal 401 and the second unbalanced terminal 402 of the second balun 303, and a balanced circuit is connected to the side of the first balanced terminal 411 and the second balanced terminal 412 of the second balun 303. The vacuum container 110 is grounded.

The first electrode 105a of the first set holds a first target 109a, and faces the space on the side of the substrate 112 via the first target 109a. The second electrode 105b of the first set is arranged adjacent to the first electrode 105a, holds a second target 109b, and faces the space on the side of the substrate 112 via the second target 109b. The targets 109a and 109b can be, for example, an insulating material or a conductive material. The first electrode 105a of the first set is electrically connected to the first balanced terminal 211 of the first balun 103, and the second electrode 105b of the first set is electrically connected to the second balanced terminal 212 of the first balun 103.

The first electrode 141 of the second set holds the substrate 112. The second electrode 145 of the second set is arranged around the first electrode 141. The first electrode 141 of the second set is electrically connected to the first balanced terminal 411 of the second balun 303, and the second electrode 145 of the second set is electrically connected to the second balanced terminal 412 of the second balun 303.

The above-described arrangement can be understood as an arrangement in which the first electrode 105a of the first set is electrically connected to the first terminal 251, the second electrode 105b of the first set is electrically connected to the second terminal 252, the first terminal 251 is electrically connected to the first balanced terminal 211 of the first balun 103, and the second terminal 252 is electrically connected to the second balanced terminal 212 of the first balun 103. Additionally, the above-described arrangement can be understood as an arrangement in which the first electrode 141 of the second set is electrically connected to the third terminal 451, the second electrode 145 of the second set is electrically connected to the fourth terminal 452, the third terminal 451 is electrically connected to the first balanced terminal 411 of the second balun 303, and the fourth terminal 452 is electrically connected to the second balanced terminal 412 of the second balun 303.

The first electrode 105a of the first set and the first balanced terminal 211 (first terminal 251) of the first balun 103 can electrically be connected via a blocking capacitor 104a. The blocking capacitor 104a blocks a DC current between the first balanced terminal 211 of the first balun 103 and the first electrode 105a of the first set (or between the first balanced terminal 211 and the second balanced terminal 212 of the first balun 103). The second electrode 105b of the first set and the second balanced terminal 212 (second terminal 252) of the first balun 103 can electrically be connected via a blocking capacitor 104b. The blocking capacitor 104b blocks a DC current between the second balanced terminal 212 of the first balun 103 and the second electrode 105b of the first set (or between the first balanced terminal 211 and the second balanced terminal 212 of the first balun 103). The first electrode 105a and the second electrode 105b of the first set can be supported by the vacuum container 110 via insulators 132a and 132b, respectively.

The first electrode 141 of the second set and the first balanced terminal 411 (third terminal 451) of the second balun 303 can electrically be connected via a blocking capacitor 304. The blocking capacitor 304 blocks a DC current between the first balanced terminal 411 of the second balun 303 and the first electrode 141 of the second set (or between the first balanced terminal 411 and the second balanced terminal 412 of the second balun 303). Instead of providing the blocking capacitor 304, a second impedance matching circuit 302 may be configured to block a DC current flowing between the first unbalanced terminal 401 and the second unbalanced terminal 402 of the second balun 303. The first electrode 141 and the second electrode 145 of the second set can be supported by the vacuum container 110 via insulators 142 and 146, respectively.

The plasma processing apparatus 1 can include a first high-frequency power supply 101, and a first impedance matching circuit 102 arranged between the first high-frequency power supply 101 and the first balun 103. The first high-frequency power supply 101 supplies a high frequency between the first electrode 105a and the second electrode 105b via the first impedance matching circuit 102, the first balun 103, and the blocking capacitors 104a and 104b. Alternatively, the first high-frequency power supply 101 supplies a high frequency between the first terminal 251 and the second terminal 252 of the main body 10 via the first impedance matching circuit 102 and the first balun 103. The first balun 103 and the first electrode 105a and the second electrode 105b of the first set form a first high-frequency supply unit configured to supply a high frequency to the internal space of the vacuum container 110.

The plasma processing apparatus 1 can include a second high-frequency power supply 301, and the second impedance matching circuit 302 arranged between the second high-frequency power supply 301 and the second balun 303. The second high-frequency power supply 301 supplies a high frequency between the first unbalanced terminal 401 and the second unbalanced terminal 402 of the second balun 303 via the second impedance matching circuit 302. The second high-frequency power supply 301 supplies a high frequency between the first electrode 141 and the second electrode 145 of the second set via the second impedance matching circuit 302, the second balun 303, and the blocking capacitor 304. Alternatively, the second high-frequency power supply 301 supplies a high frequency between the third terminal 451 and the fourth terminal 452 of the main body 10 via the second impedance matching circuit 302 and the second balun 303. The second balun 303 and the first electrode 141 and the second electrode 145 of the second set form a second high-frequency supply unit configured to supply a high frequency to the internal space of the vacuum container 110.

Let Rp1−jXp1 be an impedance when the side of the first electrode 105a and the second electrode 105b of the first set (the side of the main body 10) is viewed from the side of the first balanced terminal 211 and the second balanced terminal 212 of the first balun 103 in a state in which plasma is generated in the internal space of the vacuum container 110 by supply of a high frequency from the first high-frequency power supply 101. In addition, let X1 be the reactance component (inductance component) of the impedance of a first coil 221 of the first balun 103. In this definition, satisfying $1.5 \leq X1/Rp1 \leq 5000$ is advantageous in stabilizing the potential of plasma formed in the internal space of the vacuum container 110.

Additionally, let Rp2−jXp2 be an impedance when the side of the first electrode 127 and the second electrode 130 of the second set (the side of the main body 10) is viewed from the side of the first balanced terminal 411 and the second balanced terminal 412 of the second balun 303 in a state in which plasma is generated in the internal space of the vacuum container 110 by supply of a high frequency from the second high-frequency power supply 301. In addition, let X2 be the reactance component (inductance component) of the impedance of the first coil 221 of the second balun 303. In this definition, satisfying $1.5 \leq X2/Rp2 \leq 5000$ is advantageous in stabilizing the potential of plasma formed in the internal space of the vacuum container 110.

The plasma processing apparatus 1 according to the seventh embodiment can further include at least one of a mechanism configured to move the first electrode 141 forming the second set up and down and a mechanism configured to rotate the first electrode 141 forming the second set. In the example shown in FIG. 13, the plasma processing apparatus 1 includes a driving mechanism 114 including both the mechanism configured to move the first electrode 141 up and down and the mechanism configured to rotate the first electrode 141. Additionally, in the example shown in FIG. 13, the plasma processing apparatus 1 includes a mechanism 314 configured to move the second electrode 145 forming the second set up and down. A bellows that forms a vacuum partition can be provided between the vacuum container 110 and each of the driving mechanisms 114 and 314.

The function of the first balun 103 in the plasma processing apparatus 1 according to the seventh embodiment shown in FIG. 13 will be described with reference to FIG. 14. Let I1 be a current flowing to the first unbalanced terminal 201, I2 be a current flowing to the first balanced terminal 211, I2' be a current flowing to the second unbalanced terminal 202, and I3 be a current flowing to ground in the current I2. If I3=0, that is, the current does not flow to ground on the side of the balanced circuit, the isolation performance of the balanced circuit to ground is best. If I3=I2, that is, the current I2 flowing to the first balanced terminal 211 wholly flows to ground, the isolation performance of the balanced circuit to ground is poorest. An index ISO representing the degree of isolation performance can be given by the following expression, as in the first to fifth embodiments. Under this definition, when the absolute value of the value of ISO is large, the isolation performance is high.

$$\text{ISO [dB]} = 20 \log(I3/I2')$$

Figure 14:
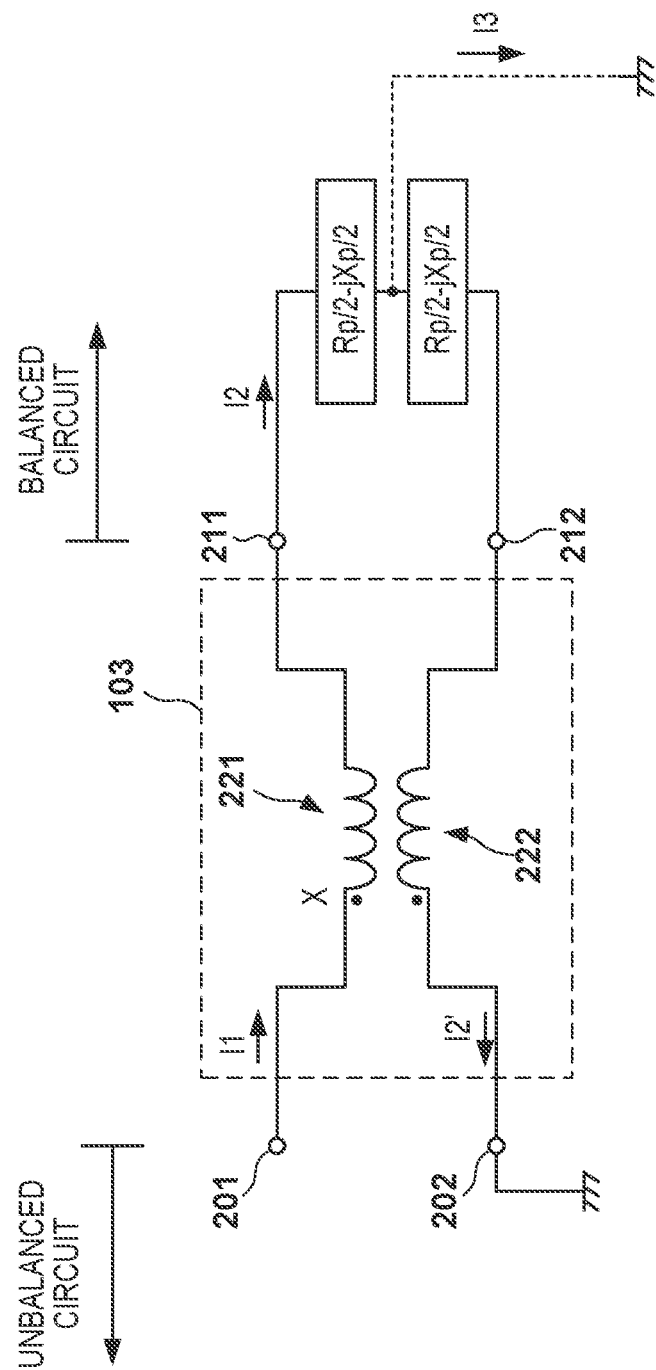
FIG. 14 is a view for explaining the function of a balun according to the seventh embodiment of the present invention.

In FIG. 14, Rp−jXp (=Rp/2−jXp/2+Rp/2−jXp/2) represents an impedance (including the reactance of the blocking capacitors 104a and 104b) when the side of the first electrode 105a and the second electrode 105b (the side of the main body 10) is viewed from the side of the first balanced terminal 211 and the second balanced terminal 212 in a state in which plasma is generated in the internal space of the vacuum container 110. Rp represents a resistance component, and −Xp represents a reactance component. Additionally, in FIG. 14, X represents the reactance component (inductance component) of the impedance of the first coil 221 of the first balun 103. ISO has correlation with X/Rp.

FIG. 4 referred to in the description of the first embodiment shows the relationship between the currents I1 (=I2), I2', and I3, ISO, and α(=X/Rp). The relationship shown in FIG. 4 holds in the seventh embodiment as well. The present inventor found that, in the seventh embodiment as well, satisfying 1.5≤X/Rp≤5000 is advantageous in making the potential (plasma potential) of plasma formed in the internal space of the vacuum container 110 (the space between the first electrode 105a and the second electrode 105b) insensitive to the state of the inner surface of the vacuum container 110. Here, that the plasma potential is insensitive to the state of the inner surface of the vacuum container 110 means that the plasma potential can be stabilized even if the plasma processing apparatus 1 is used for a long time. 1.5≤X/Rp≤5000 corresponds to −10.0 dB≤ISO≤−80 dB.

Figure 15A:
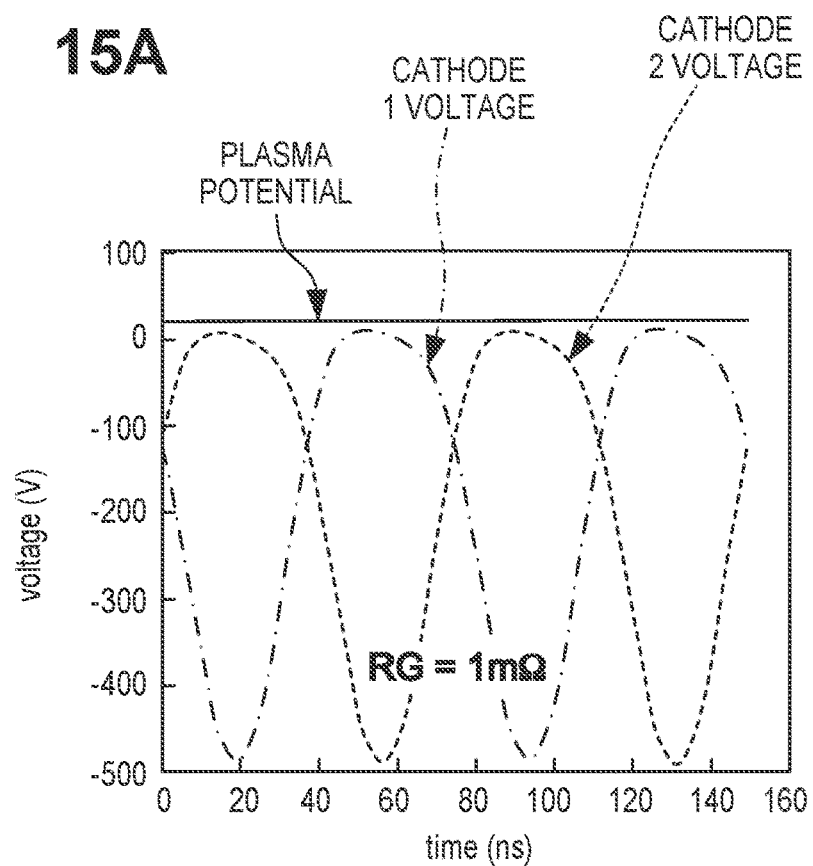
FIG. 15A is a view showing a result of simulating a plasma potential and two cathode potentials in a case in which $1.5 \leq X/Rp \leq 5000$ is satisfied.
Figure 15B:
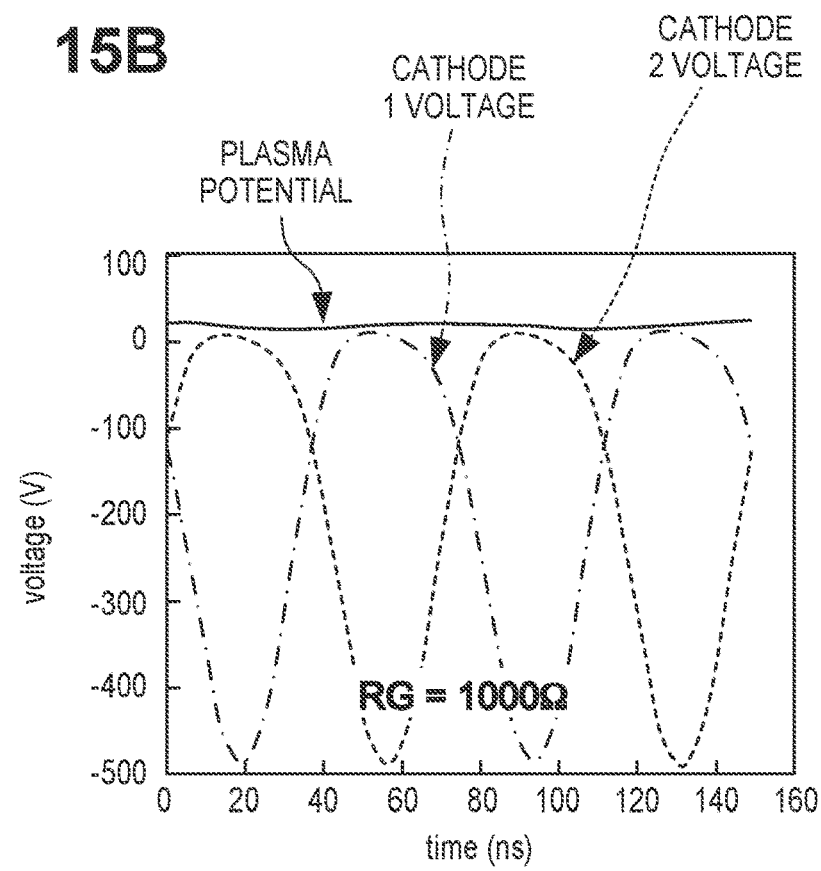
FIG. 15B is a view showing a result of simulating a plasma potential and two cathode potentials in a case in which $1.5 \leq X/Rp \leq 5000$ is satisfied.
Figure 15C:
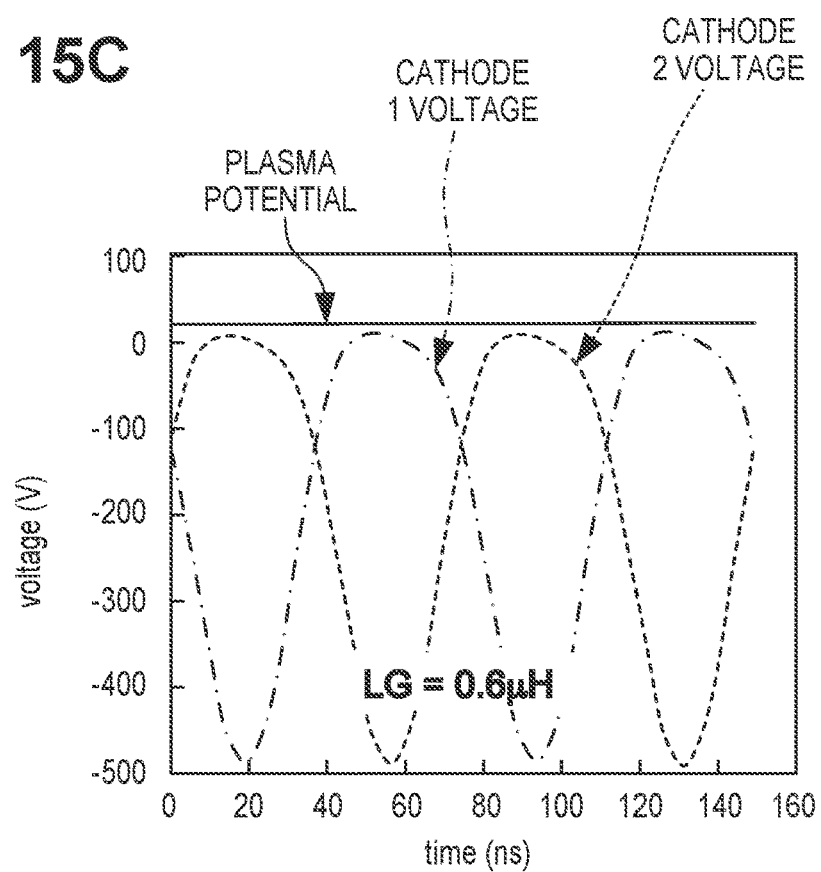
FIG. 15C is a view showing a result of simulating a plasma potential and two cathode potentials in a case in which $1.5 \leq X/Rp \leq 5000$ is satisfied.
Figure 15D:
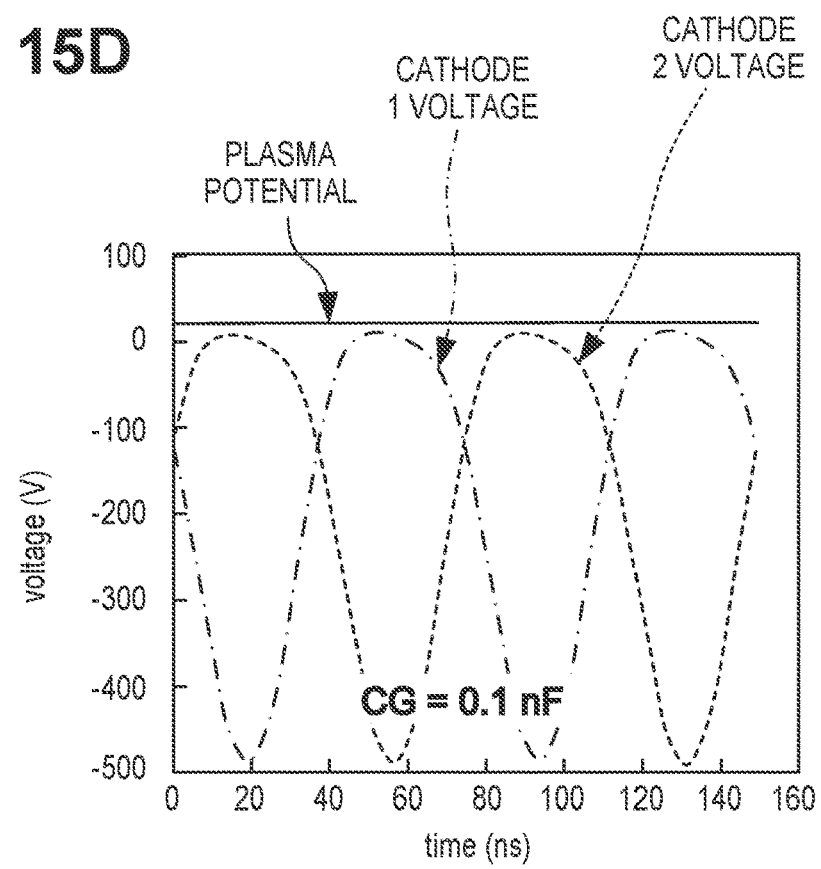
FIG. 15D is a view showing a result of simulating a plasma potential and two cathode potentials in a case in which $1.5 \leq X/Rp \leq 5000$ is satisfied.

FIGS. 15A to 15D show results of simulating the plasma potential, the potential (cathode 1 potential) of the first electrode 105a, and the potential (cathode 2 potential) of the second electrode 105b in a case in which 1.5≤X/Rp≤5000 is satisfied. FIG. 15A shows the plasma potential, the potential (cathode 1 potential) of the first electrode 105a, and the potential (cathode 2 potential) of the second electrode 105b in a state in which a resistive film (1 mΩ) is formed on the inner surface of the vacuum container 110. FIG. 15B shows the plasma potential, the potential (cathode 1 potential) of the first electrode 105a, and the potential (cathode 2 potential) of the second electrode 105b in a state in which a resistive film (1,000Ω) is formed on the inner surface of the vacuum container 110. FIG. 15C shows the plasma potential, the potential (cathode 1 potential) of the first electrode 105a, and the potential (cathode 2 potential) of the second electrode 105b in a state in which an inductive film (0.6 μH) is formed on the inner surface of the vacuum container 110. FIG. 15D shows the plasma potential, the potential (cathode 1 potential) of the first electrode 105a, and the potential (cathode 2 potential) of the second electrode 105b in a state in which a capacitive film (0.1 nF) is formed on the inner surface of the vacuum container 110. It can be understood from FIGS. 15A to 15D that satisfying 1.5≤X/Rp≤5000 is advantageous in stabilizing the plasma potential in various states of the inner surface of the vacuum container 110.

Figure 16A:
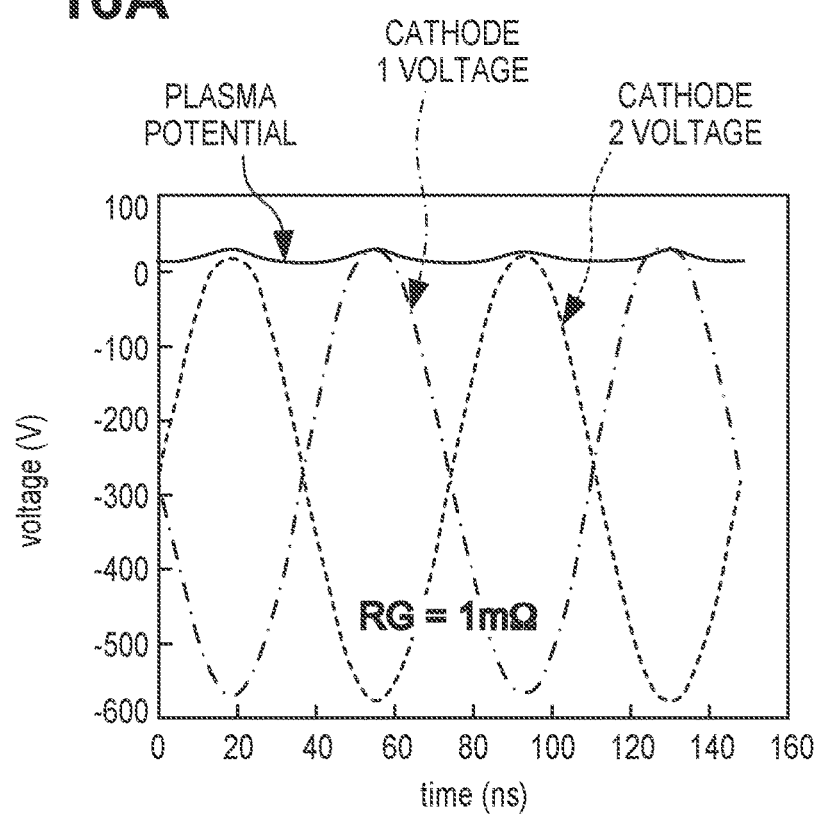
FIG. 16A is a view showing a result of simulating a plasma potential and two cathode potentials in a case in which $1.5 \leq X/Rp \leq 5000$ is not satisfied.
Figure 16B:
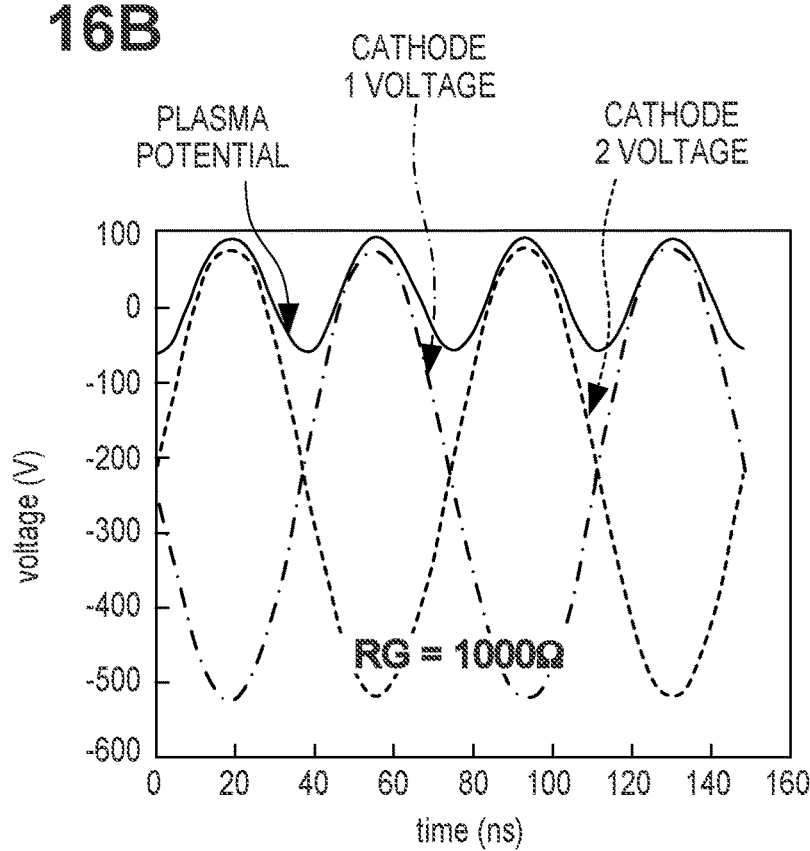
FIG. 16B is a view showing a result of simulating a plasma potential and two cathode potentials in a case in which $1.5 \leq X/Rp \leq 5000$ is not satisfied.
Figure 16C:
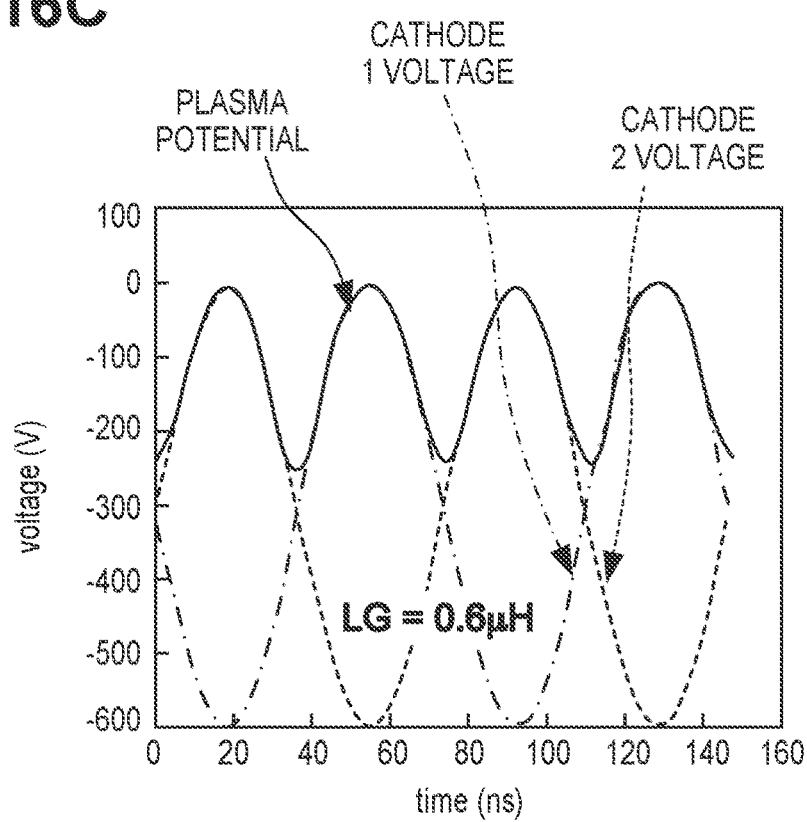
FIG. 16C is a view showing a result of simulating a plasma potential and two cathode potentials in a case in which $1.5 \leq X/Rp \leq 5000$ is not satisfied.
Figure 16D:
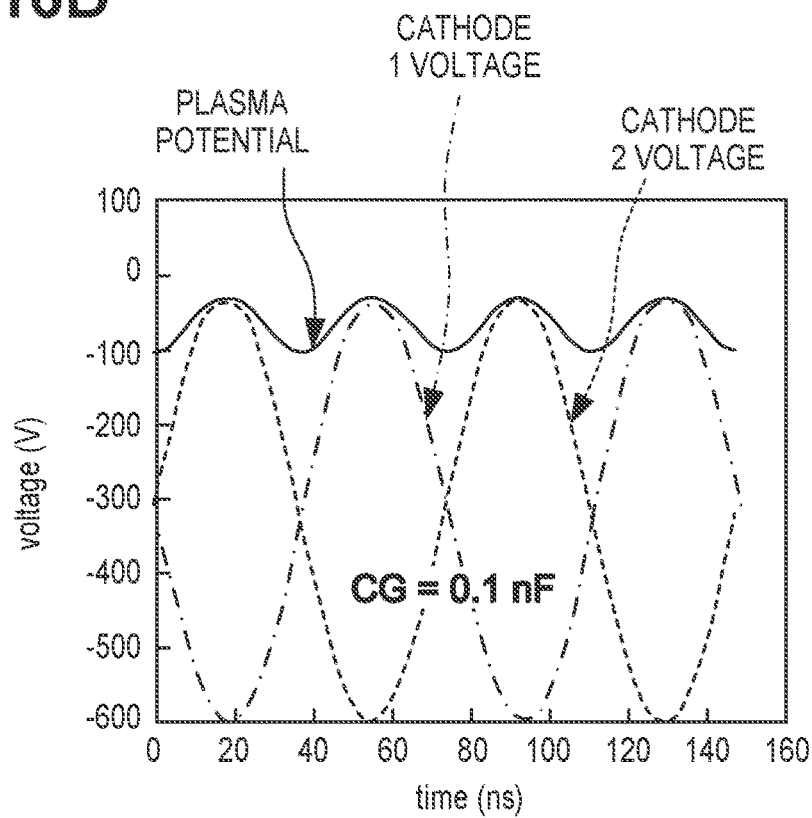
FIG. 16D is a view showing a result of simulating a plasma potential and two cathode potentials in a case in which $1.5 \leq X/Rp \leq 5000$ is not satisfied.

FIGS. 16A to 16D show results of simulating the plasma potential, the potential (cathode 1 potential) of the first electrode 105a, and the potential (cathode 2 potential) of the second electrode 105b in a case in which 1.5≤X/Rp≤5000 is not satisfied. FIG. 16A shows the plasma potential, the potential (cathode 1 potential) of the first electrode 105a, and the potential (cathode 2 potential) of the second electrode 105b in a state in which a resistive film (1 mΩ) is formed on the inner surface of the vacuum container 110. FIG. 16B shows the plasma potential, the potential (cathode 1 potential) of the first electrode 105a, and the potential (cathode 2 potential) of the second electrode 105b in a state in which a resistive film (1,000Ω) is formed on the inner surface of the vacuum container 110. FIG. 16C shows the plasma potential, the potential (cathode 1 potential) of the first electrode 105a, and the potential (cathode 2 potential) of the second electrode 105b in a state in which an inductive film (0.6 μH) is formed on the inner surface of the vacuum container 110. FIG. 16D shows the plasma potential, the potential (cathode 1 potential) of the first electrode 105a, and the potential (cathode 2 potential) of the second electrode 105b in a state in which a capacitive film (0.1 nF) is formed on the inner surface of the vacuum container 110. It can be understood from FIGS. 16A to 16D that if 1.5≤X/Rp≤5000 is not satisfied, the plasma potential changes depending on the state of the inner surface of the vacuum container 110.

The plasma potential readily changes depending on the state of the inner surface of the vacuum container 110 in both a case in which X/Rp>5000 (for example, X/Rp=∞) and a case in which X/Rp<1.5 (for example, X/Rp=1.16, X/Rp=0.87). If X/Rp>5000, in a state in which no film is formed on the inner surface of the vacuum container 110, discharge occurs only between the first electrode 105a and the second electrode 105b. However, if X/Rp>5000, when a film starts being formed on the inner surface of the vacuum container 110, the plasma potential sensitively reacts to this, and a result as shown in FIG. 16A to 16D is obtained. On the other hand, if X/Rp<1.5, the current flowing to ground via the vacuum container 110 is large. For this reason, the influence of the state of the inner surface of the vacuum container 110 (the electrical characteristic of the film formed on the inner surface) is conspicuous, and the plasma potential changes depending on the formation of a film. Hence, it is advantageous that the plasma processing apparatus 1 is configured such that 1.5≤X/Rp≤5000 is satisfied, as described above.

Figure 17:
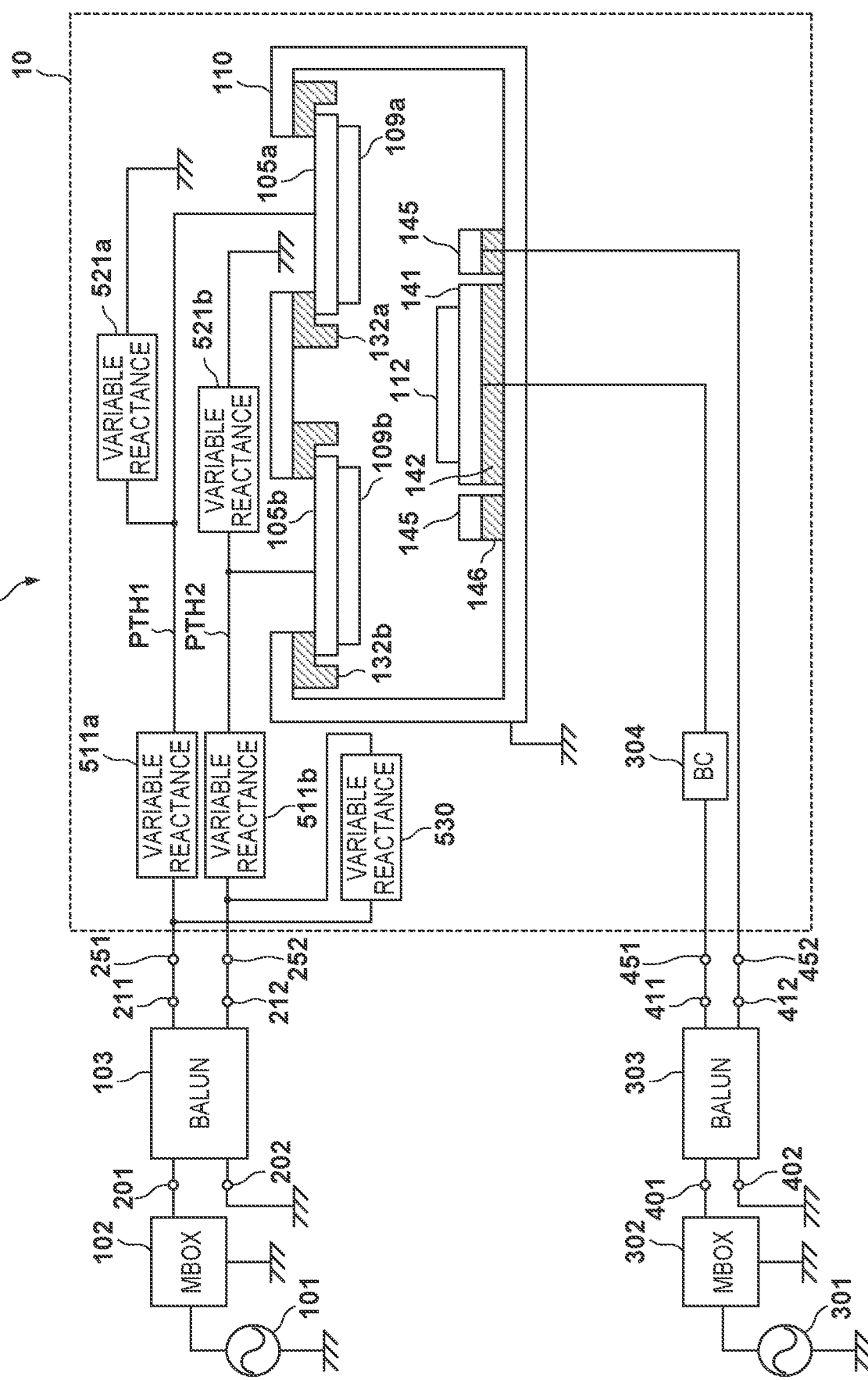
FIG. 17 is a view schematically showing the arrangement of a plasma processing apparatus 1 according to the eighth embodiment of the present invention.

FIG. 17 schematically shows the arrangement of a plasma processing apparatus 1 according to the eighth embodiment of the present invention. The plasma processing apparatus 1 according to the eighth embodiment can operate as a sputtering apparatus for forming a film on a substrate 112 by sputtering. Matters that are not mentioned as the plasma processing apparatus 1 according to the eighth embodiment can comply with the first to seventh embodiments. The plasma processing apparatus 1 according to the eighth embodiment includes a balun (first balun) 103, a vacuum container 110, a first electrode 105a, and a second electrode 105b. Alternatively, it may be understood that the plasma processing apparatus 1 includes the balun 103 and a main body 10, and the main body 10 includes the vacuum container 110, the first electrode 105a, and the second electrode 105b. The main body 10 includes a first terminal 251 and a second terminal 252.

The first electrode 105a can include a first holding surface HS1 configured to hold a first target 109a as a first member, and the second electrode 105b can include a second holding surface HS2 configured to hold a second target 109b as a second member. The first holding surface HS1 and the second holding surface HS2 can belong to one plane PL.

The plasma processing apparatus 1 according to the eighth embodiment can further include a second balun 303, a third electrode 141, and a fourth electrode 145. In other words, the plasma processing apparatus 1 can include the first balun 103, the second balun 303, the vacuum container 110, the first electrode 105a, the second electrode 105b, the third electrode 141, and the fourth electrode 145. Alternatively, it may be understood that the plasma processing apparatus 1 includes the first balun 103, the second balun 303, and the main body 10, and the main body 10 includes the vacuum container 110, the first electrode 105a, the second electrode 105b, the third electrode 141, and the fourth electrode 145. The main body 10 includes a first terminal 251, a second terminal 252, a third terminal 451, and a fourth terminal 452.

The first balun 103 includes a first unbalanced terminal 201, a second unbalanced terminal 202, a first balanced terminal 211, and a second balanced terminal 212. An unbalanced circuit is connected to the side of the first unbalanced terminal 201 and the second unbalanced terminal 202 of the first balun 103, and a balanced circuit is connected to the side of the first balanced terminal 211 and the second balanced terminal 212 of the first balun 103. The second balun 303 can have an arrangement similar to the first balun 103. The second balun 303 includes a third unbalanced terminal 401, a fourth unbalanced terminal 402, a third balanced terminal 411, and a fourth balanced terminal 412. An unbalanced circuit is connected to the side of the third unbalanced terminal 401 and the fourth unbalanced terminal 402 of the second balun 303, and a balanced circuit is connected to the side of the third balanced terminal 411 and the fourth balanced terminal 412 of the second balun 303. The vacuum container 110 is grounded. The baluns 103 and 303 can have, for example, an arrangement shown in FIGS. 2A and 2B (FIG. 14).

The first electrode 105a holds the first target 109a, and faces the space on the side of the substrate 112 as the processing target via the first target 109a. The second electrode 105b is arranged adjacent to the first electrode 105a, holds the second target 109b, and faces the space on the side of the substrate 112 as the processing target via the second target 109b. The targets 109a and 109b can be, for example, an insulating material or a conductive material. The first electrode 105a is electrically connected to the first balanced terminal 211 of the first balun 103, and the second electrode 105b is electrically connected to the second balanced terminal 212 of the first balun 103.

The third electrode 141 holds the substrate 112. The fourth electrode 145 can be arranged around the third electrode 141. The third electrode 141 is electrically connected to the first balanced terminal 411 of the second balun 303, and the fourth electrode 145 is electrically connected to the second balanced terminal 412 of the second balun 303.

The above-described arrangement can be understood as an arrangement in which the first electrode 105a is electrically connected to the first terminal 251, the second electrode 105b is electrically connected to the second terminal 252, the first terminal 251 is electrically connected to the first balanced terminal 211 of the first balun 103, and the second terminal 252 is electrically connected to the second balanced terminal 212 of the first balun 103. Additionally, the above-described arrangement can be understood as an arrangement in which the third electrode 141 is electrically connected to the third terminal 451, the fourth electrode 145 is electrically connected to the fourth terminal 452, the third terminal 451 is electrically connected to the first balanced terminal 411 of the second balun 303, and the fourth terminal 452 is electrically connected to the second balanced terminal 412 of the second balun 303.

The first electrode 105a and the first balanced terminal 211 (first terminal 251) of the first balun 103 can electrically be connected by a first path PTH1. A variable reactance 511a can be arranged on the first path PTH1. In other words, the first electrode 105a and the first balanced terminal 211 (first terminal 251) of the first balun 103 can electrically be connected via the variable reactance 511a. The variable reactance 511a can include a capacitor. The capacitor can function as a blocking capacitor that blocks a DC current between the first balanced terminal 211 of the first balun 103 and the first electrode 105a (or between the first balanced terminal 211 and the second balanced terminal 212 of the first balun 103). The second electrode 105b and the second balanced terminal 212 (second terminal 252) of the first balun 103 can electrically be connected by a second path PTH2. A variable reactance 511b can be arranged on the second path PTH2. In other words, the second electrode 105b and the second balanced terminal 212 (third terminal 252) of the first balun 103 can electrically be connected via the variable reactance 511b. The variable reactance 511b can include a capacitor. The capacitor can function as a blocking capacitor that blocks a DC current between the second balanced terminal 212 of the first balun 103 and the second electrode 105b (or between the first balanced terminal 211 and the second balanced terminal 212 of the first balun 103). The first electrode 105a and the second electrode 105b can be supported by the vacuum container 110 via insulators 132a and 132b, respectively.

The plasma processing apparatus 1 can include a variable reactance 521a arranged between the first electrode 105a and ground. The plasma processing apparatus 1 can include a variable reactance 521b arranged between the second electrode 105b and ground. The plasma processing apparatus 1 can include a variable reactance 530 that connects the first path PTH1 and the second path PTH2.

In one arrangement example, as an adjustment reactance that affects the relationship between a first voltage applied to the first electrode 105a and a second voltage applied to the second electrode 105b, the plasma processing apparatus 1 includes at least one of (a) the variable reactance 511a arranged on the first path PTH1 that connects the first balanced terminal 211 and the first electrode 105a, (b) the variable reactance 521a arranged between the first electrode 105a and ground, (c) the variable reactance 511b arranged on the second path PTH2 that connects the second balanced terminal 212 and the second electrode 105b, (d) the variable reactance 521b arranged between the second electrode 105b and ground, and (e) the variable reactance 530 that connects the first path PTH1 and the second path PTH2.

By adjusting the value of the adjustment reactance that affects the relationship between the first voltage applied to the first electrode 105a and the second voltage applied to the second electrode 105b, the relationship between the amount of sputtering of the first target 109a and the amount of sputtering of the second target 109b can be adjusted. Alternatively, by adjusting the value of the adjustment reactance, the balance between the amount of sputtering of the first target 109a and the amount of sputtering of the second target 109b can be adjusted. This can adjust the relationship between the consumption amount of the first target 109a and the consumption amount of the second target 109b. Alternatively, this can adjust the balance between the consumption amount of the first target 109a and the consumption amount of the second target 109b. This arrangement is advantageous in, for example, setting the exchange timing of the first target 109a and the exchange timing of the second target 109b to the same timing and reducing the downtime of the plasma processing apparatus 1. It is also possible to adjust the thickness distribution of a film formed on the substrate 112.

The third electrode 141 and the first balanced terminal 411 (third terminal 451) of the second balun 303 can electrically be connected via a blocking capacitor 304. The blocking capacitor 304 blocks a DC current between the first balanced terminal 411 of the second balun 303 and the third electrode 141 (or between the first balanced terminal 411 and the second balanced terminal 412 of the second balun 303). Instead of providing the blocking capacitor 304, a second impedance matching circuit 302 may be configured to block a DC current flowing between the first unbalanced terminal 401 and the second unbalanced terminal 402 of the second balun 303. The third electrode 141 and the fourth electrode 145 can be supported by the vacuum container 110 via insulators 142 and 146, respectively.

The plasma processing apparatus 1 can include a first high-frequency power supply 101, and a first impedance matching circuit 102 arranged between the first high-frequency power supply 101 and the first balun 103. The first high-frequency power supply 101 supplies a high frequency between the first electrode 105a and the second electrode 105b via the first impedance matching circuit 102, the first balun 103, and the first path PTH1. Alternatively, the first high-frequency power supply 101 supplies a high frequency between the first terminal 251 and the second terminal 252 of the main body 10 via the first impedance matching circuit 102 and the first balun 103. The first balun 103, the first electrode 105a, and the second electrode 105b form a first high-frequency supply unit configured to supply a high frequency to the internal space of the vacuum container 110.

The plasma processing apparatus 1 can include a second high-frequency power supply 301, and a second impedance matching circuit 302 arranged between the second high-frequency power supply 301 and the second balun 303. The second high-frequency power supply 301 supplies a high frequency between the first unbalanced terminal 401 and the second unbalanced terminal 402 of the second balun 303 via the second impedance matching circuit 302. The second high-frequency power supply 301 supplies a high frequency between the third electrode 141 and the fourth electrode 145 via the second impedance matching circuit 302, the second balun 303, and the blocking capacitor 304. Alternatively, the second high-frequency power supply 301 supplies a high frequency between the third terminal 451 and the fourth terminal 452 of the main body 10 via the second impedance matching circuit 302 and the second balun 303. The second balun 303, the third electrode 141, and the fourth electrode 145 form a second high-frequency supply unit configured to supply a high frequency to the internal space of the vacuum container 110.

Let $Rp1-jXp1$ be an impedance when the side of the first electrode 105a and the second electrode 105b (the side of the main body 10) is viewed from the side of the first balanced terminal 211 and the second balanced terminal 212 of the first balun 103 in a state in which plasma is generated in the internal space of the vacuum container 110 by supply of a high frequency from the first high-frequency power supply 101. In addition, let X1 be the reactance component (inductance component) of the impedance of a first coil 221 of the first balun 103. In this definition, satisfying $1.5 \leq X1/Rp1 \leq 5000$ is advantageous in stabilizing the potential of plasma formed in the internal space of the vacuum container 110. However, note that satisfying the condition $1.5 \leq X1/Rp1 \leq 5000$ is not indispensable but an advantageous condition in the eighth embodiment. In the eighth embodiment, the balun 103 is provided, thereby making the potential of plasma stable as compared to a case in which the balun 103 is not provided. Additionally, the adjustment reactance is provided, thereby adjusting the relationship between the amount of sputtering of the first target 109a and the amount of sputtering of the second target 109b.

Additionally, let $Rp2-jXp2$ be an impedance when the side of the third electrode 141 and the fourth electrode 145 (the side of the main body 10) is viewed from the side of the first balanced terminal 411 and the second balanced terminal 412 of the second balun 303 in a state in which plasma is generated in the internal space of the vacuum container 110 by supply of a high frequency from the second high-frequency power supply 301. In addition, let X2 be the reactance component (inductance component) of the impedance of the first coil 221 of the second balun 303. In this definition, satisfying $1.5 \leq X2/Rp2 \leq 5000$ is advantageous in stabilizing the potential of plasma formed in the internal space of the vacuum container 110. However, note that satisfying the condition $1.5 \leq X/Rp2 \leq 5000$ is not indispensable but an advantageous condition in the eighth embodiment.

Figure 18:
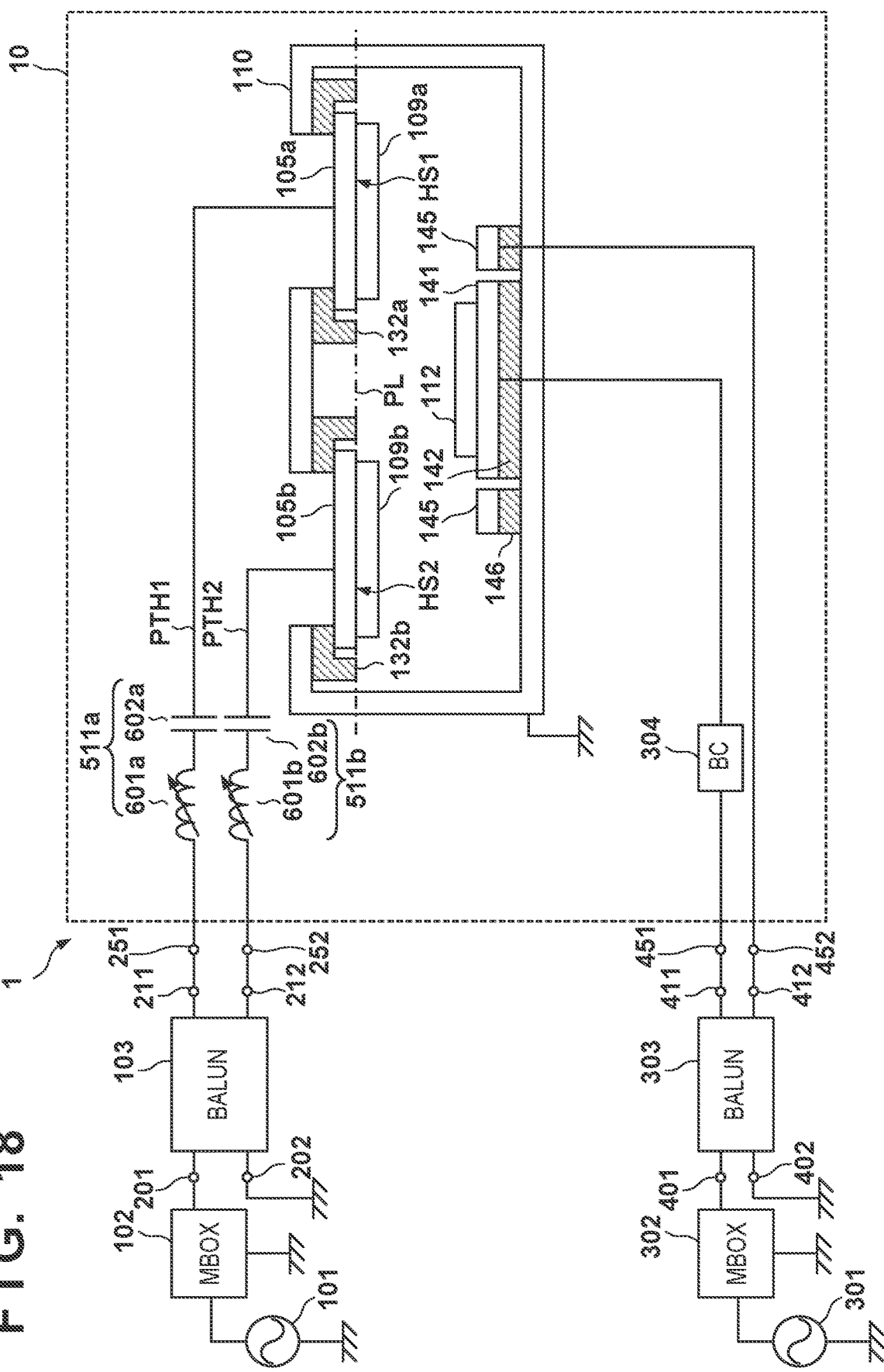
FIG. 18 is a view schematically showing the arrangement of a plasma processing apparatus 1 according to the ninth embodiment of the present invention.

The ninth to 14th embodiments that embody the plasma processing apparatus 1 according to the eighth embodiment will be described below with reference to FIGS. 18 to 25. FIG. 18 schematically shows the arrangement of a plasma processing apparatus 1 according to the ninth embodiment of the present invention. Matters that are not mentioned as the ninth embodiment can comply with the eighth embodiment. The plasma processing apparatus 1 according to the ninth embodiment includes at least one of a variable reactance 511a arranged on a first path PTH1, and a variable reactance 511b arranged on a second path PTH2. Here, the plasma processing apparatus 1 preferably includes both the variable reactance 511a arranged on the first path PTH1 and the variable reactance 511b arranged on the second path PTH2, and one of these may be a reactance with a fixed value.

The first variable reactance 511a includes at least a variable inductor 601a, and preferably includes the variable inductor 601a and a capacitor 602a. The variable inductor 601a may be arranged between a first balanced terminal 211 (first terminal 251) and the capacitor 602a, or may be arranged between the capacitor 602a and a first electrode 105a. The second variable reactance 511b includes at least a variable inductor 601b, and preferably includes the variable inductor 601b and a capacitor 602b. The variable inductor 601b may be arranged between a second balanced terminal 212 (second terminal 252) and the capacitor 602b, or may be arranged between the capacitor 602b and a second electrode 105b.

Figure 24:
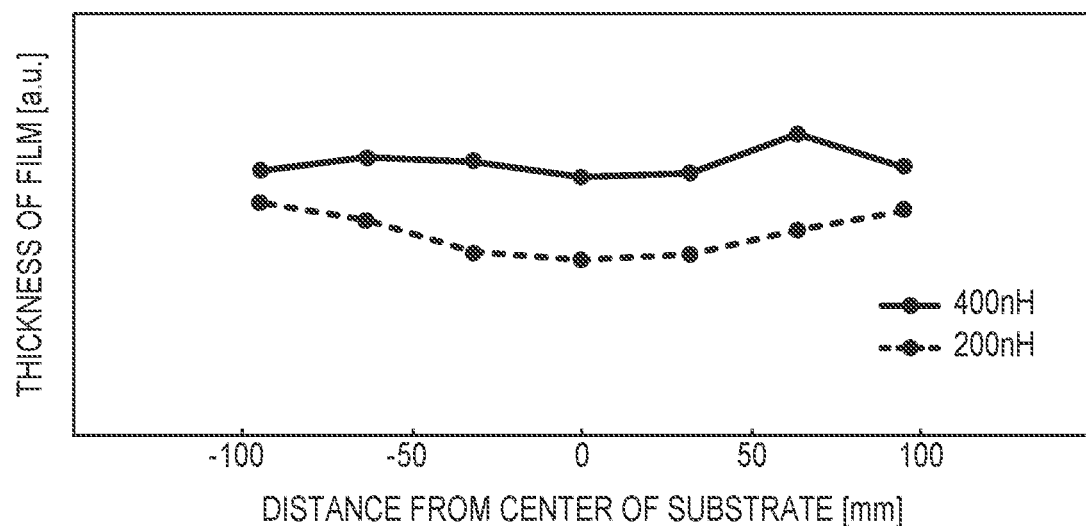
FIG. 24 is a view for explaining the function of the plasma processing apparatus 1 according to the ninth embodiment of the present invention.

FIG. 24 shows the thickness distribution of a film formed on a substrate 112 when the value of the variable inductor 601a on the first path PTH1 and the variable inductor 601b on the second path PTH2 is set to 200 nH in the plasma processing apparatus 1 according to the ninth embodiment. FIG. 24 also shows the thickness distribution of a film formed on the substrate 112 when the value of the variable inductor 601a on the first path PTH1 and the variable inductor 601b on the second path PTH2 is set to 400 nH in the plasma processing apparatus 1 according to the ninth embodiment. The abscissa represents a position in the horizontal direction (the direction parallel to the surface of the substrate 112) in FIG. 18, and represents the distance from the center of the substrate 112. If the value of the variable inductors 601a and 601b is 400 nH, the thickness distribution of the film is largely different between the left side and the right side of the center of the substrate 112. On the other hand, if the value of the variable inductors 601a and 601b is 200 nH, the thickness distribution of the film has high symmetry on the left side and the right side of the center of the substrate 112. A first voltage applied to the first electrode 105a and a second voltage applied to the second electrode 105b are in good balance more in the case in which the value of the variable inductors 601a and 601b is 200 nH than in the case in which the value of the variable inductors 601a and 601b is 400 nH.

Figure 25:
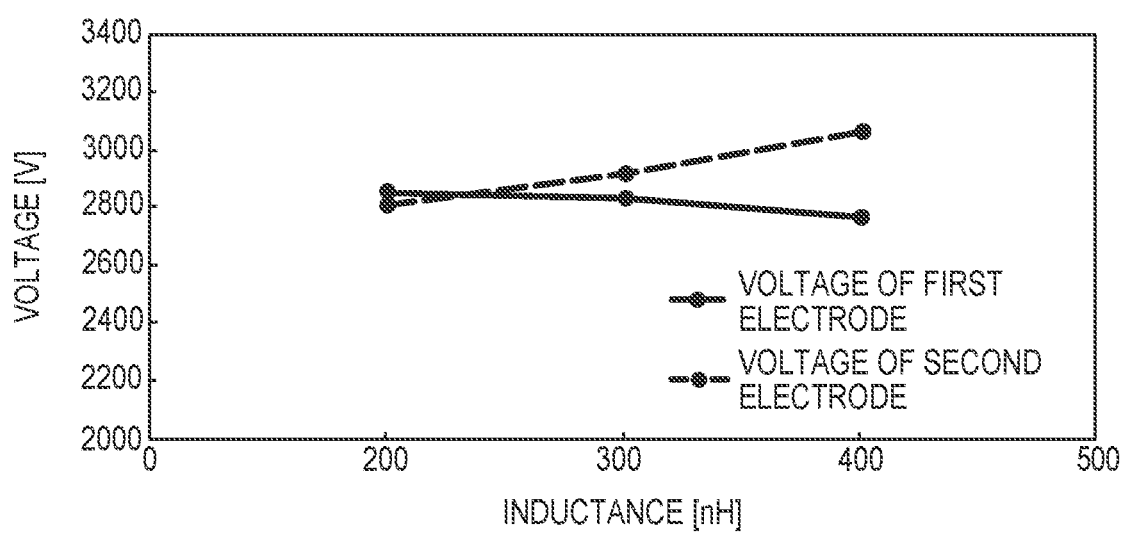
FIG. 25 is a view for explaining the function of the plasma processing apparatus 1 according to the ninth embodiment of the present invention.

FIG. 25 shows the voltages of the first electrode 105a and the second electrode 105b when the value of the variable inductor 601a on the first path PTH1 and the variable inductor 601b on the first path PTH1 is changed in the plasma processing apparatus 1 according to the ninth embodiment. If the value of the variable inductors 601a and 601b is about 225 nH, the voltage applied to the first electrode 105a and the voltage applied to the second electrode 105b almost equal.

Figure 19:
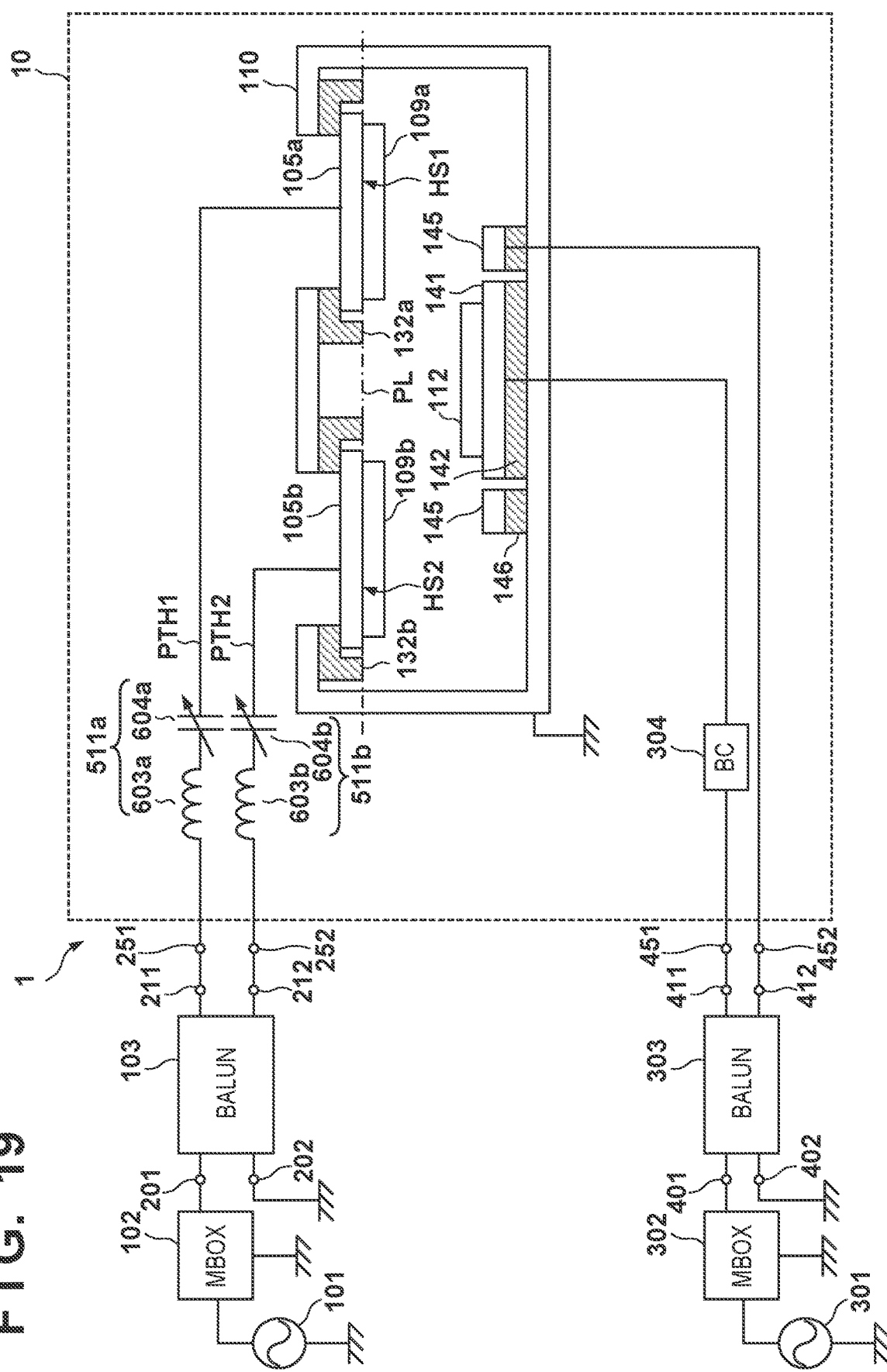
FIG. 19 is a view schematically showing the arrangement of a plasma processing apparatus 1 according to the 10th embodiment of the present invention.

FIG. 19 schematically shows the arrangement of a plasma processing apparatus 1 according to the 10th embodiment of the present invention. Matters that are not mentioned as the 10th embodiment can comply with the eighth embodiment. The plasma processing apparatus 1 according to the 10th embodiment includes at least one of a variable reactance 511a arranged on a first path PTH1, and a variable reactance 511b arranged on a second path PTH2. Here, the plasma processing apparatus 1 preferably includes both the variable reactance 511a arranged on the first path PTH1 and the variable reactance 511b arranged on the second path PTH2, and one of these may be a reactance with a fixed value.

The first variable reactance 511a includes at least a variable capacitor 604a, and preferably includes the variable capacitor 604a and an inductor 603a. The variable capacitor 604a may be arranged between the inductor 603a and a first electrode 105a, or may be arranged between a first balanced terminal 211 (first terminal 251) and the inductor 603a. The second variable reactance 511b includes at least a variable capacitor 604b, and preferably includes the variable capacitor 604b and an inductor 603b. The variable capacitor 604b may be arranged between the inductor 603b and a second electrode 105b, or may be arranged between a second balanced terminal 212 (second terminal 252) and the inductor 603b.

Figure 20:
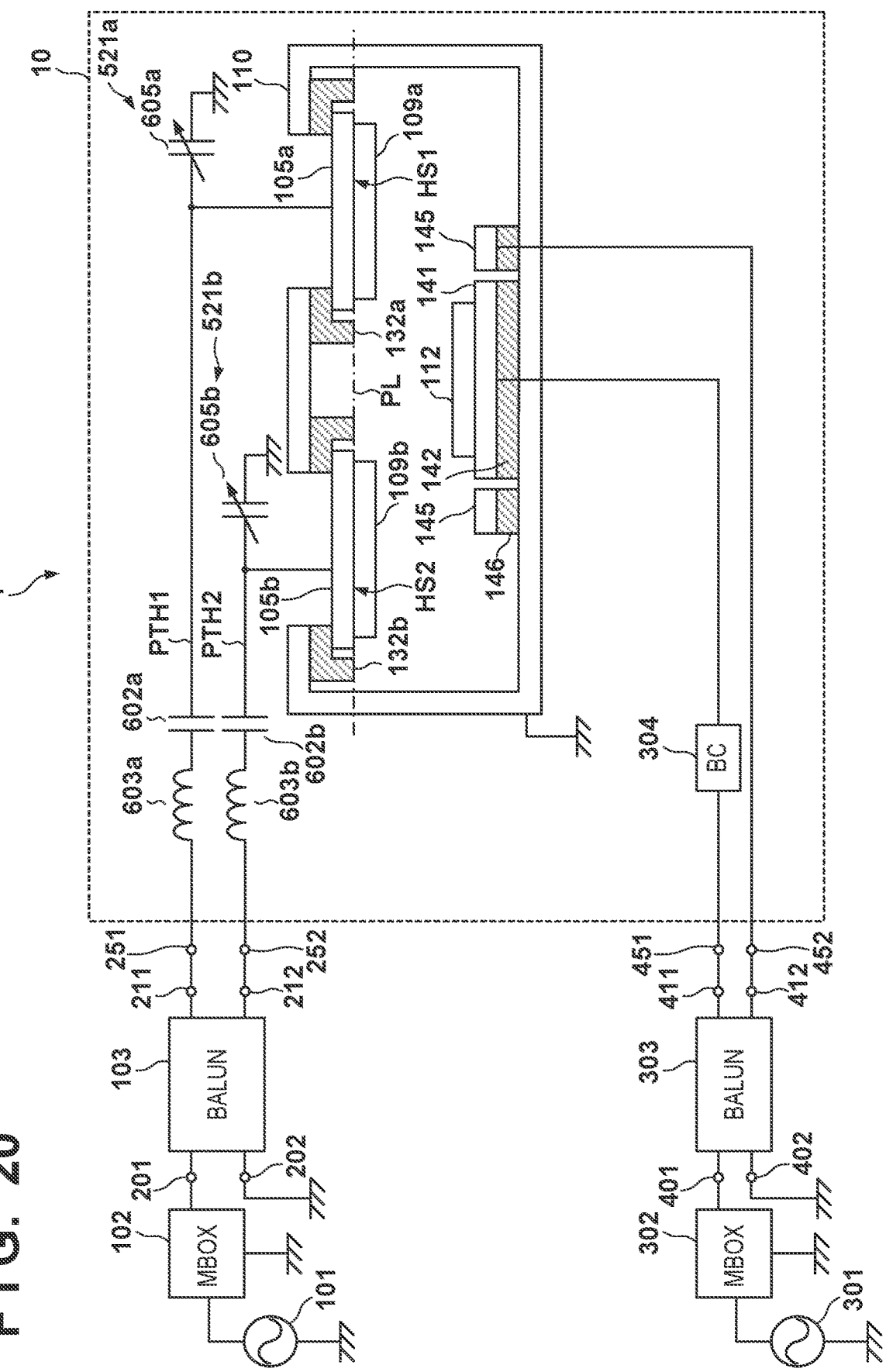
FIG. 20 is a view schematically showing the arrangement of a plasma processing apparatus 1 according to the 11th embodiment of the present invention.

FIG. 20 schematically shows the arrangement of a plasma processing apparatus 1 according to the 11th embodiment of the present invention. Matters that are not mentioned as the 11th embodiment can comply with the eighth embodiment. The plasma processing apparatus 1 according to the 11th embodiment includes at least one of a variable capacitor 605a serving as a variable reactance 521a arranged between a first electrode 105a and ground, and a variable capacitor 605b serving as a variable reactance 521b arranged between a second electrode 105b and ground. The plasma processing apparatus 1 can further include a reactance (in this example, an inductor 603a and a capacitor 602a) arranged on a first path PTH1, and a reactance (in this example, an inductor 603b and a capacitor 602b) arranged on a second path PTH2.

Figure 21:
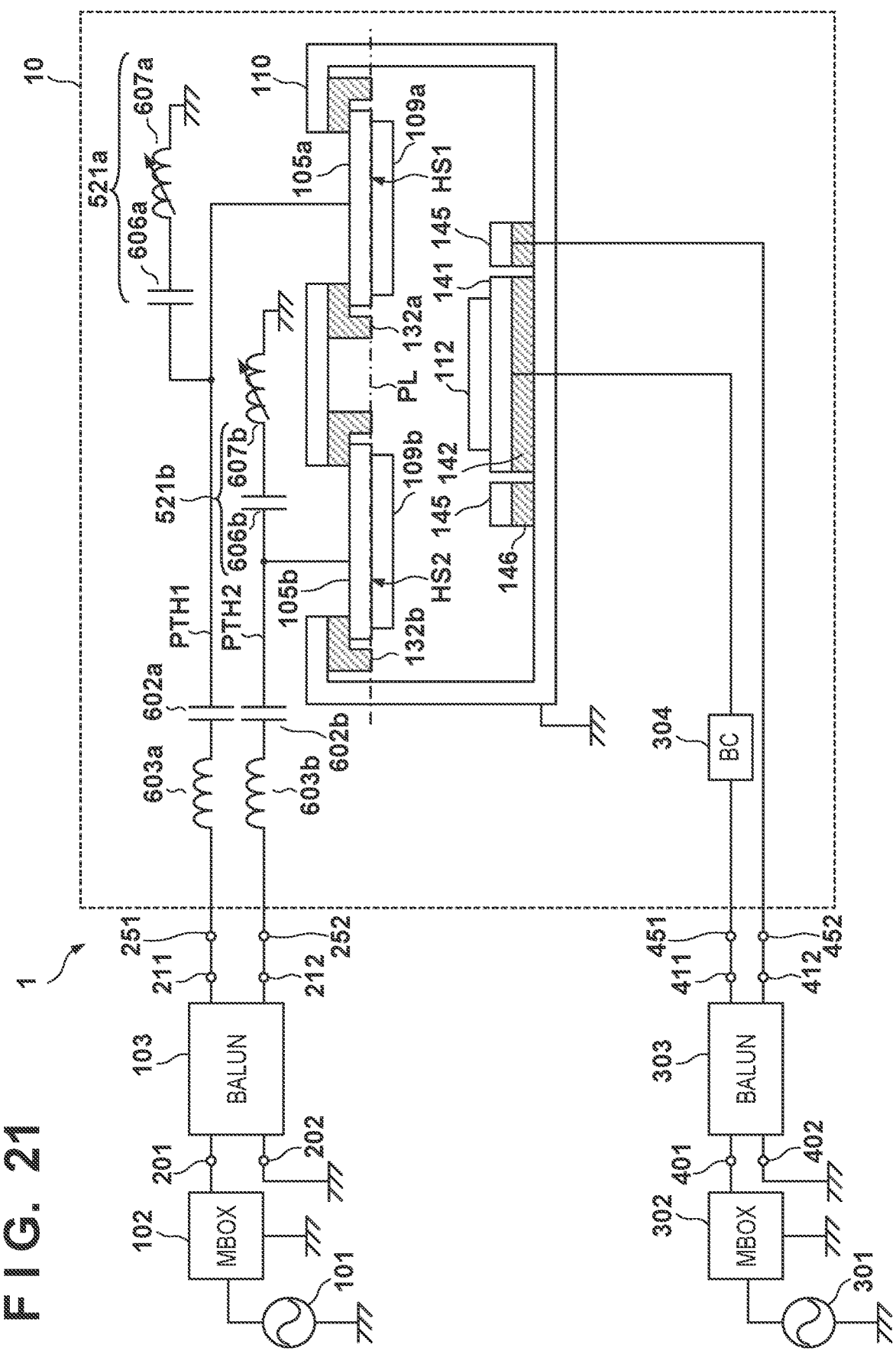
FIG. 21 is a view schematically showing the arrangement of a plasma processing apparatus 1 according to the 12th embodiment of the present invention.

FIG. 21 schematically shows the arrangement of a plasma processing apparatus 1 according to the 12th embodiment of the present invention. Matters that are not mentioned as the 12th embodiment can comply with the eighth embodiment. The plasma processing apparatus 1 according to the 12th embodiment includes at least one of a variable reactance 521a arranged between a first electrode 105a and ground, and a variable reactance 521b arranged between a second electrode 105b and ground. The variable reactance 521a includes at least a variable inductor 607a, and can include, for example, the variable inductor 607a and a capacitor 606a. The variable reactance 521b includes at least a variable inductor 607b, and can include, for example, the variable inductor 607b and a capacitor 606b.

The plasma processing apparatus 1 can further include a reactance (in this example, an inductor 603a and a capacitor 602a) arranged on a first path PTH1, and a reactance (in this example, an inductor 603b and a capacitor 602b) arranged on a second path PTH2.

Figure 22:
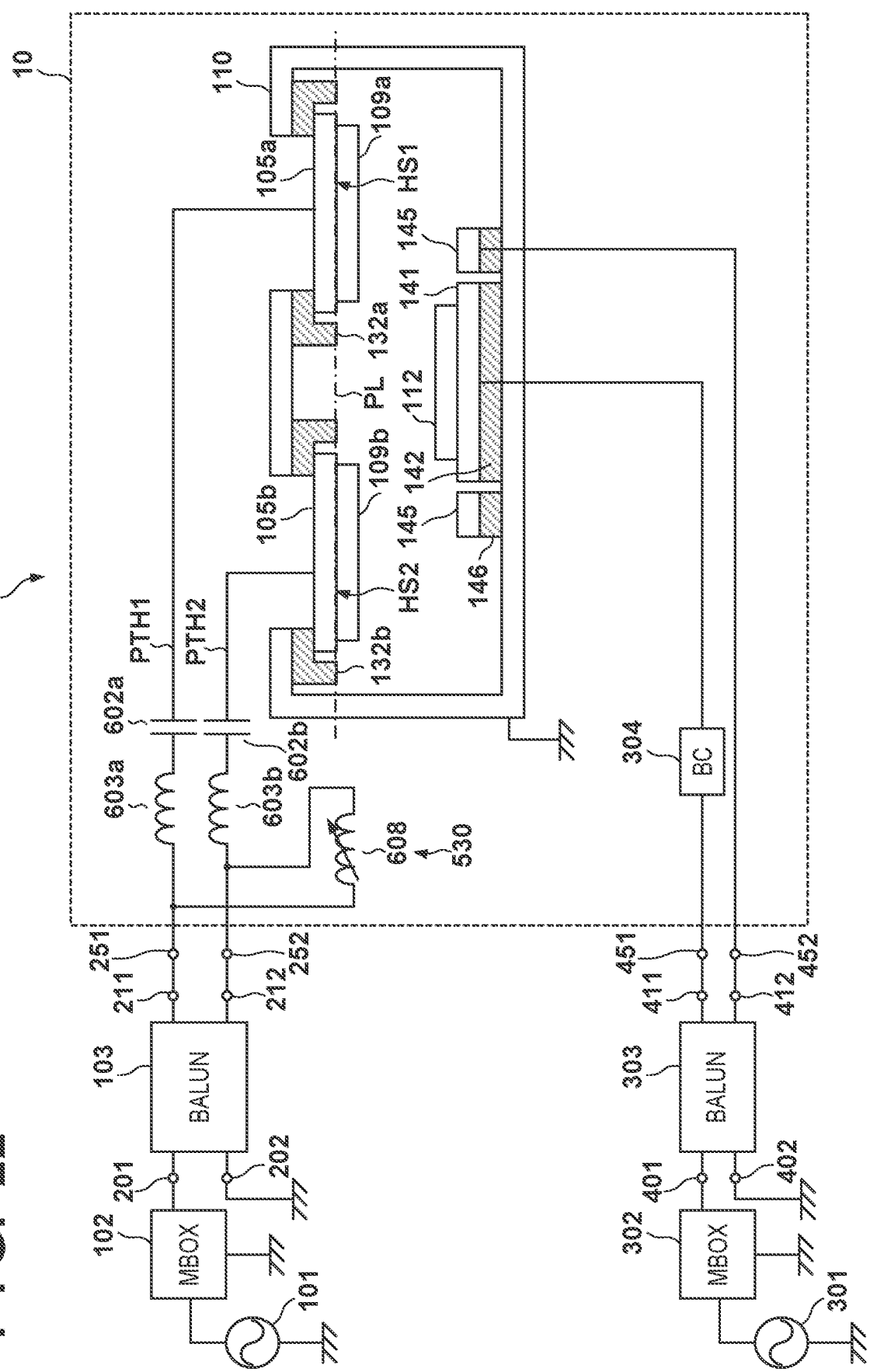
FIG. 22 is a view schematically showing the arrangement of a plasma processing apparatus 1 according to the 13th embodiment of the present invention.

FIG. 22 schematically shows the arrangement of a plasma processing apparatus 1 according to the 13th embodiment of the present invention. Matters that are not mentioned as the 13th embodiment can comply with the eighth embodiment. The plasma processing apparatus 1 according to the 13th embodiment includes a variable inductor 608 serving as a variable reactance 530 that connects a first path PTH1 and a second path PTH2. The plasma processing apparatus 1 can further include a reactance (in this example, an inductor 603a and a capacitor 602a) arranged on the first path PTH1, and a reactance (in this example, an inductor 603b and a capacitor 602b) arranged on the second path PTH2.

Figure 23:
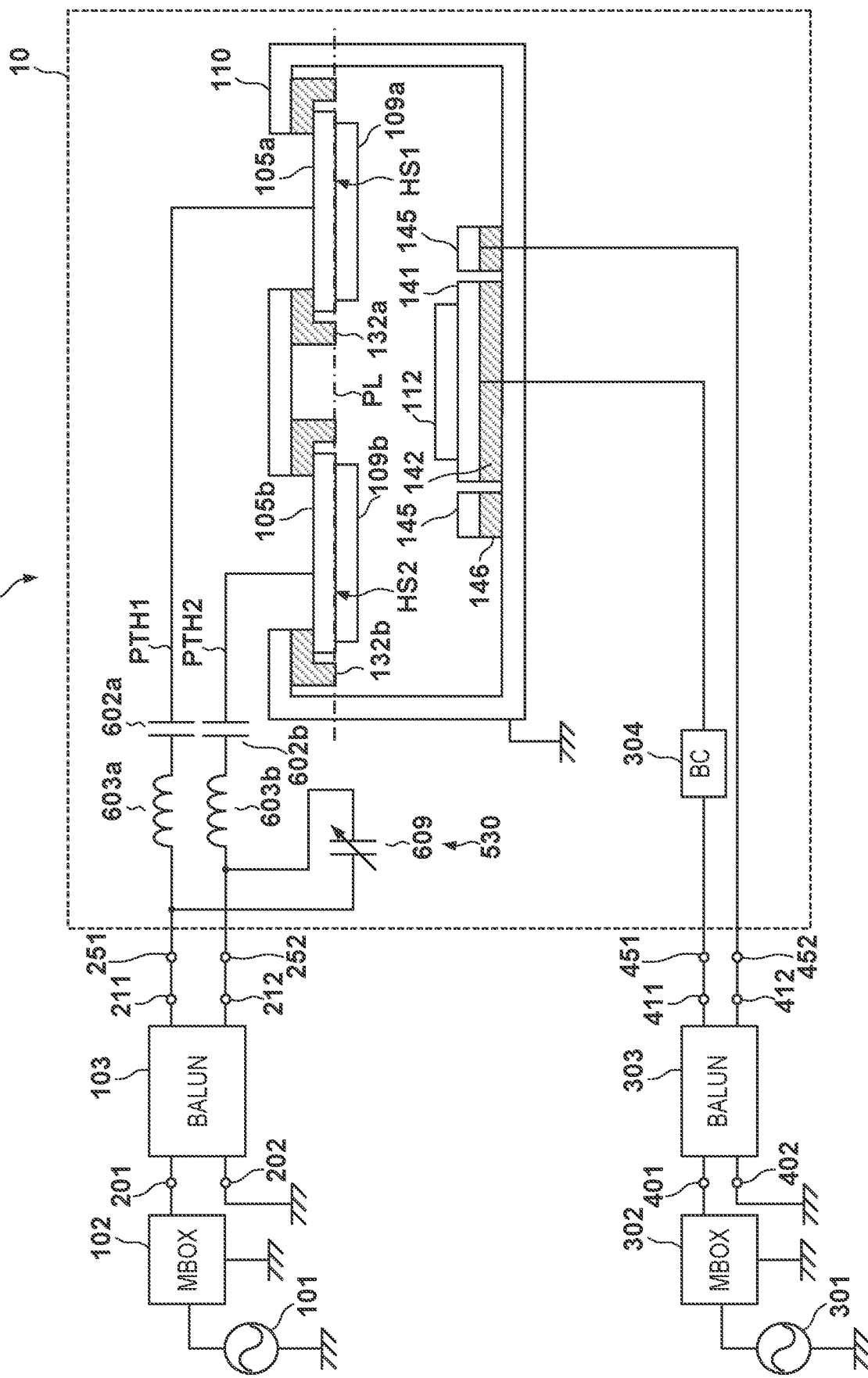
FIG. 23 is a view schematically showing the arrangement of a plasma processing apparatus 1 according to the 14th embodiment of the present invention.

FIG. 23 schematically shows the arrangement of a plasma processing apparatus 1 according to the 14th embodiment of the present invention. Matters that are not mentioned as the 14th embodiment can comply with the eighth embodiment. The plasma processing apparatus 1 according to the 14th embodiment includes a variable capacitor 609 serving as a variable reactance 530 that connects a first path PTH1 and a second path PTH2. The plasma processing apparatus 1 can further include a reactance (in this example, an inductor 603a and a capacitor 602a) arranged on the first path PTH1, and a reactance (in this example, an inductor 603b and a capacitor 602b) arranged on the second path PTH2.

Note that in the ninth to 14th embodiments described with reference to FIGS. 18 to 25, electrodes are arranged on the facing surfaces of targets 109a and 109b. However, these are not limited to the electrodes. A cylindrical substrate rotation holder in a plasma apparatus of a so-called carousel type (for example, Japanese Patent Laid-Open Nos. 2003-155556 and 62-133065) or a rectangular substrate tray in a plasma apparatus of a so-called inline type (for example, Japanese Patent No. 5824072 and Japanese Patent Laid-Open No. 2011-144450) may be arranged.

Figure 26:
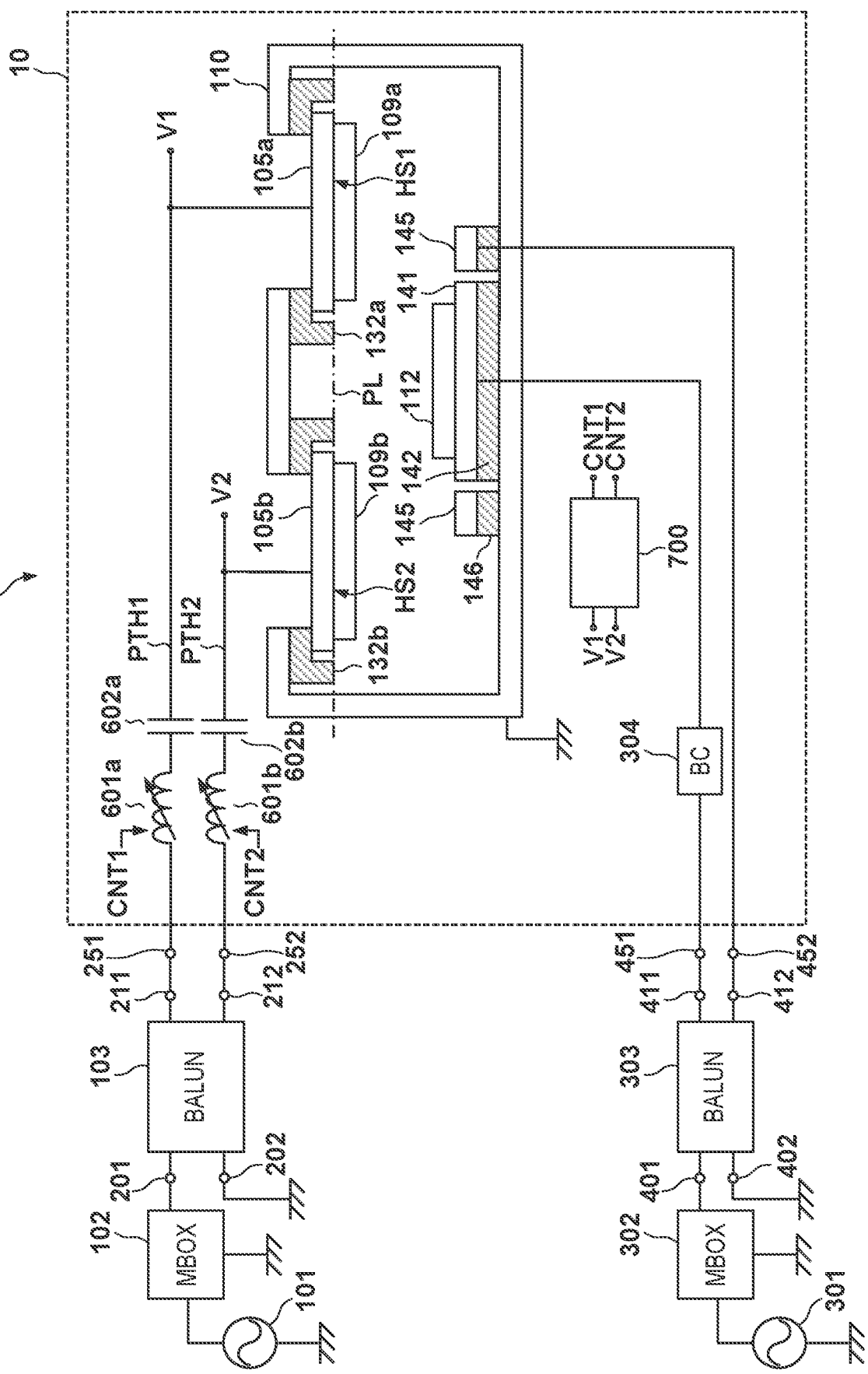
FIG. 26 is a view schematically showing the arrangement of a plasma processing apparatus 1 according to the 15th embodiment of the present invention.

An operation of adjusting the value of an adjustment reactance based on a first voltage V1 of a first electrode 105a and a second voltage V2 of a second electrode 105b will be described below with reference to FIGS. 26 to 31. FIG. 26 schematically shows the arrangement of a plasma processing apparatus 1 according to the 15th embodiment of the present invention. The plasma processing apparatus 1 according to the 15th embodiment has an arrangement in which a controller 700 is added to the plasma processing apparatus according to the ninth embodiment shown in FIG. 18. The controller 700 adjusts the value of an adjustment reactance based on a first voltage V1 of a first electrode 105a and a second voltage V2 of a second electrode 105b such that, for example, the first voltage V1 and the second voltage V2 become equal. For example, based on the first voltage V1 of the first electrode 105a and the second voltage V2 of the second electrode 105b, the controller 700 generates a first instruction value CNT1 and a second instruction value CNT2, which adjust the values of variable inductors 601a and 601b each serving as an adjustment reactance, respectively. The first instruction value CNT1 and the second instruction value CNT2 are supplied to the variable inductors 601a and 601b, respectively. The variable inductors 601a and 601b change the inductances of their own in accordance with the first instruction value CNT1 and the second instruction value CNT2, respectively.

Figure 27:
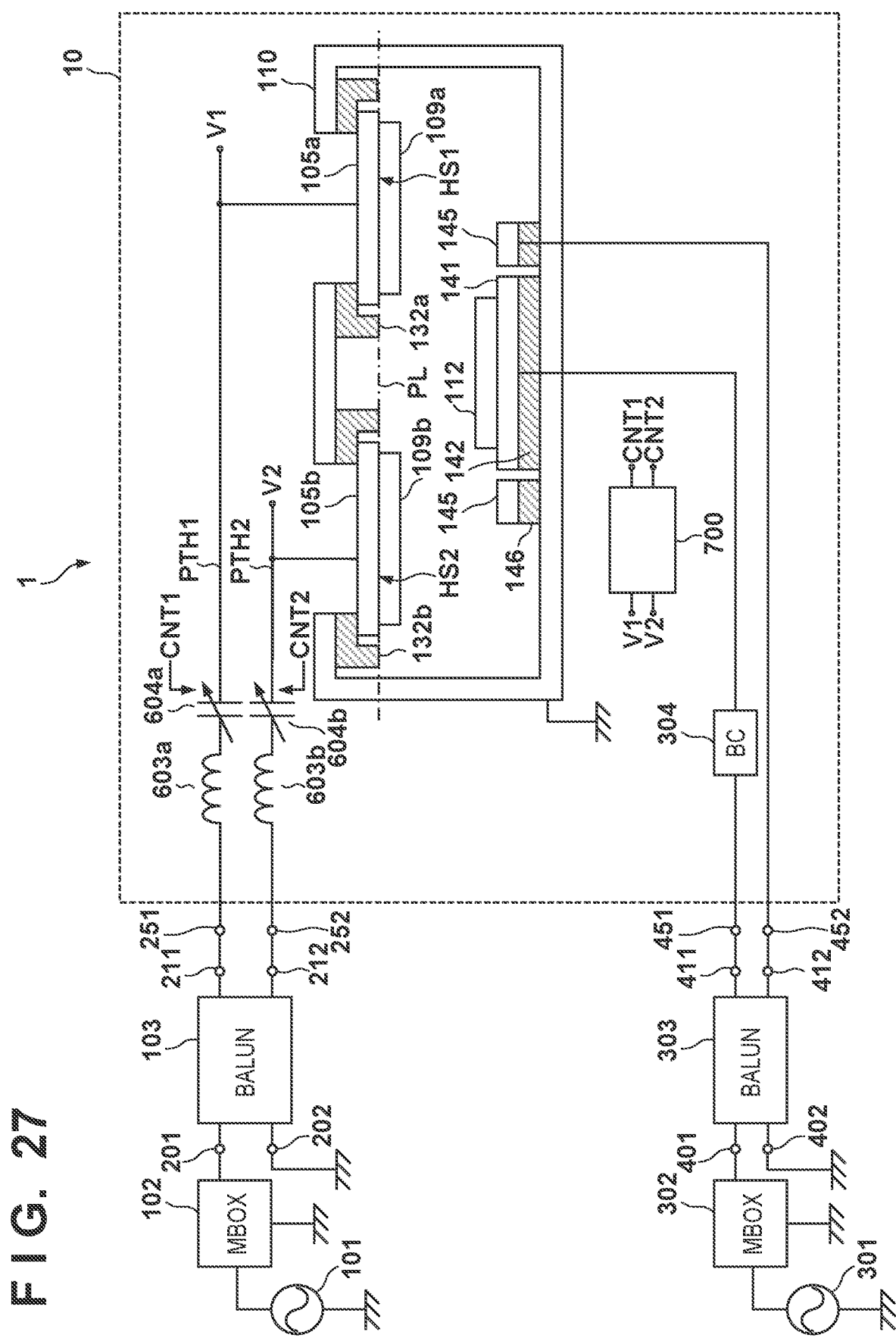
FIG. 27 is a view schematically showing the arrangement of a plasma processing apparatus 1 according to the 16th embodiment of the present invention.

FIG. 27 schematically shows the arrangement of a plasma processing apparatus 1 according to the 16th embodiment of the present invention. The plasma processing apparatus 1 according to the 16th embodiment has an arrangement in which a controller 700 is added to the plasma processing apparatus according to the 10th embodiment shown in FIG. 19. The controller 700 adjusts the value of an adjustment reactance based on a first voltage V1 of a first electrode 105*a* and a second voltage V2 of a second electrode 105*b* such that, for example, the first voltage V1 and the second voltage V2 become equal. For example, based on the first voltage V1 of the first electrode 105*a* and the second voltage V2 of the second electrode 105*b*, the controller 700 generates a first instruction value CNT1 and a second instruction value CNT2, which adjust the values of variable capacitors 604*a* and 604*b* each serving as an adjustment reactance, respectively. The first instruction value CNT1 and the second instruction value CNT2 are supplied to the variable capacitors 604*a* and 604*b*, respectively. The variable capacitors 604*a* and 604*b* change the capacitances of their own in accordance with the first instruction value CNT1 and the second instruction value CNT2, respectively.

Figure 28:
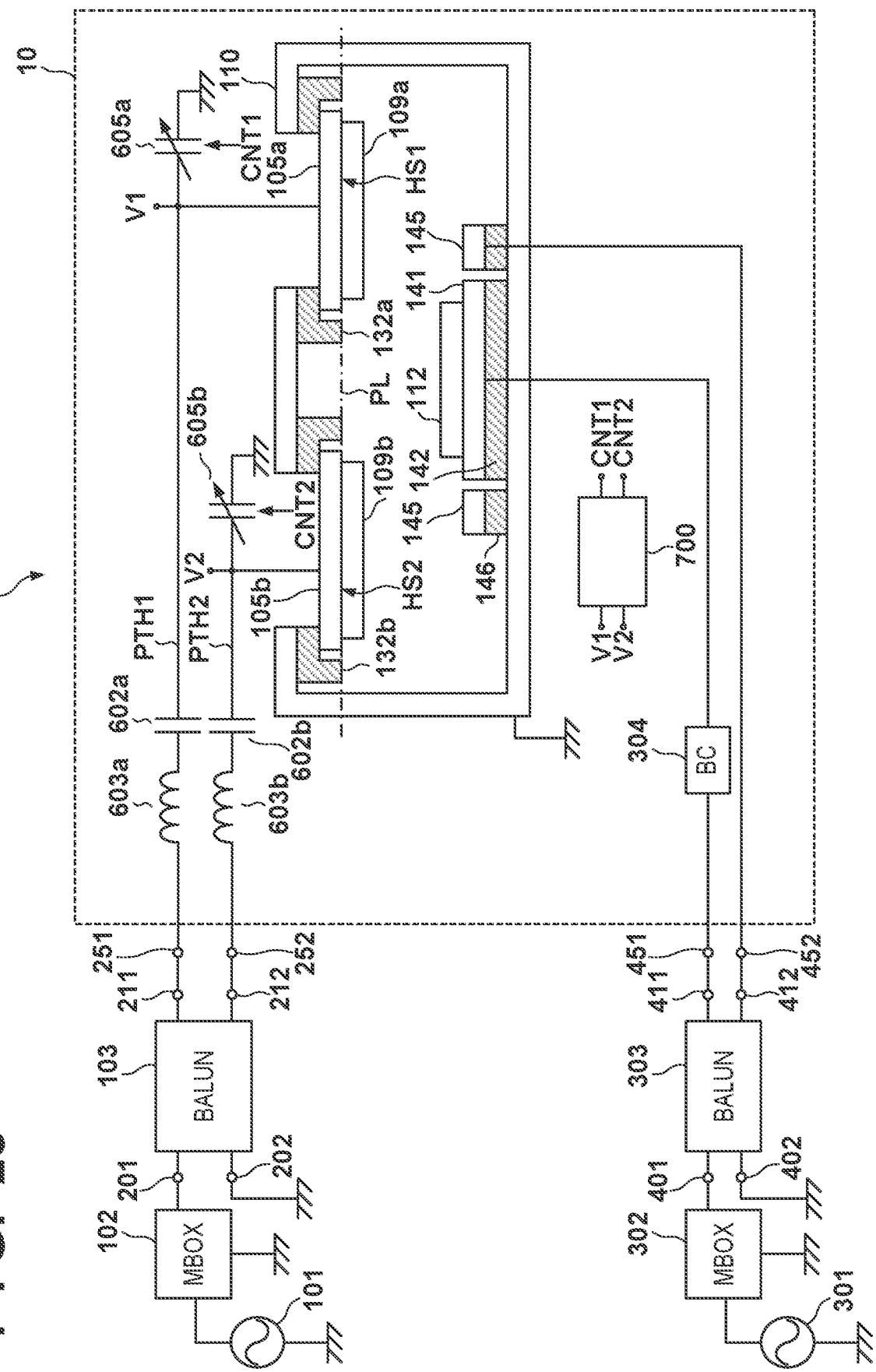
FIG. 28 is a view schematically showing the arrangement of a plasma processing apparatus 1 according to the 17th embodiment of the present invention.

FIG. 28 schematically shows the arrangement of a plasma processing apparatus 1 according to the 17th embodiment of the present invention. The plasma processing apparatus 1 according to the 17th embodiment has an arrangement in which a controller 700 is added to the plasma processing apparatus according to the 11th embodiment shown in FIG. 20. The controller 700 adjusts the value of an adjustment reactance based on a first voltage V1 of a first electrode 105*a* and a second voltage V2 of a second electrode 105*b* such that, for example, the first voltage V1 and the second voltage V2 become equal. For example, based on the first voltage V1 of the first electrode 105*a* and the second voltage V2 of the second electrode 105*b*, the controller 700 generates a first instruction value CNT1 and a second instruction value CNT2, which adjust the values of variable capacitors 605*a* and 605*b* each serving as an adjustment reactance, respectively. The first instruction value CNT1 and the second instruction value CNT2 are supplied to the variable capacitors 605*a* and 605*b*, respectively. The variable capacitors 605*a* and 605*b* change the capacitances of their own in accordance with the first instruction value CNT1 and the second instruction value CNT2, respectively.

Figure 29:
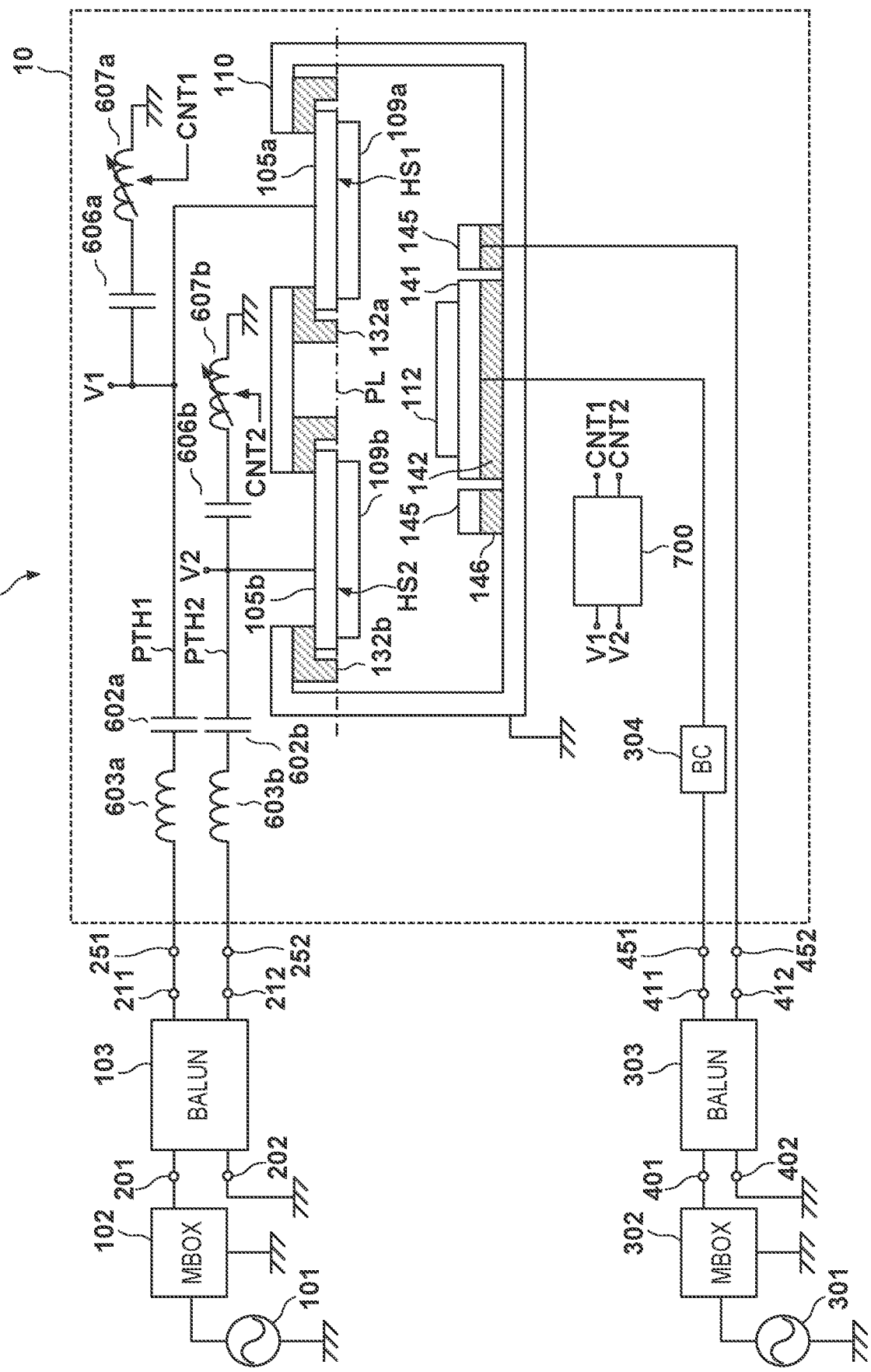
FIG. 29 is a view schematically showing the arrangement of a plasma processing apparatus 1 according to the 18th embodiment of the present invention.

FIG. 29 schematically shows the arrangement of a plasma processing apparatus 1 according to the 18th embodiment of the present invention. The plasma processing apparatus 1 according to the 18th embodiment has an arrangement in which a controller 700 is added to the plasma processing apparatus according to the 12th embodiment shown in FIG. 21. The controller 700 adjusts the value of an adjustment reactance based on a first voltage V1 of a first electrode 105*a* and a second voltage V2 of a second electrode 105*b* such that, for example, the first voltage V1 and the second voltage V2 become equal. For example, based on the first voltage V1 of the first electrode 105*a* and the second voltage V2 of the second electrode 105*b*, the controller 700 generates a first instruction value CNT1 and a second instruction value CNT2 which adjust the values of variable inductors 607*a* and 607*b* each serving as an adjustment reactance, respectively. The first instruction value CNT1 and the second instruction value CNT2 are supplied to the variable inductors 607*a* and 607*b*, respectively. The variable inductors 607*a* and 607*b* change the inductances of their own in accordance with the first instruction value CNT1 and the second instruction value CNT2, respectively.

Figure 30:
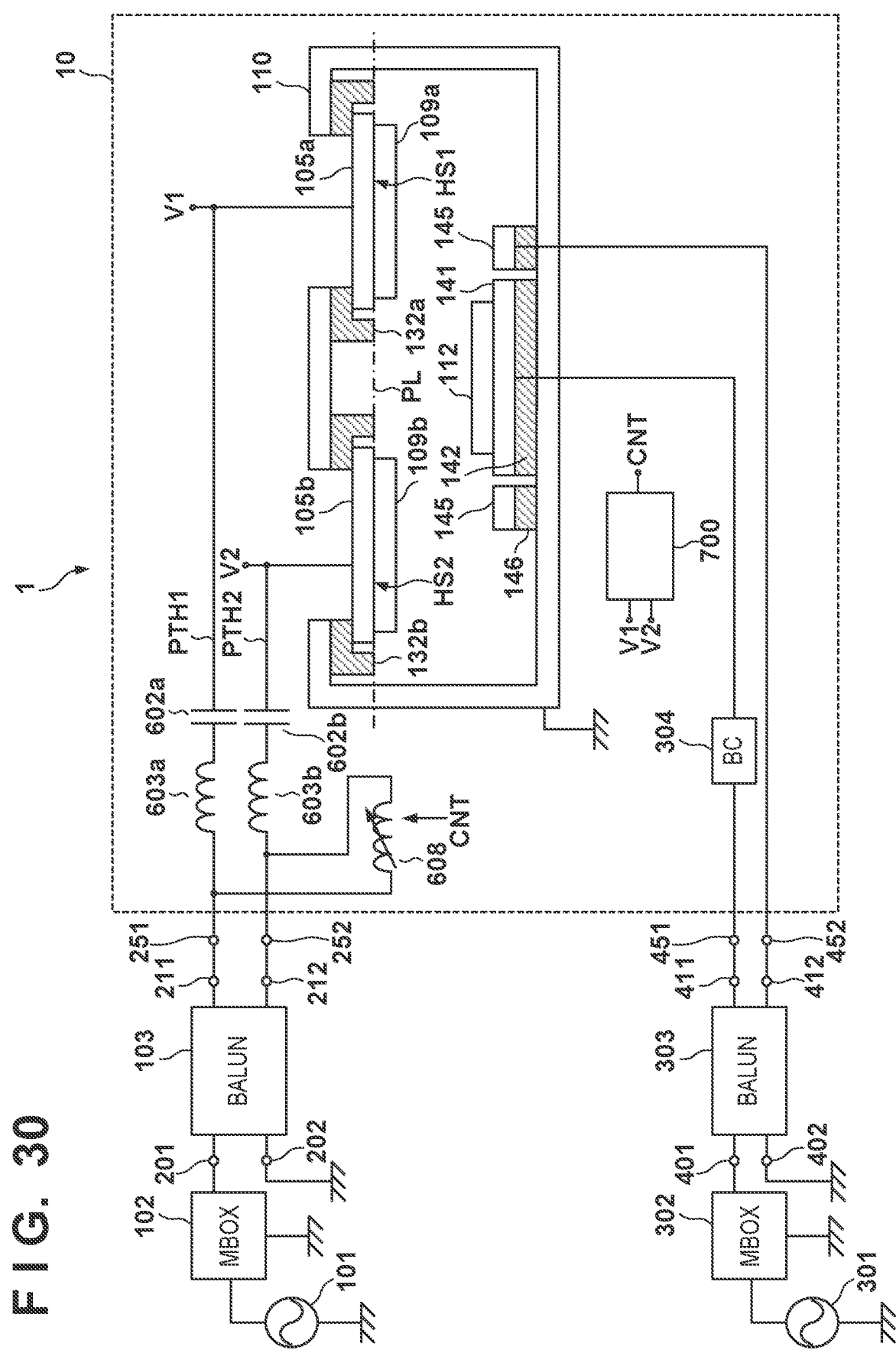
FIG. 30 is a view schematically showing the arrangement of a plasma processing apparatus 1 according to the 19th embodiment of the present invention.

FIG. 30 schematically shows the arrangement of a plasma processing apparatus 1 according to the 19th embodiment of the present invention. The plasma processing apparatus 1 according to the 19th embodiment has an arrangement in which a controller 700 is added to the plasma processing apparatus according to the 13th embodiment shown in FIG. 22. The controller 700 adjusts the value of an adjustment reactance based on a first voltage V1 of a first electrode 105*a* and a second voltage V2 of a second electrode 105*b* such that, for example, the first voltage V1 and the second voltage V2 become equal. For example, based on the first voltage V1 of the first electrode 105*a* and the second voltage V2 of the second electrode 105*b*, the controller 700 generates an instruction value CNT that adjusts the value of a variable inductor 608 serving as an adjustment reactance. The instruction value CNT is supplied to the variable inductor 608. The variable inductor 608 changes the inductance of its own in accordance with the instruction value.

Figure 31:
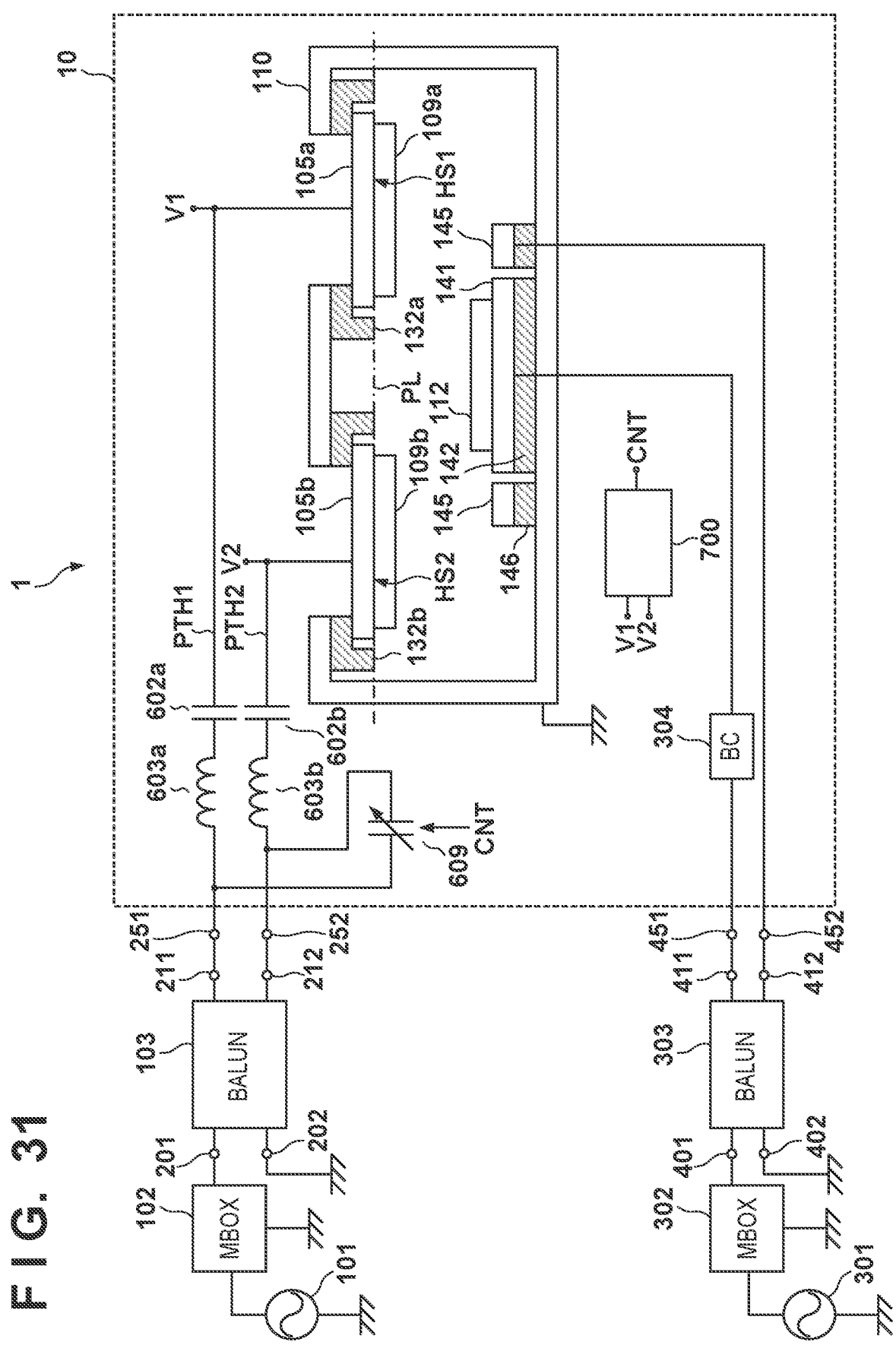
FIG. 31 is a view schematically showing the arrangement of a plasma processing apparatus 1 according to the 20th embodiment of the present invention.

FIG. 31 schematically shows the arrangement of a plasma processing apparatus 1 according to the 20th embodiment of the present invention. The plasma processing apparatus 1 according to the 20th embodiment has an arrangement in which a controller 700 is added to the plasma processing apparatus according to the 14th embodiment shown in FIG. 23. The controller 700 adjusts the value of an adjustment reactance based on a first voltage V1 of a first electrode 105*a* and a second voltage V2 of a second electrode 105*b* such that, for example, the first voltage V1 and the second voltage V2 become equal. For example, based on the first voltage V1 of the first electrode 105*a* and the second voltage V2 of the second electrode 105*b*, the controller 700 generates an instruction value CNT that adjusts the value of a variable capacitor 609 serving as an adjustment reactance. The instruction value CNT is supplied to the variable capacitor 609. The variable capacitor 609 changes the capacitance of its own in accordance with the instruction value CNT.

Figure 32:
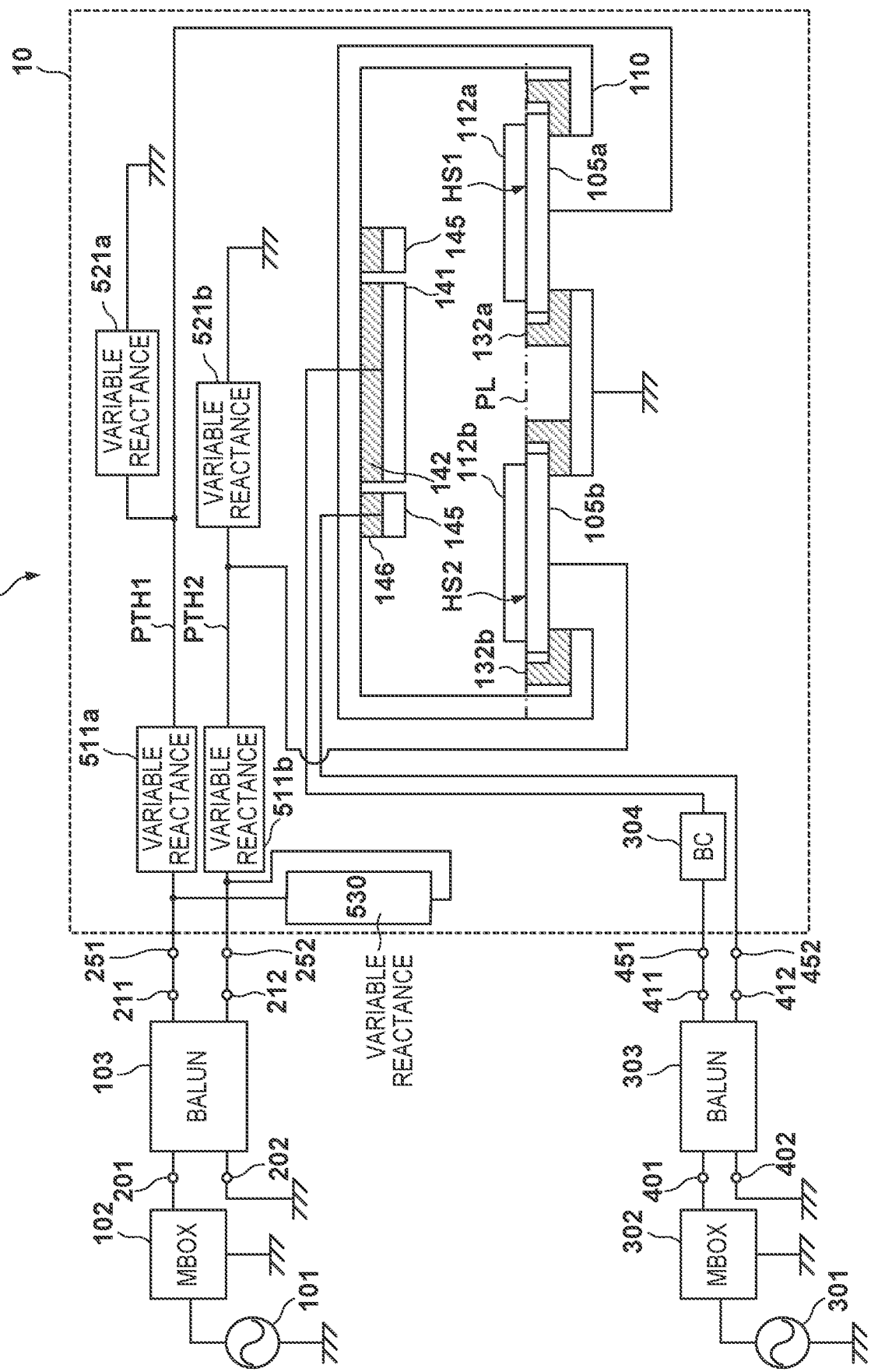
FIG. 32 is a view schematically showing the arrangement of a plasma processing apparatus 1 according to the 21st embodiment of the present invention.

FIG. 32 schematically shows the arrangement of a plasma processing apparatus 1 according to the 21st embodiment of the present invention. The plasma processing apparatus 1 according to the 21st embodiment can operate as an etching apparatus for etching substrates 112*a* and 112*b*. The plasma processing apparatus 1 according to the 21st embodiment is different from the plasma processing apparatus 1 according to the eighth embodiment in that a first electrode 105*a* and a second electrode 105*b* hold the first substrate 112*a* and the second substrate 112*b* as etching targets, respectively, and a third electrode 141 does not hold a substrate, and can have an arrangement similar to the plasma processing apparatus 1 according to the eighth embodiment concerning the remaining points.

In one arrangement example, as an adjustment reactance that affects the relationship between a first voltage applied to the first electrode 105*a* and a second voltage applied to the second electrode 105*b*, the plasma processing apparatus 1 includes at least one of (a) a variable reactance 511*a* arranged on a first path PTH1 that connects a first balanced terminal 211 and the first electrode 105*a*, (b) a variable reactance 521*a* arranged between the first electrode 105*a* and ground, (c) a variable reactance 511*b* arranged on a second path PTH2 that connects a second balanced terminal 212 and the second electrode 105*b*, (d) a variable reactance 521*b* arranged between the second electrode 105*b* and ground, and (e) a variable reactance 530 that connects the first path PTH1 and the second path PTH2.

By adjusting the value of the adjustment reactance that affects the relationship between the first voltage applied to the first electrode 105*a* and the second voltage applied to the second electrode 105*b*, the etching amount distribution of the first substrate 112*a* and the etching amount distribution of the second substrate 112*b* can be adjusted. Alternatively, by adjusting the value of the adjustment reactance that affects the relationship between the first voltage applied to the first electrode 105a and the second voltage applied to the second electrode 105b, the etching amount distribution of the first substrate 112a and the etching amount distribution of the second substrate 112b can be made equal.

Note that in the 15th to 20th embodiments described with reference to FIGS. 26 to 31, electrodes are arranged on the facing surfaces of targets 109a and 109b. However, these are not limited to the electrodes. A cylindrical substrate rotation holder in a plasma apparatus of a so-called carousel type (for example, Japanese Patent Laid-Open Nos. 2003-155556 and 62-133065) or a rectangular substrate tray in a plasma apparatus of a so-called inline type (for example, Japanese Patent No. 5824072 and Japanese Patent Laid-Open No. 2011-144450) may be arranged.

In the 15th to 20th embodiments described with reference to FIGS. 26 to 31, the controller 700 adjusts the value of the adjustment reactance based on the first voltage V1 of the first electrode 105a and the second voltage V2 of the second electrode 105b. In place of this arrangement, the controller 700 may be configured to adjust the adjustment reactance based on a plasma intensity near the first electrode 105a and a plasma intensity near the second electrode 105b. The plasma intensity near the first electrode 105a can be detected by, for example, a photoelectric conversion device. Similarly, the plasma intensity near the second electrode 105b can be detected by, for example, a photoelectric conversion device. The controller 700 can be configured to adjust the adjustment reactance based on the plasma intensity near the first electrode 105a and the plasma intensity near the second electrode 105b such that, for example, the plasma intensity near the first electrode 105a and the plasma intensity near the second electrode 105b become equal.

A plasma processing method according to the 22nd embodiment of the present invention will be described next. The plasma processing method according to the 22nd embodiment processes a substrate 112 in a plasma processing apparatus 1 according to any one of the eighth to 21st embodiments. The plasma processing method can include a step of adjusting an adjustment reactance to adjust the relationship between a first voltage applied to a first electrode 105a and a second voltage applied to a second electrode 105b, and a step of processing the substrate 112 after the step. The processing can include a step of forming a film on the substrate 112 by sputtering, or a step of etching the substrate 112.

Figure 33:
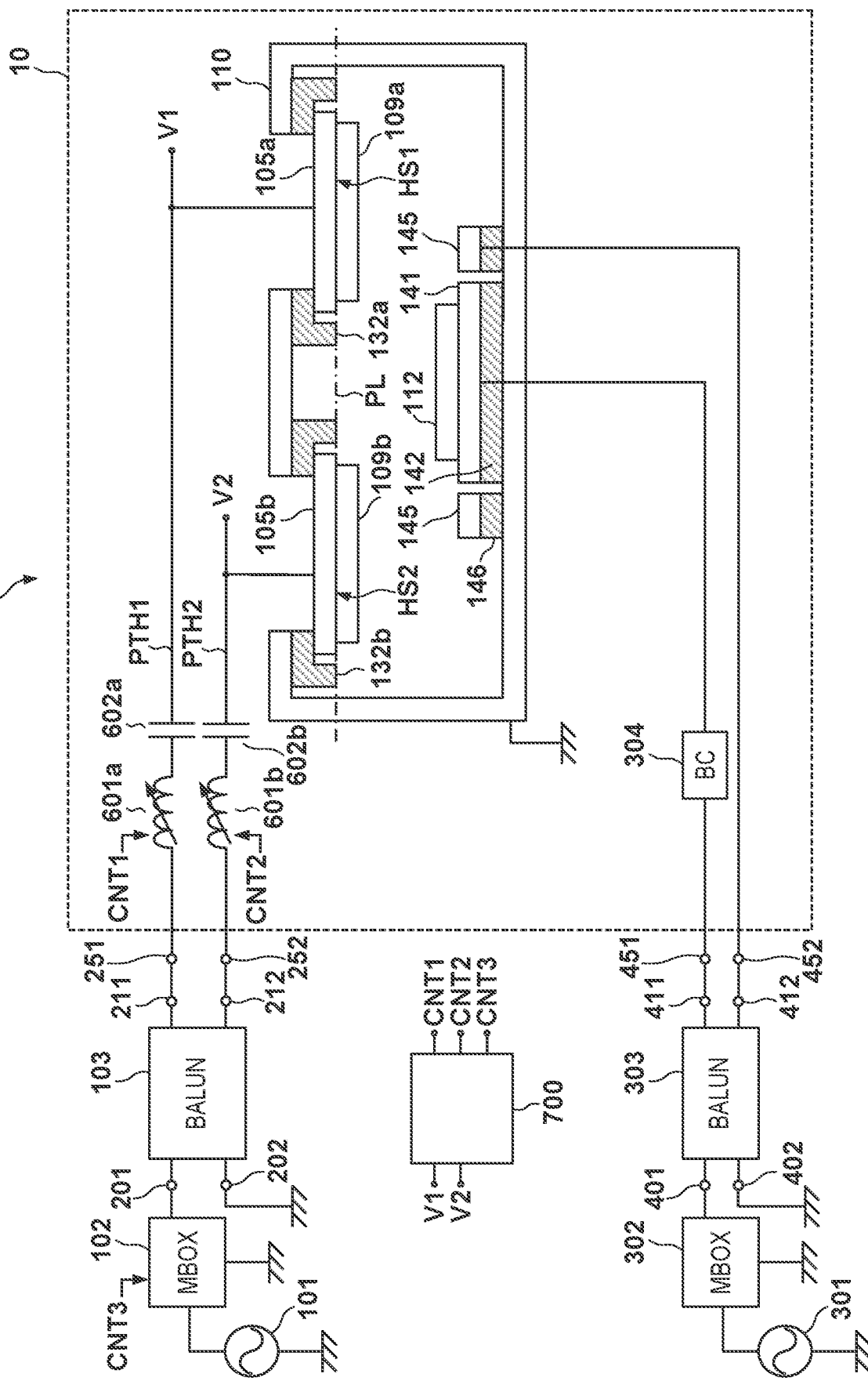
FIG. 33 is a view schematically showing the arrangement of a plasma processing apparatus 1 according to the 23rd embodiment of the present invention.

FIG. 33 schematically shows the arrangement of a plasma processing apparatus 1 according to the 23rd embodiment of the present invention. The plasma processing apparatus 1 according to the 23rd embodiment has an arrangement in which a controller 700 is added to the plasma processing apparatus according to the ninth embodiment shown in FIG. 18. The controller 700 adjusts the value of an adjustment reactance based on a first voltage V1 of a first electrode 105a and a second voltage V2 of a second electrode 105b such that, for example, the first voltage V1 obtains a first target value, and the second voltage V2 obtains a second target value. For example, based on the first voltage V1 of the first electrode 105a and the second voltage V2 of the second electrode 105b, the controller 700 generates a first instruction value CNT1 and a second instruction value CNT2, which adjust the values of variable inductors 601a and 601b each serving as an adjustment reactance, respectively, such that the first voltage V1 obtains the first target value, and the second voltage V2 obtains the second target value. Here, the first target value and the second target value may be values equal to each other, or may be determined such that the difference between the first target value and the second target value matches a target difference value. The controller 700 can include a measurement unit configured to measure the first voltage V1 that is the voltage of the first electrode 105a and the second voltage V2 that is the voltage of the second electrode 105b. Alternatively, for such measurement, a unit may be provided separately from the controller 700.

The controller 700 generates an instruction value CNT3 that controls an impedance matching circuit 102. When igniting plasma, the controller 700 controls the impedance matching circuit 102 such that the impedance matching circuit 102 obtains an impedance for ignition of plasma. In addition, the controller 700 changes the impedance of the impedance matching circuit 102 such that the plasma stabilizes after ignition of plasma. In a state in which the plasma is stable, the impedance of the impedance matching circuit 102 matches an impedance Rp−jXp (an impedance when the side of the first electrode 105a and the second electrode 105b (the side of a main body 10) is viewed from the side of a first balanced terminal 211 and a second balanced terminal 212) on the side of the main body 10 when plasma is generated. The impedance of the impedance matching circuit 102 at this time is Rp+jXp.

The controller 700 can be formed by, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components. The program can be provided by storing it in a memory medium (computer-readable memory medium) or via a communication network.

Figure 40:
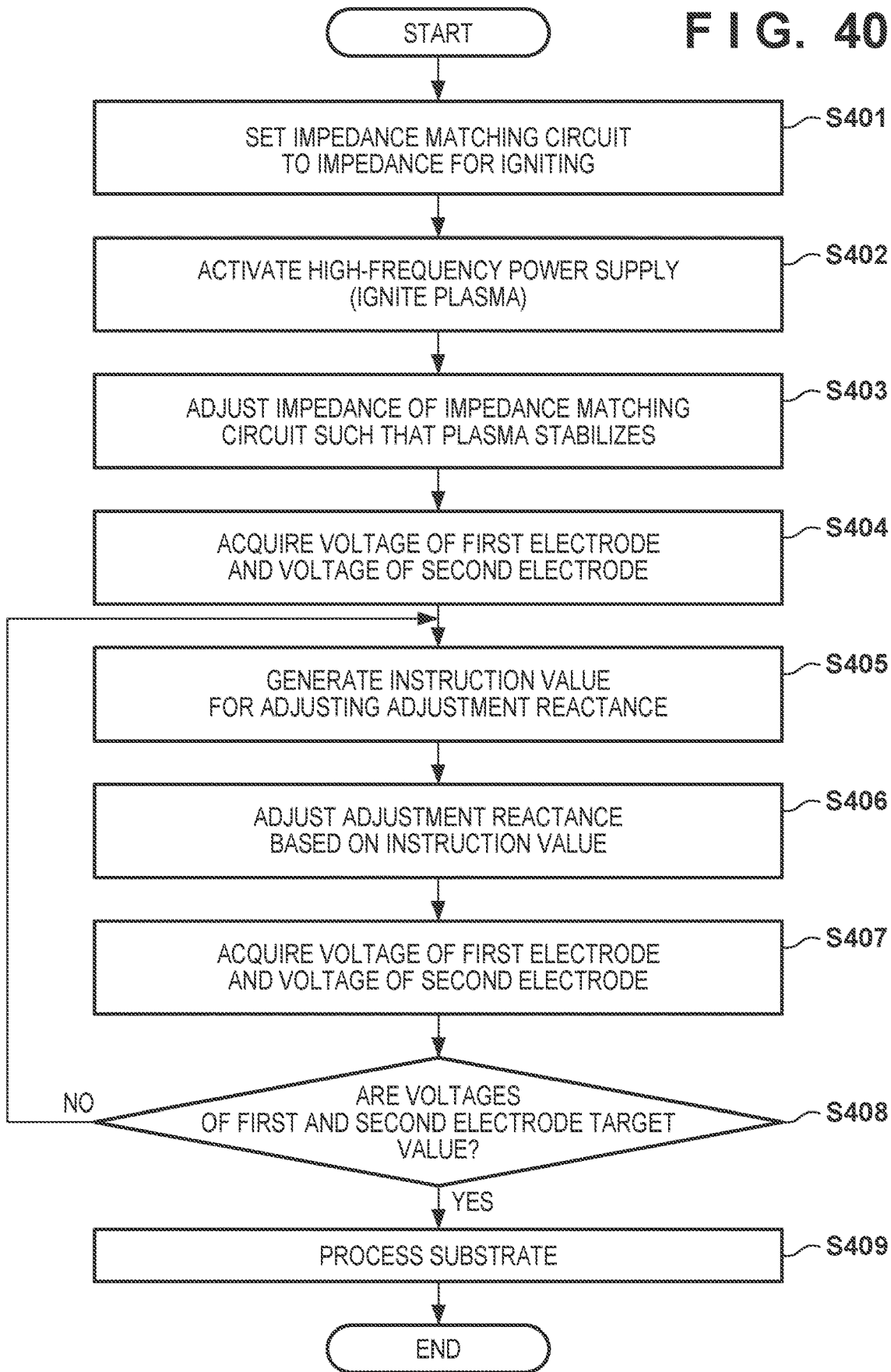
FIG. 40 is a flowchart showing the operation of the plasma processing apparatus 1 according to the 23rd embodiment of the present invention.

FIG. 40 shows the operation of the plasma processing apparatus 1 according to the 23rd embodiment. This operation can be controlled by the controller 700. In step S401, the controller 700 decides the instruction value CNT3 such that the impedance (Rpi+jXpi) of the impedance matching circuit 102 is set or changed to the impedance (Rpi−jXpi) for ignition of plasma, and supplies the instruction value CNT3 to the impedance matching circuit 102. The impedance matching circuit 102 sets or changes the impedance of its own in accordance with the instruction value CNT3.

After that, in step S402 (ignition step), in a state in which the impedance of the impedance matching circuit 102 is set to the impedance for ignition of plasma, the controller 700 activates (ON) a high-frequency power supply 402 to generate a high frequency. The high frequency generated by the high-frequency power supply 402 is supplied to the first electrode 105a and the second electrode 105b via the impedance matching circuit 102, a balun 103, and the adjustment reactances (the variable inductors 601a and 601b and capacitors 602a and 602b). Plasma is thus ignited.

In step S403 (matching step), the controller 700 changes the impedance of the impedance matching circuit 102 such that plasma stabilizes after ignition of plasma. More specifically, in step S403, the controller 700 decides the instruction value CNT3 such that the impedance at which plasma stabilizes is set to the impedance matching circuit 700, and supplies the instruction value CNT3 to the impedance matching circuit 700. In a state in which the plasma is stable, the impedance of the impedance matching circuit 102 matches the impedance Rp−jXp on the side of the main body 10 (the side of the first electrode 106 and the second electrode 111) when plasma is generated. The impedance of the impedance matching circuit 102 at this time is Rp+jXp. Note that the value Rp is different from Rpi, and the value Xp is different from Xpi.

After that, in step S404, the controller 700 acquires the first voltage V1 of the first electrode 105a and the second voltage V2 of the second electrode 105b. After that, in step S405 (adjustment step), based on the first voltage V1 of the first electrode 105a and the second voltage V2 of the second electrode 105b, the controller 700 generates the first instruction value CNT1 and the second instruction value CNT2, which adjust the values of the variable inductors 601a and 601b each serving as a variable reactance, respectively, such that the first voltage V1 obtains the first target value, and the second voltage V2 obtains the second target value. The first instruction value CNT1 and the second instruction value CNT2 are supplied to the variable inductors 601a and 601b, respectively. The variable inductors 601a and 601b adjust or change the inductances of their own in accordance with the first instruction value CNT1 and the second instruction value CNT2, respectively.

Figure 41:
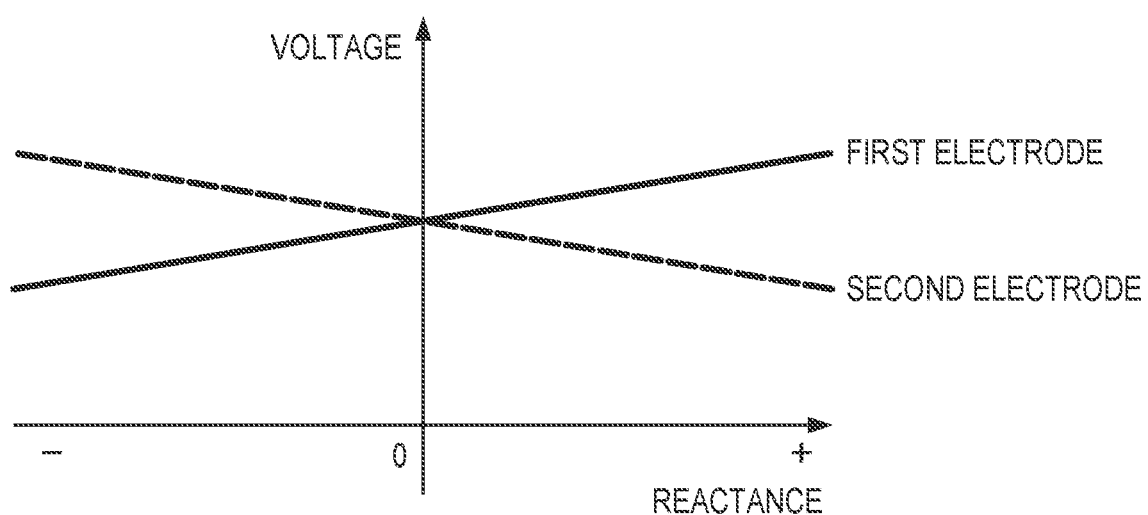
FIG. 41 is a view showing the relationship between a reactance and the voltages of a first electrode and a second electrode.

FIG. 41 shows the relationship between the reactance when the side of the first electrode 105a and the second electrode 105b (the side of the main body 10) is viewed from the side of the first balanced terminal 211 and the second balanced terminal 212 and the voltages of the first electrode 105a and the second electrode 105b in a state in which plasma is generated in the internal space of a vacuum container 110. This reactance corresponds to −XP described above. As shown in FIG. 41, the magnitude relationship between the voltages of the first electrode 105a and the second electrode 105b is reversed by changing the reactance of the adjustment reactance. In other words, the change curves of the voltages of the first electrode 105a and the second electrode 105b to the change of the reactance exhibit characteristics crossing each other.

The characteristics shown in FIG. 41 can be decided by, for example, experiments or calculations in advance. In this case, in step S405, based on the characteristics, the first voltage V1 of the first electrode 105a, and the second voltage V2 of the second electrode 105b, the controller 700 can generate the first instruction value CNT1 and the second instruction value CNT2, which adjust the values of the variable inductors 601a and 601b, respectively, such that the first voltage V1 obtains the first target value, and the second voltage V2 obtains the second target value. If the characteristics shown in FIG. 41 are not decided in advance, in step S405, the controller 700 can finely adjust the first instruction value CNT1 and the second instruction value CNT2 based on the first voltage V1 of the first electrode 105a and the second voltage V2 of the second electrode 105b.

After that, in step S407, the controller 700 acquires the first voltage V1 of the first electrode 105a and the second voltage V2 of the second electrode 105b. After that, in step S408, the controller 700 determines whether the first voltage V1 obtains the first target value, and the second voltage V2 obtains the second target value. If the first voltage V1 obtains the first target value, and the second voltage V2 obtains the second target value, the process advances to step S409. Otherwise, the process returns to step S405. In step S409 (processing step), the controller 700 controls to process the substrate 112. This control can include, for example, opening/closing a shutter (not shown) arranged between the target 109a and the substrate 112 and a shutter (not shown) arranged between the target 109b and the substrate 112. The processing shown in FIG. 40 may be executed manually.

FIG. 3 of Japanese Patent Laid-Open No. 2-156080 shows a sputtering apparatus including a high-frequency transformer (Tr7), a matching box (MB7), a vacuum container (10), a first target (T5), a second target (T6), a high-frequency voltage generator (OSC5), a voltage amplifier (PA5), a substrate holder (21), and a motor (22). In the sputtering apparatus described in Japanese Patent Laid-Open No. 2-156080, the matching boxes (MB7) arranged between the high-frequency transformer (Tr7) and the first target (T5) and between the high-frequency transformer (Tr7) and the second target (T7) have an adjustable reactance.

However, the matching box (MB7) in the sputtering apparatus described in Japanese Patent Laid-Open No. 2-156080 cannot be operated like the adjustment reactance (variable inductors 601a and 601b) according to the above-described 23rd embodiment. This is because the matching box (MB7) is indispensable for impedance matching, and if the reactance of the matching box (MB7) is allowed to be freely adjusted, the matching box (MB7) cannot be used for impedance matching, and it is impossible to generate plasma and stabilize plasma.

Here, it is understood that the plasma (P5) generated in the sputtering apparatus described in Japanese Patent Laid-Open No. 2-156080 has a region called a sheath where ions are excessive near the targets (T5 and T6) and a region of bulk plasma in contact with the region. The sheath has a negative reactance component, like a capacitor, and the bulk plasma has a positive reactance component, like an inductor. These reactance components can depend on the applied power, the discharge pressure, the electrode material, and the like, which are conditions to generate plasma. Hence, the reactance of plasma takes a positive value or a negative value, and its absolute value can also change. Since the sputtering apparatus described in Japanese Patent Laid-Open No. 2-156080 does not have an adjustment reactance as described in the 23rd embodiment, the relationship between the two targets (T5 and T6), in other words, the voltages of the two electrodes cannot be controlled.

Figure 34:
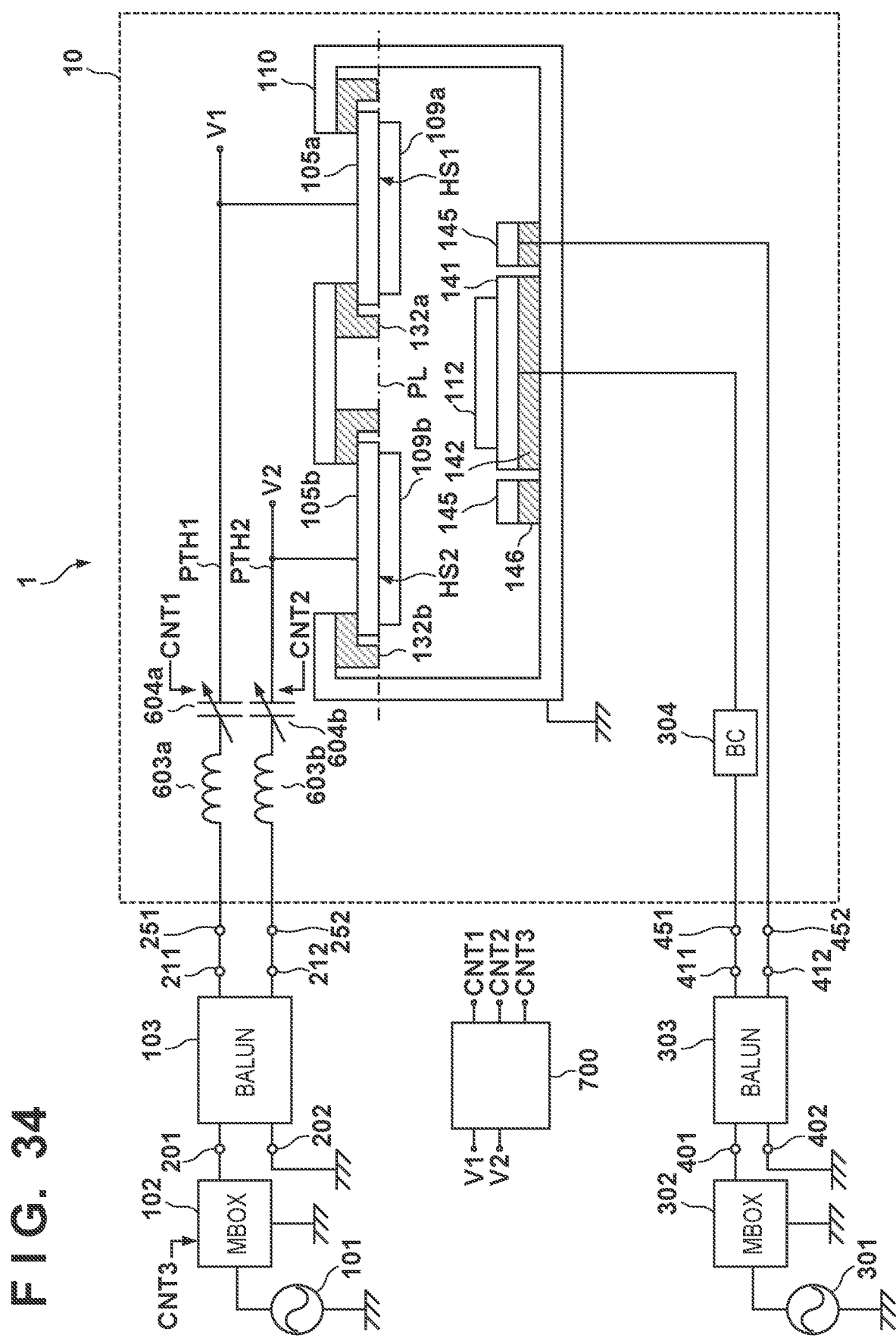
FIG. 34 is a view schematically showing the arrangement of a plasma processing apparatus 1 according to the 24th embodiment of the present invention.

FIG. 34 schematically shows the arrangement of a plasma processing apparatus 1 according to the 24th embodiment of the present invention. The plasma processing apparatus 1 according to the 24th embodiment has an arrangement in which a controller 700 is added to the plasma processing apparatus 1 according to the 10th embodiment shown in FIG. 19. Matters that are not mentioned as the 24th embodiment can comply with the 23rd embodiment. The controller 700 adjusts the value of an adjustment reactance based on a first voltage V1 of a first electrode 105a and a second voltage V2 of a second electrode 105b such that, for example, the first voltage V1 obtains a first target value, and the second voltage V2 obtains a second target value. For example, based on the first voltage V1 of the first electrode 105a and the second voltage V2 of the second electrode 105b, the controller 700 generates a first instruction value CNT1 and a second instruction value CNT2, which adjust the values of variable capacitors 604a and 604b each serving as an adjustment reactance, respectively, such that the first voltage V1 obtains the first target value, and the second voltage V2 obtains the second target value. The first instruction value CNT1 and the second instruction value CNT2 are supplied to the variable capacitors 604a and 604b, respectively. The variable capacitors 604a and 604b change the capacitances of their own in accordance with the first instruction value CNT1 and the second instruction value CNT2, respectively. In addition, the controller 700 generates an instruction value CNT3 that controls an impedance matching circuit 102. The controller 700 can include a measurement unit configured to measure the first voltage V1 that is the voltage of the first electrode 105a and the second voltage V2 that is the voltage of the second electrode 105b. Alternatively, for such measurement, a unit may be provided separately from the controller 700.

Figure 35:
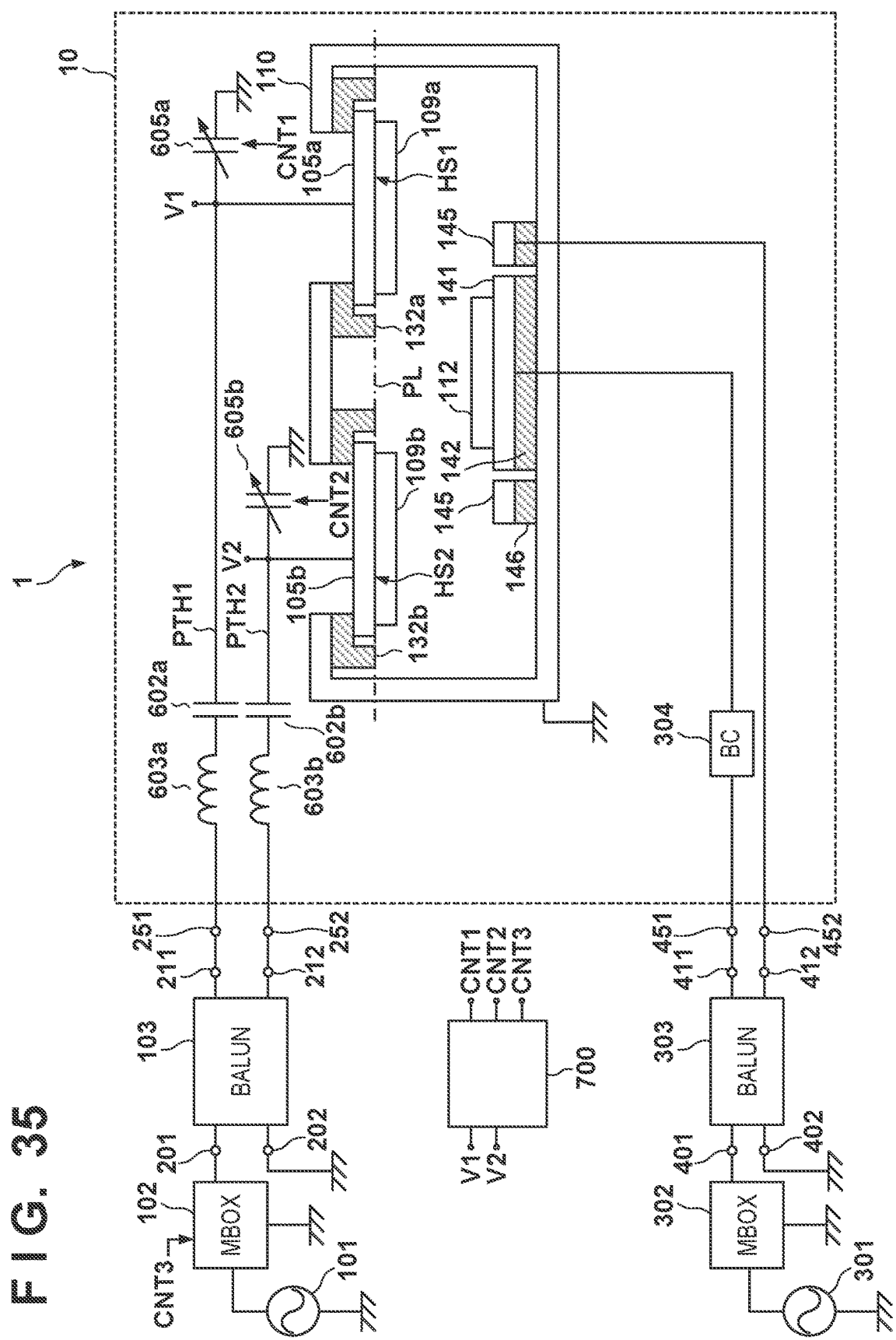
FIG. 35 is a view schematically showing the arrangement of a plasma processing apparatus 1 according to the 25th embodiment of the present invention.

FIG. 35 schematically shows the arrangement of a plasma processing apparatus 1 according to the 25th embodiment of the present invention. The plasma processing apparatus 1 according to the 25th embodiment has an arrangement in which a controller 700 is added to the plasma processing apparatus according to the 25th embodiment shown in FIG. 20. The controller 700 adjusts the value of an adjustment reactance based on a first voltage V1 of a first electrode 105a and a second voltage V2 of a second electrode 105b such that, for example, the first voltage V1 obtains a first target value, and the second voltage V2 obtains a second target value. For example, based on the first voltage V1 of the first electrode 105a and the second voltage V2 of the second electrode 105b, the controller 700 generates a first instruction value CNT1 and a second instruction value CNT2, which adjust the values of variable capacitors 605a and 605b each serving as an adjustment reactance, respectively, such that the first voltage V1 obtains the first target value, and the second voltage V2 obtains the second target value. Here, the first target value and the second target value may be values equal to each other, or may be determined such that the difference between the first target value and the second target value matches a target difference value. The first instruction value CNT1 and the second instruction value CNT2 are supplied to the variable capacitors 605a and 605b, respectively. The variable capacitors 605a and 605b change the capacitances of their own in accordance with the first instruction value CNT1 and the second instruction value CNT2, respectively. The controller 700 can include a measurement unit configured to measure the first voltage V1 that is the voltage of the first electrode 105a and the second voltage V2 that is the voltage of the second electrode 105b. Alternatively, for such measurement, a unit may be provided separately from the controller 700.

Figure 36:
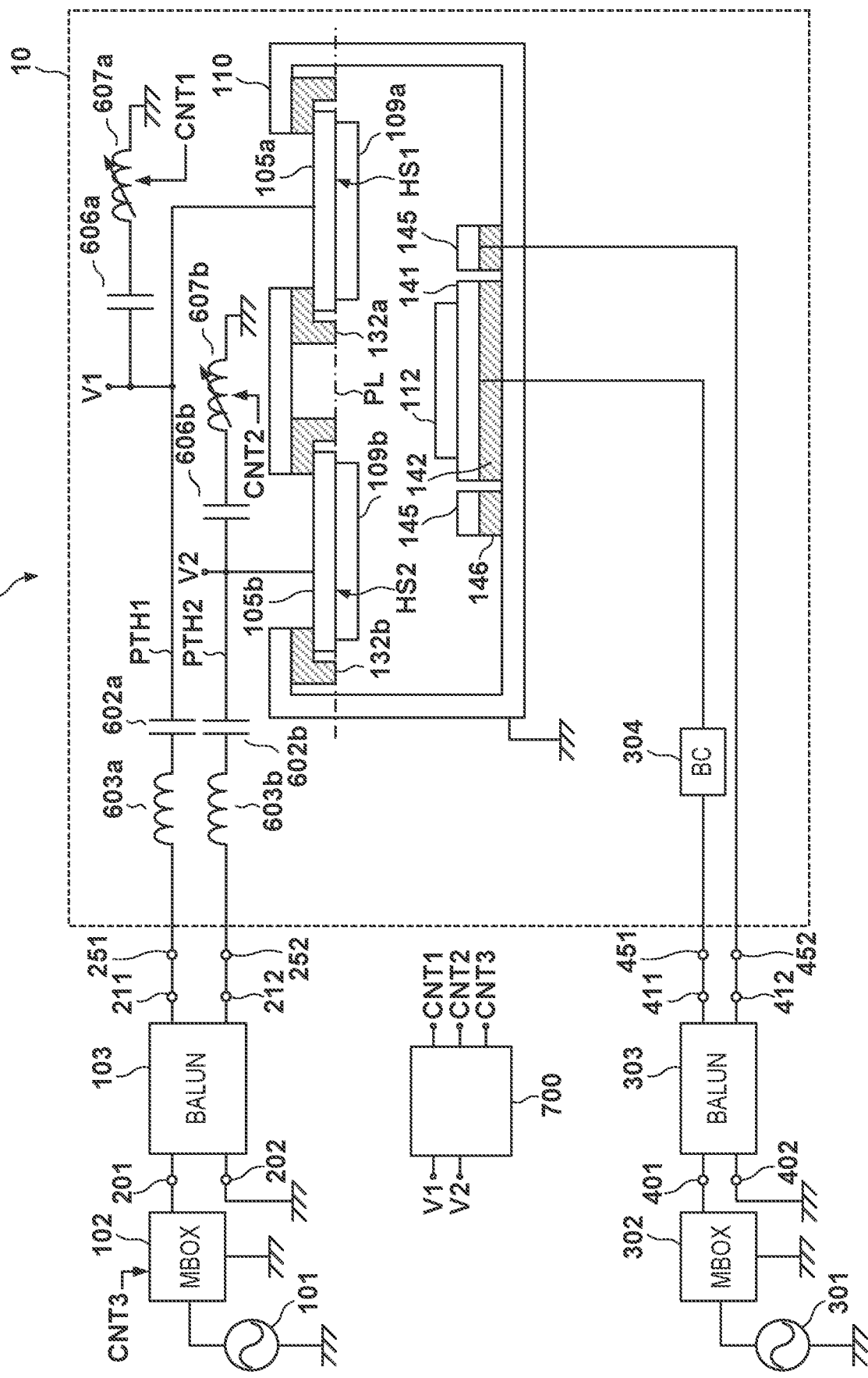
FIG. 36 is a view schematically showing the arrangement of a plasma processing apparatus 1 according to the 26th embodiment of the present invention.

FIG. 36 schematically shows the arrangement of a plasma processing apparatus 1 according to the 26th embodiment of the present invention. The plasma processing apparatus 1 according to the 26th embodiment has an arrangement in which a controller 700 is added to the plasma processing apparatus according to the 12th embodiment shown in FIG. 21. Matters that are not mentioned as the 26th embodiment can comply with the 23rd embodiment. The controller 700 adjusts the value of an adjustment reactance based on a first voltage V1 of a first electrode 105a and a second voltage V2 of a second electrode 105b such that, for example, the first voltage V1 obtains a first target value, and the second voltage V2 obtains a second target value. For example, based on the first voltage V1 of the first electrode 105a and the second voltage V2 of the second electrode 105b, the controller 700 generates a first instruction value CNT1 and a second instruction value CNT2, which adjust the values of variable inductors 607a and 607b each serving as an adjustment reactance, respectively, such that the first voltage V1 obtains the first target value, and the second voltage V2 obtains the second target value. The first instruction value CNT1 and the second instruction value CNT2 are supplied to the variable inductors 607a and 607b, respectively. The variable inductors 607a and 607b change the inductances of their own in accordance with the first instruction value CNT1 and the second instruction value CNT2, respectively. In addition, the controller 700 generates an instruction value CNT3 that controls an impedance matching circuit 102. The controller 700 can include a measurement unit configured to measure the first voltage V1 that is the voltage of the first electrode 105a and the second voltage V2 that is the voltage of the second electrode 105b. Alternatively, for such measurement, a unit may be provided separately from the controller 700.

Figure 37:
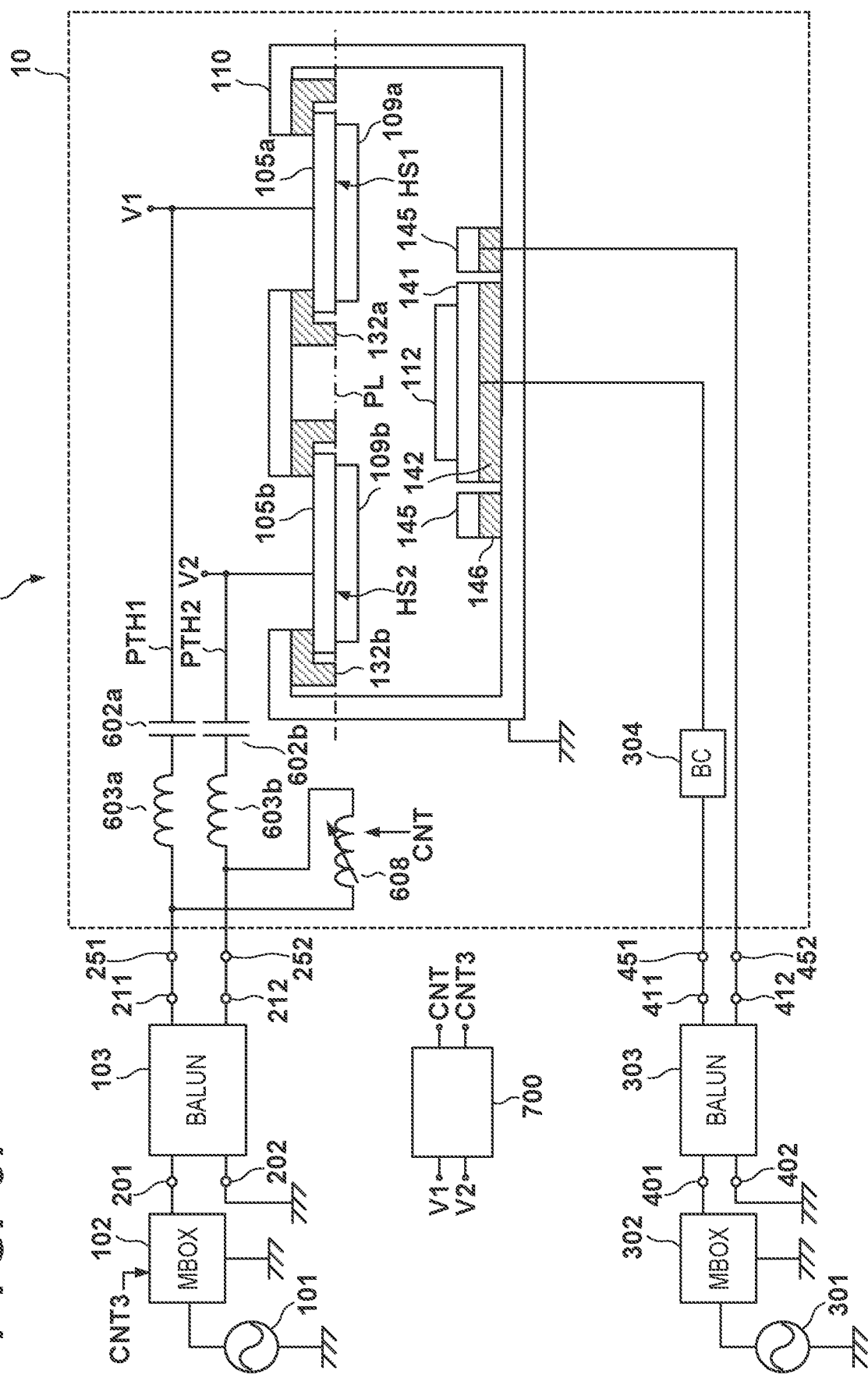
FIG. 37 is a view schematically showing the arrangement of a plasma processing apparatus 1 according to the 27th embodiment of the present invention.

FIG. 37 schematically shows the arrangement of a plasma processing apparatus 1 according to the 27th embodiment of the present invention. The plasma processing apparatus 1 according to the 27th embodiment has an arrangement in which a controller 700 is added to the plasma processing apparatus according to the 13th embodiment shown in FIG. 22. Matters that are not mentioned as the 27th embodiment can comply with the 23rd embodiment. The controller 700 adjusts the value of an adjustment reactance based on a first voltage V1 of a first electrode 105a and a second voltage V2 of a second electrode 105b such that, for example, the first voltage V1 obtains a first target value, and the second voltage V2 obtains a second target value. For example, based on the first voltage V1 of the first electrode 105a and the second voltage V2 of the second electrode 105b, the controller 700 generates an instruction value CNT that adjusts the value of a variable inductor 608 such that the first voltage V1 obtains the first target value, and the second voltage V2 obtains the second target value. The instruction value CNT is supplied to the variable inductor 608. The variable inductor 608 changes the inductance of its own in accordance with the instruction value. In addition, the controller 700 generates an instruction value CNT3 that controls an impedance matching circuit 102. The controller 700 can include a measurement unit configured to measure the first voltage V1 that is the voltage of the first electrode 105a and the second voltage V2 that is the voltage of the second electrode 105b. Alternatively, for such measurement, a unit may be provided separately from the controller 700.

Figure 38:
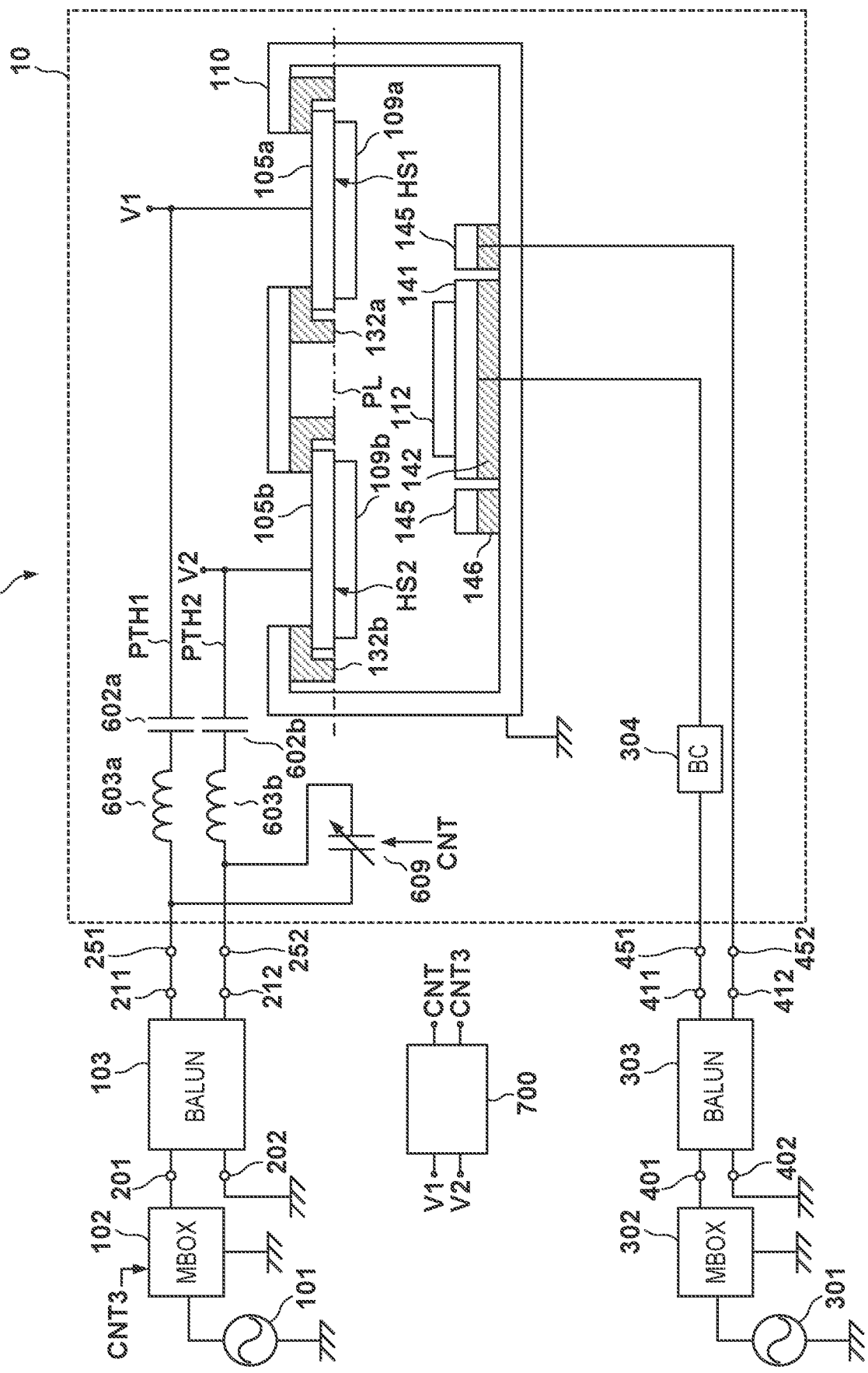
FIG. 38 is a view schematically showing the arrangement of a plasma processing apparatus 1 according to the 28th embodiment of the present invention.

FIG. 38 schematically shows the arrangement of a plasma processing apparatus 1 according to the 28th embodiment of the present invention. The plasma processing apparatus 1 according to the 28th embodiment has an arrangement in which a controller 700 is added to the plasma processing apparatus according to the 14th embodiment shown in FIG. 23. Matters that are not mentioned as the 28th embodiment can comply with the 23rd embodiment. The controller 700 adjusts the value of an adjustment reactance based on a first voltage V1 of a first electrode 105a and a second voltage V2 of a second electrode 105b such that, for example, the first voltage V1 obtains a first target value, and the second voltage V2 obtains a second target value. For example, based on the first voltage V1 of the first electrode 105a and the second voltage V2 of the second electrode 105b, the controller 700 generates an instruction value CNT that adjusts the value of a variable capacitor 609 such that the first voltage V1 obtains the first target value, and the second voltage V2 obtains the second target value. The instruction value CNT is supplied to the variable capacitor 609. The variable capacitor 609 changes the capacitance of its own in accordance with the instruction value CNT. In addition, the controller 700 generates an instruction value CNT3 that controls an impedance matching circuit 102. The controller 700 can include a measurement unit configured to measure the first voltage V1 that is the voltage of the first electrode 105a and the second voltage V2 that is the voltage of the second electrode 105b. Alternatively, for such measurement, a unit may be provided separately from the controller 700.

Figure 39:
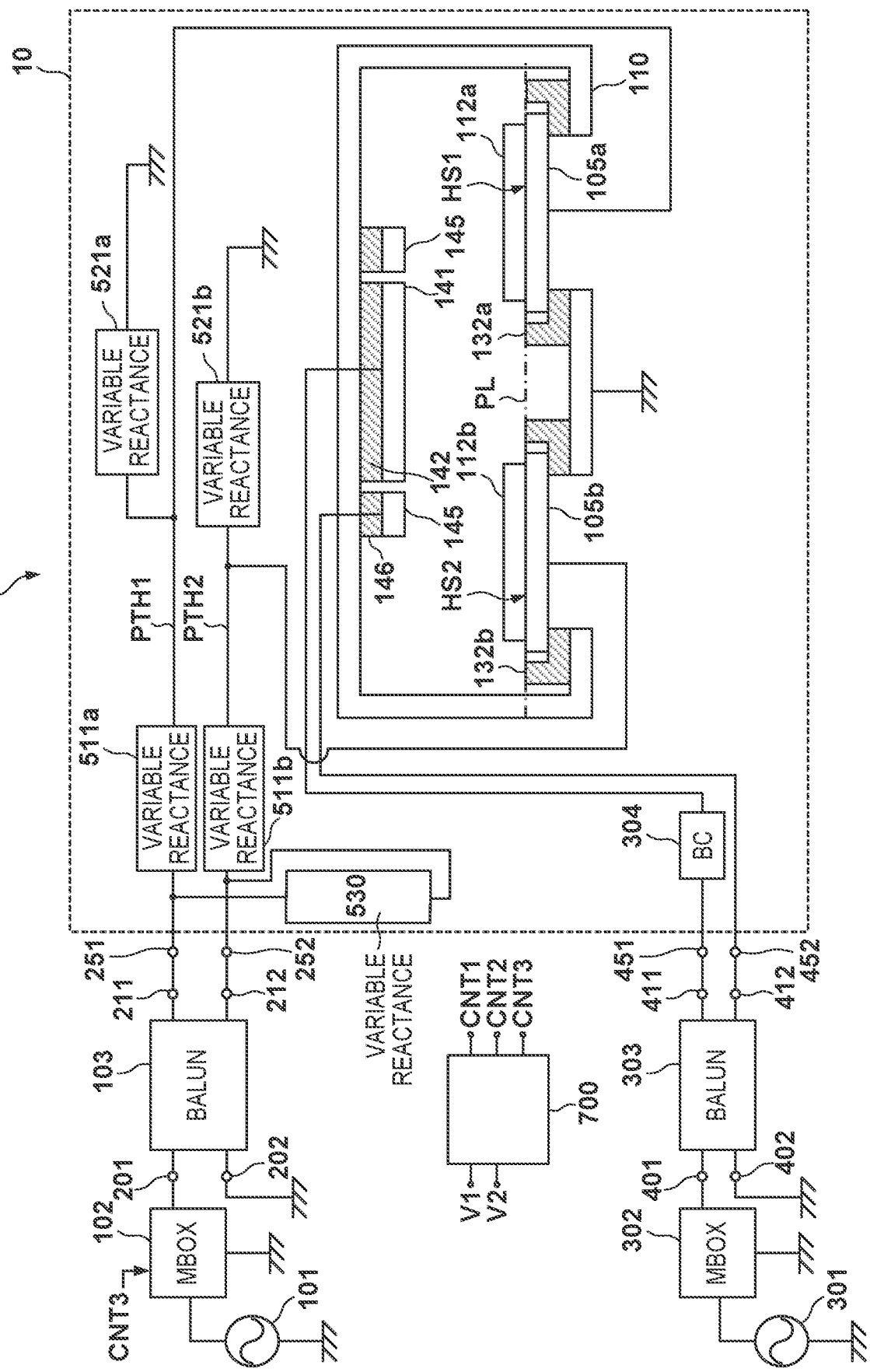
FIG. 39 is a view schematically showing the arrangement of a plasma processing apparatus 1 according to the 29th embodiment of the present invention.

FIG. 39 schematically shows the arrangement of a plasma processing apparatus 1 according to the 29th embodiment of the present invention. The plasma processing apparatus 1 according to the 29th embodiment can operate as an etching apparatus for etching substrates 112a and 112b. The plasma processing apparatus 1 according to the 29th embodiment can have an arrangement similar to the plasma processing apparatus 1 according to the 21st embodiment except a controller 700. Matters that are not mentioned as the 29th embodiment can comply with the 23rd embodiment.

In one arrangement example, as an adjustment reactance that affects the relationship between a first voltage applied to a first electrode 105a and a second voltage applied to a second electrode 105b, the plasma processing apparatus 1 includes at least one of (a) a variable reactance 511a arranged on a first path PTH1 that connects a first balanced terminal 211 and the first electrode 105a, (b) a variable reactance 521a arranged between the first electrode 105a and ground, (c) a variable reactance 511b arranged on a second path PTH2 that connects a second balanced terminal 212 and the second electrode 105b, (d) a variable reactance 521b arranged between the second electrode 105b and ground, and (e) a variable reactance 530 that connects the first path PTH1 and the second path PTH2.

By adjusting the value of the adjustment reactance that affects the relationship between the first voltage applied to the first electrode 105a and the second voltage applied to the second electrode 105b, the etching amount distribution of the first substrate 112a and the etching amount distribution of the second substrate 112b can be adjusted. Alternatively, by adjusting the value of the adjustment reactance that affects the relationship between the first voltage applied to the first electrode 105a and the second voltage applied to the second electrode 105b, the etching amount distribution of the first substrate 112a and the etching amount distribution of the second substrate 112b can be made equal.

Note that in the 23rd to 29th embodiments described with reference to FIGS. 33 to 39, electrodes are arranged on the facing surfaces of targets 109a and 109b. However, these are not limited to the electrodes. A cylindrical substrate rotation holder in a plasma apparatus of a so-called carousel type (for example, Japanese Patent Laid-Open Nos. 2003-155556 and 62-133065) or a rectangular substrate tray in a plasma apparatus of a so-called inline type (for example, Japanese Patent No. 5824072 and Japanese Patent Laid-Open No. 2011-144450) may be arranged.

In the 23rd to 29th embodiments described with reference to FIGS. 33 to 39, the controller 700 adjusts the value of the adjustment reactance based on the first voltage V1 of the first electrode 105a and the second voltage V2 of the second electrode 105b. In place of this arrangement, the controller 700 may be configured to adjust the adjustment reactance based on a plasma intensity near the first electrode 105a and a plasma intensity near the second electrode 105b. The plasma intensity near the first electrode 105a can be detected by, for example, a photoelectric conversion device. Similarly, the plasma intensity near the second electrode 105b can be detected by, for example, a photoelectric conversion device. The controller 700 can be configured to adjust the value of the adjustment reactance based on the plasma intensity near the first electrode 105a and the plasma intensity near the second electrode 105b such that, for example, the plasma intensity near the first electrode 105a and the plasma intensity near the second electrode 105b become equal.

Figure 42:
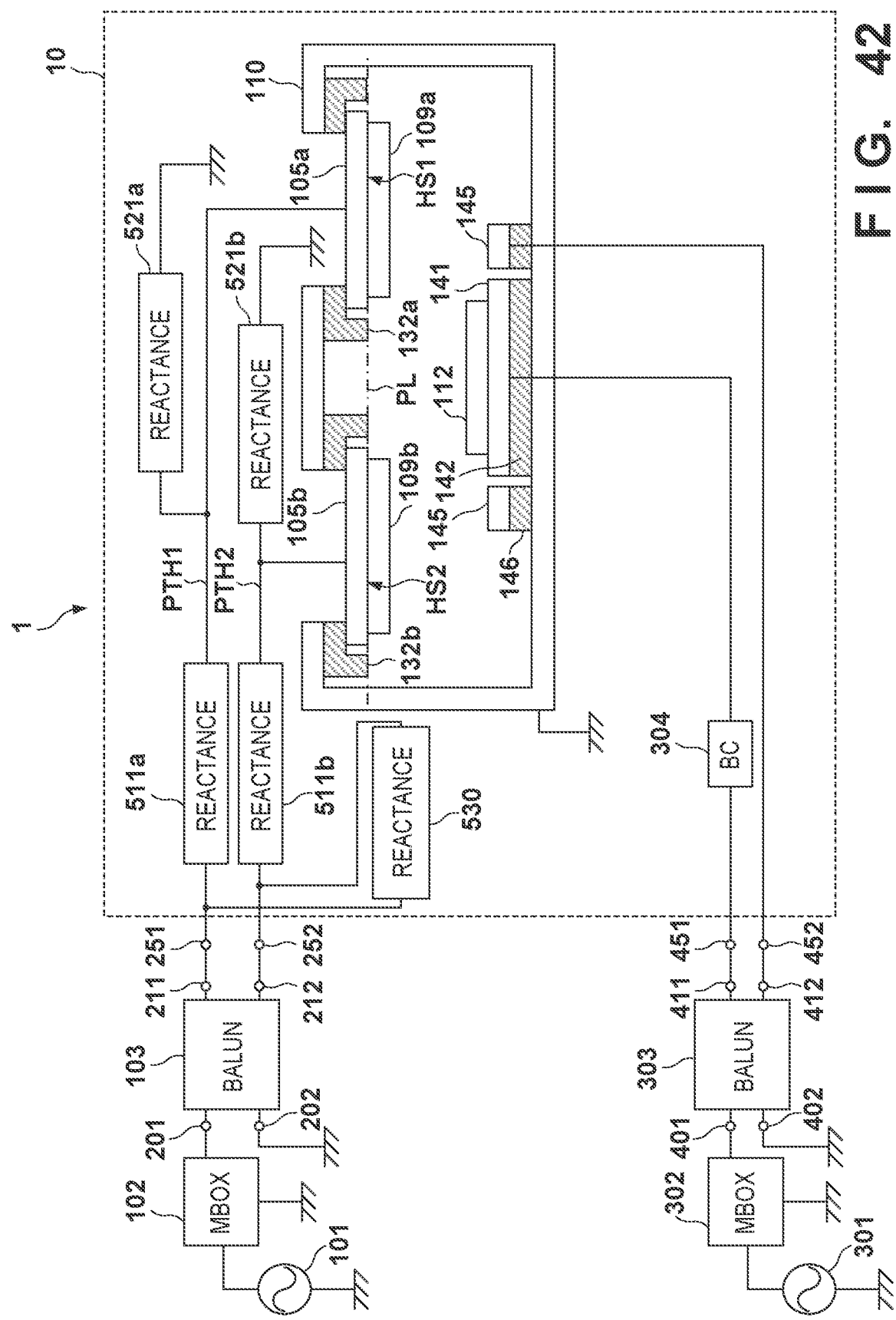
FIG. 42 is a view schematically showing the arrangement of a plasma processing apparatus 1 according to the 30th embodiment of the present invention.

FIG. 42 schematically shows the arrangement of a plasma processing apparatus 1 according to the 30th embodiment of the present invention. The plasma processing apparatus 1 according to the 30th embodiment can operate as a sputtering apparatus for forming a film on a substrate 112 by sputtering. Matters that are not mentioned as the plasma processing apparatus 1 according to the 30th embodiment can comply with the first to 29th embodiments. The plasma processing apparatus 1 according to the 30th embodiment includes a balun (first balun) 103, a vacuum container 110, a first electrode 105a, and a second electrode 105b. Alternatively, it may be understood that the plasma processing apparatus 1 includes the balun 103 and a main body 10, and the main body 10 includes the vacuum container 110, the first electrode 105a, and the second electrode 105b. The main body 10 includes a first terminal 251 and a second terminal 252.

The first electrode 105a can include a first holding surface HS1 configured to hold a first target 109a as a first member, and the second electrode 105b can include a second holding surface HS2 configured to hold a second target 109b as a second member. The first holding surface HS1 and the second holding surface HS2 can belong to one plane PL.

The plasma processing apparatus 1 according to the 30th embodiment can further include a second balun 303, a third electrode 141, and a fourth electrode 145. In other words, the plasma processing apparatus 1 can include the first balun 103, the second balun 303, the vacuum container 110, the first electrode 105a, the second electrode 105b, the third electrode 141, and the fourth electrode 145. Alternatively, it may be understood that the plasma processing apparatus 1 includes the first balun 103, the second balun 303, and the main body 10, and the main body 10 includes the vacuum container 110, the first electrode 105a, the second electrode 105b, the third electrode 141, and the fourth electrode 145. The main body 10 includes a first terminal 251, a second terminal 252, a third terminal 451, and a fourth terminal 452.

The first balun 103 includes a first unbalanced terminal 201, a second unbalanced terminal 202, a first balanced terminal 211, and a second balanced terminal 212. An unbalanced circuit is connected to the side of the first unbalanced terminal 201 and the second unbalanced terminal 202 of the first balun 103, and a balanced circuit is connected to the side of the first balanced terminal 211 and the second balanced terminal 212 of the first balun 103. The second balun 303 can have an arrangement similar to the first balun 103. The second balun 303 includes a third unbalanced terminal 401, a fourth unbalanced terminal 402, a third balanced terminal 411, and a fourth balanced terminal 412. An unbalanced circuit is connected to the side of the third unbalanced terminal 401 and the fourth unbalanced terminal 402 of the second balun 303, and a balanced circuit is connected to the side of the third balanced terminal 411 and the fourth balanced terminal 412 of the second balun 303. The vacuum container 110 is grounded. The baluns 103 and 303 can have, for example, an arrangement shown in FIGS. 2A and 2B (FIG. 14).

The first electrode 105a holds the first target 109a, and faces the space on the side of the substrate 112 as the processing target via the first target 109a. The second electrode 105b is arranged adjacent to the first electrode 105a, holds the second target 109b, and faces the space on the side of the substrate 112 as the processing target via the second target 109b. The targets 109a and 109b can be, for example, an insulating material or a conductive material. The first electrode 105a is electrically connected to the first balanced terminal 211 of the first balun 103, and the second electrode 105b is electrically connected to the second balanced terminal 212 of the first balun 103.

The third electrode 141 holds the substrate 112. The fourth electrode 145 can be arranged around the third electrode 141. The third electrode 141 is electrically connected to the first balanced terminal 411 of the second balun 303, and the fourth electrode 145 is electrically connected to the second balanced terminal 412 of the second balun 303.

The above-described arrangement can be understood as an arrangement in which the first electrode 105a is electrically connected to the first terminal 251, the second electrode 105b is electrically connected to the second terminal 252, the first terminal 251 is electrically connected to the first balanced terminal 211 of the first balun 103, and the second terminal 252 is electrically connected to the second balanced terminal 212 of the first balun 103. Additionally, the above-described arrangement can be understood as an arrangement in which the third electrode 141 is electrically connected to the third terminal 451, the fourth electrode 145 is electrically connected to the fourth terminal 452, the third terminal 451 is electrically connected to the first balanced terminal 411 of the second balun 303, and the fourth terminal 452 is electrically connected to the second balanced terminal 412 of the second balun 303.

The first electrode 105a and the first balanced terminal 211 (first terminal 251) of the first balun 103 can electrically be connected by a first path PTH1. A reactance 511a can be arranged on the first path PTH1. In other words, the first electrode 105a and the first balanced terminal 211 (first terminal 251) of the first balun 103 can electrically be connected via the reactance 511a. The reactance 511a can include a capacitor. The capacitor can function as a blocking capacitor that blocks a DC current between the first balanced terminal 211 of the first balun 103 and the first electrode 105a (or between the first balanced terminal 211 and the second balanced terminal 212 of the first balun 103). The second electrode 105b and the second balanced terminal 212 (second terminal 252) of the first balun 103 can electrically be connected by a second path PTH2. A reactance 511b can be arranged on the second path PTH2. In other words, the second electrode 105b and the second balanced terminal 212 (third terminal 252) of the first balun 103 can electrically be connected via the reactance 511b. The reactance 511b can include a capacitor. The capacitor can function as a blocking capacitor that blocks a DC current between the second balanced terminal 212 of the first balun 103 and the second electrode 105b (or between the first balanced terminal 211 and the second balanced terminal 212 of the first balun 103). The first electrode 105a and the second electrode 105b can be supported by the vacuum container 110 via insulators 132a and 132b, respectively.

The plasma processing apparatus 1 can include a reactance 521a arranged between the first electrode 105a and ground. The plasma processing apparatus 1 can include a reactance 521b arranged between the second electrode 105b and ground. The plasma processing apparatus 1 can include a reactance 530 that connects the first path PTH1 and the second path PTH2.

In one arrangement example, as an adjustment reactance that affects the relationship between a first voltage applied to the first electrode 105a and a second voltage applied to the second electrode 105b, the plasma processing apparatus 1 includes at least one of (a) the reactance 511a arranged on the first path PTH1 that connects the first balanced terminal 211 and the first electrode 105a, (b) the reactance 521a arranged between the first electrode 105a and ground, (c) the reactance 511b arranged on the second path PTH2 that connects the second balanced terminal 212 and the second electrode 105b, (d) the reactance 521b arranged between the second electrode 105b and ground, and (e) the reactance 530 that connects the first path PTH1 and the second path PTH2.

The third electrode 141 and the first balanced terminal 411 (third terminal 451) of the second balun 303 can electrically be connected via a blocking capacitor 304. The blocking capacitor 304 blocks a DC current between the first balanced terminal 411 of the second balun 303 and the third electrode 141 (or between the first balanced terminal 411 and the second balanced terminal 412 of the second balun 303). Instead of providing the blocking capacitor 304, a second impedance matching circuit 302 may be configured to block a DC current flowing between the first unbalanced terminal 401 and the second unbalanced terminal 402 of the second balun 303. The third electrode 141 and the fourth electrode 145 can be supported by the vacuum container 110 via insulators 142 and 146, respectively.

The plasma processing apparatus 1 can include a first high-frequency power supply 101 configured to generate a high frequency to be supplied between the first unbalanced terminal 201 and the second unbalanced terminal 202. The high-frequency power supply 101 can change the frequency of the high frequency supplied between the first unbalanced terminal 201 and the second unbalanced terminal 202. By changing the frequency, the first voltage applied to the first electrode 105a and the second voltage applied to the second electrode 105b can be adjusted. Alternatively, by changing the frequency, the relationship between the first voltage applied to the first electrode 105a and the second voltage applied to the second electrode 105b can be adjusted.

Hence, by adjusting the frequency, the relationship between the amount of sputtering of the first target 109a and the amount of sputtering of the second target 109b can be adjusted. Alternatively, by adjusting the frequency, the balance between the amount of sputtering of the first target 109a and the amount of sputtering of the second target 109b can be adjusted. This can adjust the relationship between the consumption amount of the first target 109a and the consumption amount of the second target 109b. Alternatively, this can adjust the balance between the consumption amount of the first target 109a and the consumption amount of the second target 109b. This arrangement is advantageous in, for example, setting the exchange timing of the first target 109a and the exchange timing of the second target 109b to the same timing and reducing the downtime of the plasma processing apparatus 1. It is also possible to adjust the thickness distribution of a film formed on the substrate 112 by adjusting the frequency.

The plasma processing apparatus 1 can further include a first impedance matching circuit 102 arranged between the first high-frequency power supply 101 and the first balun 103. The first high-frequency power supply 101 supplies a high frequency between the first electrode 105a and the second electrode 105b via the first impedance matching circuit 102, the first balun 103, and the first path PTH1. Alternatively, the first high-frequency power supply 101 supplies a high frequency between the first terminal 251 and the second terminal 252 of the main body 10 via the first impedance matching circuit 102 and the first balun 103. The first balun 103, the first electrode 105a, and the second electrode 105b form a first high-frequency supply unit configured to supply a high frequency to the internal space of the vacuum container 110.

The plasma processing apparatus 1 can include a second high-frequency power supply 301, and a second impedance matching circuit 302 arranged between the second high-frequency power supply 301 and the second balun 303. The second high-frequency power supply 301 supplies a high frequency between the first unbalanced terminal 401 and the second unbalanced terminal 402 of the second balun 303 via the second impedance matching circuit 302. The second high-frequency power supply 301 supplies a high frequency between the third electrode 141 and the fourth electrode 145 via the second impedance matching circuit 302, the second balun 303, and the blocking capacitor 304. Alternatively, the second high-frequency power supply 301 supplies a high frequency between the third terminal 451 and the fourth terminal 452 of the main body 10 via the second impedance matching circuit 302 and the second balun 303. The second balun 303, the third electrode 141, and the fourth electrode 145 form a second high-frequency supply unit configured to supply a high frequency to the internal space of the vacuum container 110.

Let Rp1−jXp1 be an impedance when the side of the first electrode 105a and the second electrode 105b (the side of the main body 10) is viewed from the side of the first balanced terminal 211 and the second balanced terminal 212 of the first balun 103 in a state in which plasma is generated in the internal space of the vacuum container 110 by supply of a high frequency from the first high-frequency power supply 101. In addition, let X1 be the reactance component (inductance component) of the impedance of a first coil 221 of the first balun 103. In this definition, satisfying 1.5≤X1/Rp1≤5000 is advantageous in stabilizing the potential of plasma formed in the internal space of the vacuum container 110. However, note that satisfying the condition 1.5≤X/Rp1≤5000 is not indispensable but an advantageous condition in the 30th embodiment. In the 30th embodiment, the balun 103 is provided, thereby making the potential of plasma stable as compared to a case in which the balun 103 is not provided. Additionally, the high-frequency power supply 101 capable of changing the frequency of the generated high frequency is provided, thereby adjusting the relationship between the amount of sputtering of the first target 109a and the amount of sputtering of the second target 109b.

Additionally, let Rp2−jXp2 be an impedance when the side of the third electrode 141 and the fourth electrode 145 (the side of the main body 10) is viewed from the side of the first balanced terminal 411 and the second balanced terminal 412 of the second balun 303 in a state in which plasma is generated in the internal space of the vacuum container 110 by supply of a high frequency from the second high-frequency power supply 301. In addition, let X2 be the reactance component (inductance component) of the impedance of the first coil 221 of the second balun 303. In this definition, satisfying 1.5≤X2/Rp2≤5000 is advantageous in stabilizing the potential of plasma formed in the internal space of the vacuum container 110. However, note that satisfying the condition 1.5≤X/Rp2≤5000 is not indispensable but an advantageous condition in the 30th embodiment.

Figure 43:
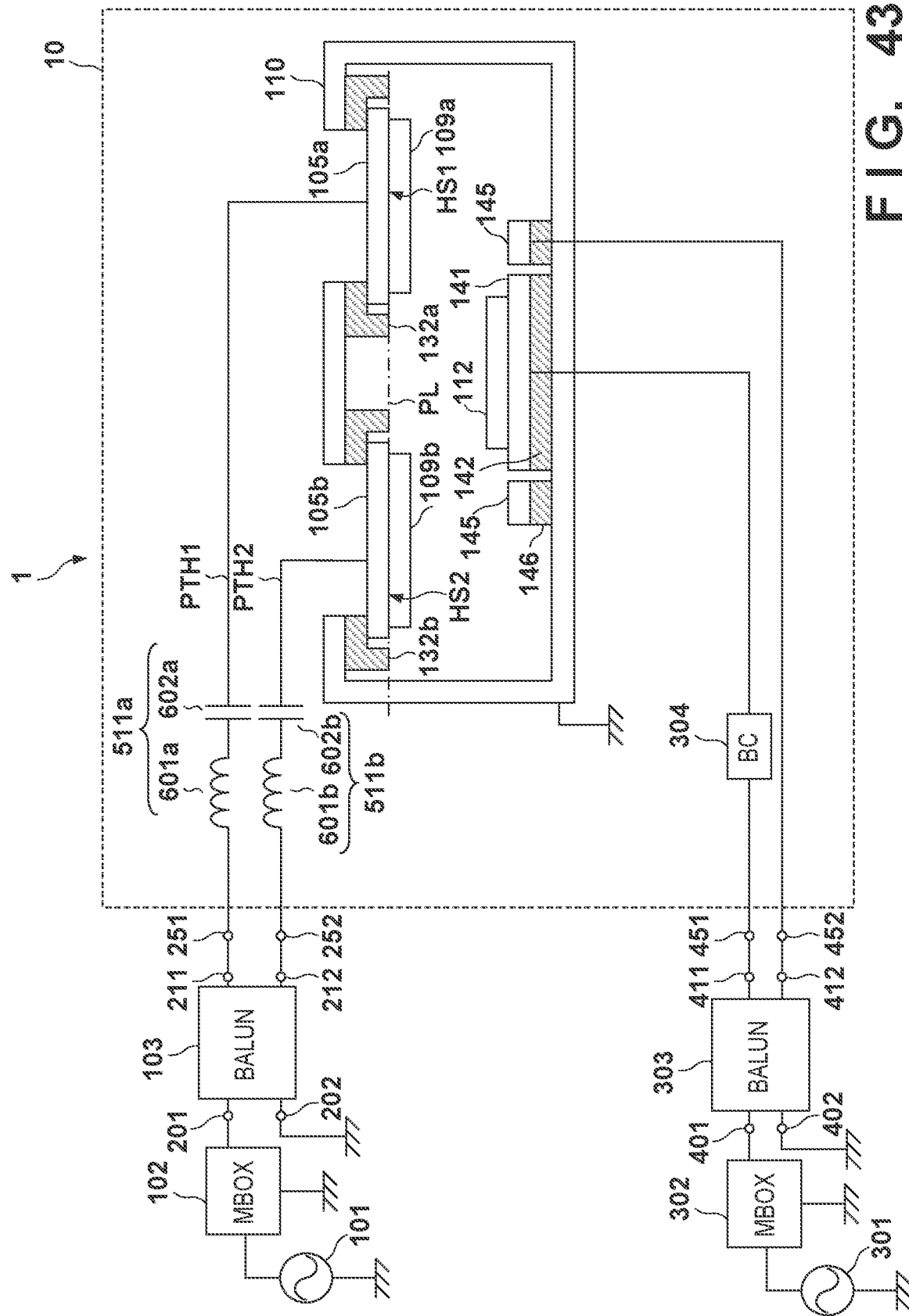
FIG. 43 is a view schematically showing the arrangement of a plasma processing apparatus 1 according to the 31st embodiment of the present invention.

The 31st to 34th embodiments that embody the plasma processing apparatus 1 according to the 29th embodiment will be described below with reference to FIGS. 43 to 48. FIG. 43 schematically shows the arrangement of a plasma processing apparatus 1 according to the 31st embodiment of the present invention. Matters that are not mentioned as the 31st embodiment can comply with the 30th embodiment. The plasma processing apparatus 1 according to the 31st embodiment includes at least one of a reactance 511a arranged on a first path PTH1, and a reactance 511b arranged on a second path PTH2. Here, the plasma processing apparatus 1 preferably includes both the reactance 511a arranged on the first path PTH1 and the reactance 511b arranged on the second path PTH2.

The first reactance 511a can include an inductor 601a and a capacitor 602a. The inductor 601a may be arranged between a first balanced terminal 211 (first terminal 251) and the capacitor 602a, or may be arranged between the capacitor 602a and a first electrode 105a. The second reactance 511b can include an inductor 601b and a capacitor 602b. The inductor 601b may be arranged between a second balanced terminal 212 (second terminal 252) and the capacitor 602b, or may be arranged between the capacitor 602b and a second electrode 105b.

Figure 47:
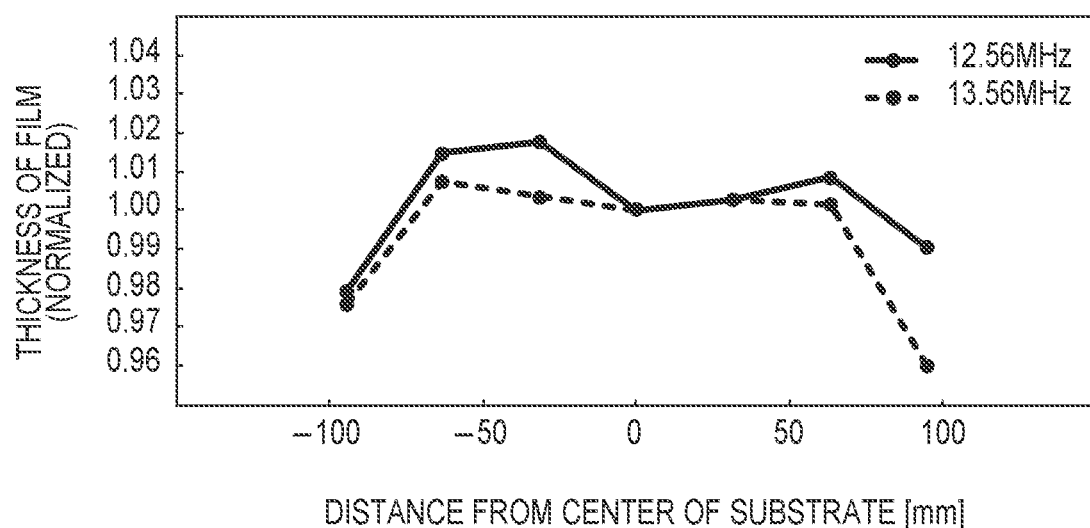
FIG. 47 is a view showing the normalized thickness distribution of a film formed on a substrate in a case in which the frequency of a high frequency generated by a high-frequency power supply is set to 12.56 MHz.

FIG. 47 shows the normalized thickness distribution of a film formed on a substrate 112 in a case in which the frequency of a high frequency generated by a high-frequency power supply 101 is set to 12.56 MHz in the plasma processing apparatus 1 according to the 31st embodiment. FIG. 47 shows the normalized thickness distribution of a film formed on the substrate 112 in a case in which the frequency of a high frequency generated by the high-frequency power supply 101 is set to 13.56 MHz in the plasma processing apparatus 1 according to the 31st embodiment. The abscissa represents a position in the horizontal direction (the direction parallel to the surface of the substrate 112) in FIG. 43, and represents the distance from the center of the substrate 112. If the frequency of the high frequency generated by the high-frequency power supply 101 is 12.56 MHz, the thickness distribution of the film is largely different between the left side and the right side of the center of the substrate 112. On the other hand, if the frequency of the high frequency generated by the high-frequency power supply 101 is 13.56 MHz, the thickness distribution of the film has high symmetry on the left side and the right side of the center of the substrate 112. A first voltage applied to the first electrode 105a and a second voltage applied to the second electrode 105b are in good balance more in the case in which the frequency of the high frequency generated by the high-frequency power supply 101 is 13.56 MHz than in the case in which the frequency of the high frequency generated by the high-frequency power supply 101 is 12.56 MHz.

Figure 48:
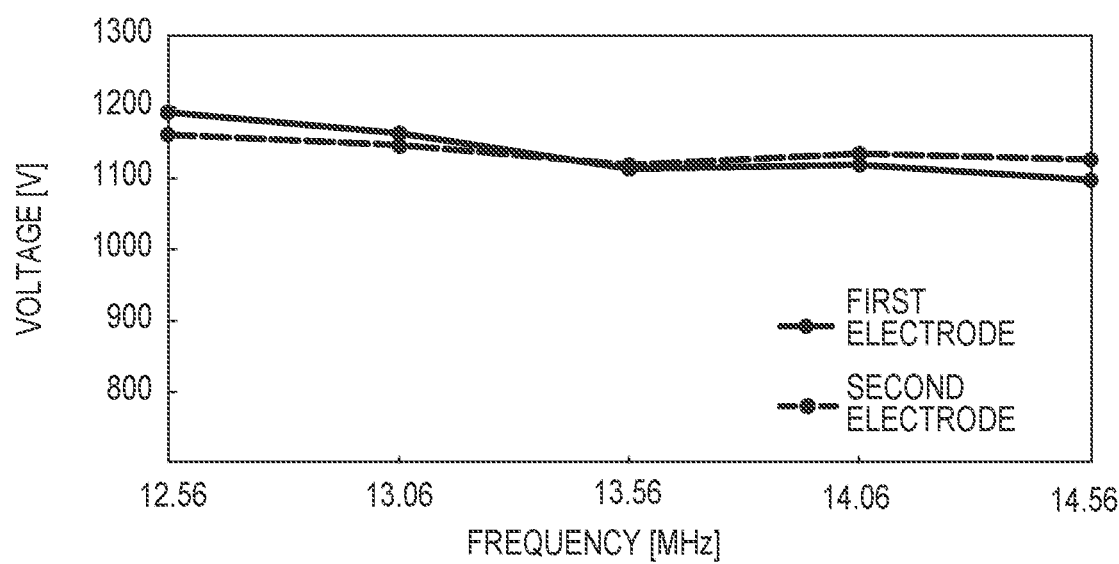
FIG. 48 is a view showing the voltage (first voltage) of a first electrode and the voltage (second voltage) of a second electrode in a case in which the frequency of a high frequency generated by a high-frequency power supply is changed.

FIG. 48 shows the voltage (first voltage) of the first electrode 105a and the voltage (second voltage) of the second electrode 105b in a case in which the frequency of the high frequency generated by the high-frequency power supply 101 is changed in the plasma processing apparatus 1 according to the 30th embodiment. By changing the frequency of the high frequency generated by the high-frequency power supply 101, the voltage (first voltage) of the first electrode 105a and the voltage (second voltage) of the second electrode 105b can be adjusted. Alternatively, by changing the frequency of the high frequency generated by the high-frequency power supply 101, the relationship between the voltage (first voltage) of the first electrode 105a and the voltage (second voltage) of the second electrode 105b can be adjusted. For example, the frequency of the high frequency generated by the high-frequency power supply 101 can be adjusted such that the voltage (first voltage) of the first electrode 105a and the voltage (second voltage) of the second electrode 105b become equal. This can make the amount of sputtering of a first target 109a and the amount of sputtering of a second target 109b equal. This is advantageous in, for example, setting the exchange timing of the first target 109a and the exchange timing of the second target 109b to the same timing and reducing the downtime of the plasma processing apparatus 1.

Figure 44:
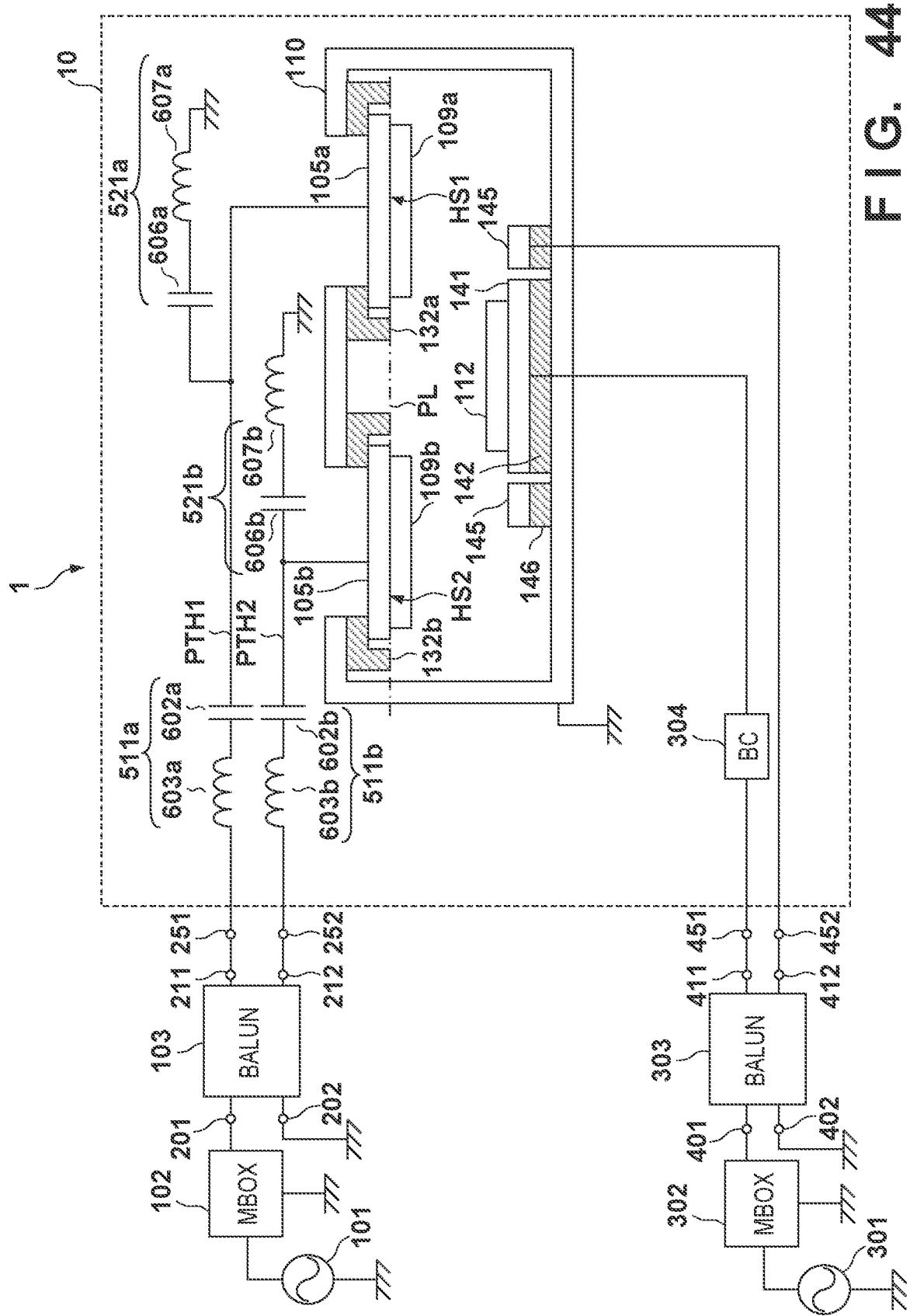
FIG. 44 is a view schematically showing the arrangement of a plasma processing apparatus 1 according to the 32nd embodiment of the present invention.

FIG. 44 schematically shows the arrangement of a plasma processing apparatus 1 according to the 32nd embodiment of the present invention. Matters that are not mentioned as the 32nd embodiment can comply with the 30th embodiment. The plasma processing apparatus 1 according to the 32nd embodiment includes at least one of a reactance 521a arranged between a first electrode 105a and ground, and a reactance 521*b* arranged between a second electrode 105*b* and ground. The reactance 521*a* can include, for example, an inductor 607*a* and a capacitor 606*a*. The reactance 521*b* can include, for example, an inductor 607*b* and a capacitor 606*b*.

The plasma processing apparatus 1 can further include a reactance 511*a* (in this example, an inductor 603*a* and a capacitor 602*a*) arranged on a first path PTH1, and a reactance 511*b* (in this example, an inductor 603*b* and a capacitor 602*b*) arranged on a second path PTH2.

Figure 45:
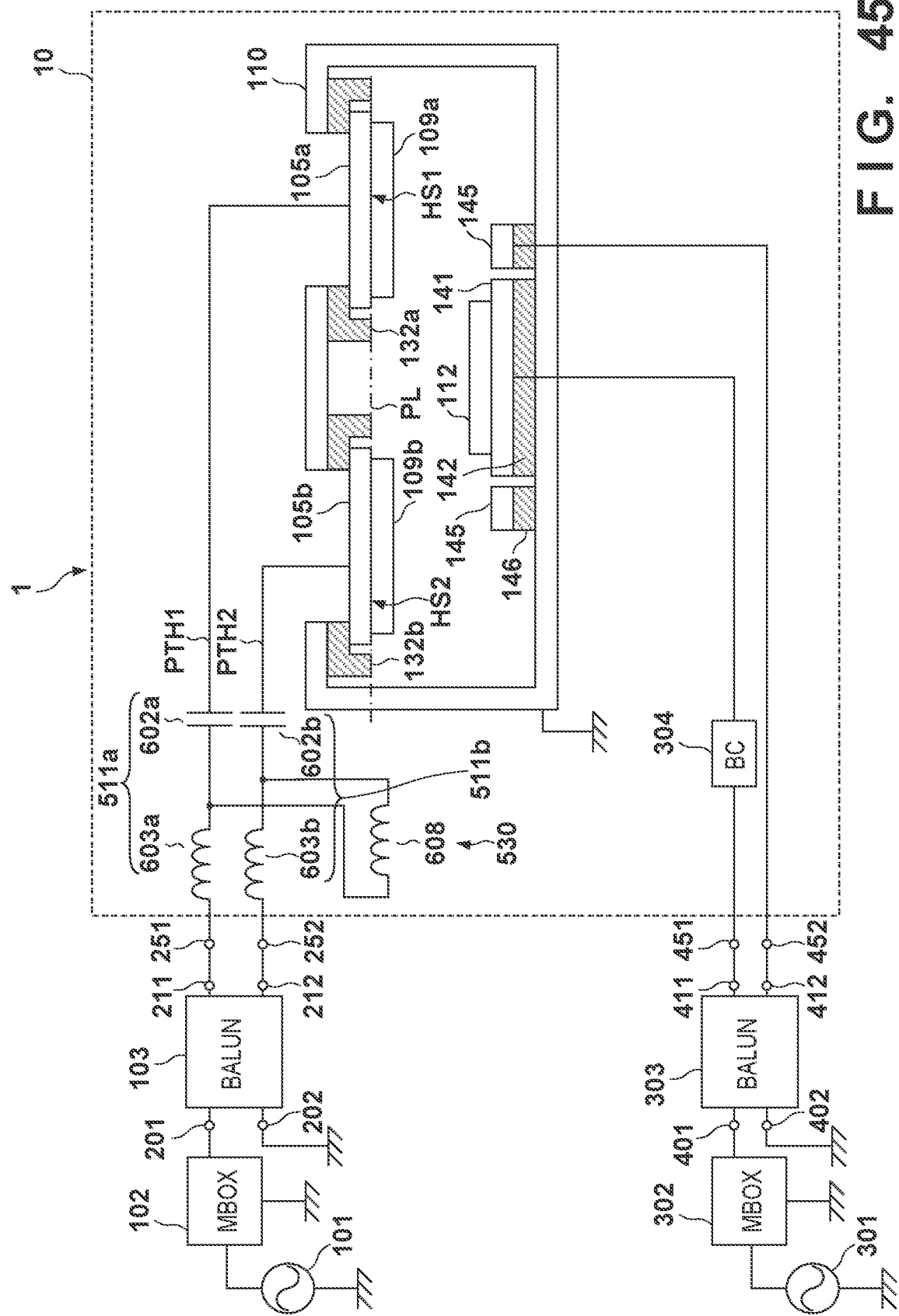
FIG. 45 is a view schematically showing the arrangement of a plasma processing apparatus 1 according to the 33th embodiment of the present invention.

FIG. 45 schematically shows the arrangement of a plasma processing apparatus 1 according to the 33rd embodiment of the present invention. Matters that are not mentioned as the 33rd embodiment can comply with the 30th embodiment. The plasma processing apparatus 1 according to the 33rd embodiment includes an inductor 608 serving as a reactance 530 that connects a first path PTH1 and a second path PTH2. The plasma processing apparatus 1 can further include a reactance 511*a* (in this example, an inductor 603*a* and a capacitor 602*a*) arranged on the first path PTH1, and a reactance 511*b* (in this example, an inductor 603*b* and a capacitor 602*b*) arranged on the second path PTH2.

Figure 46:
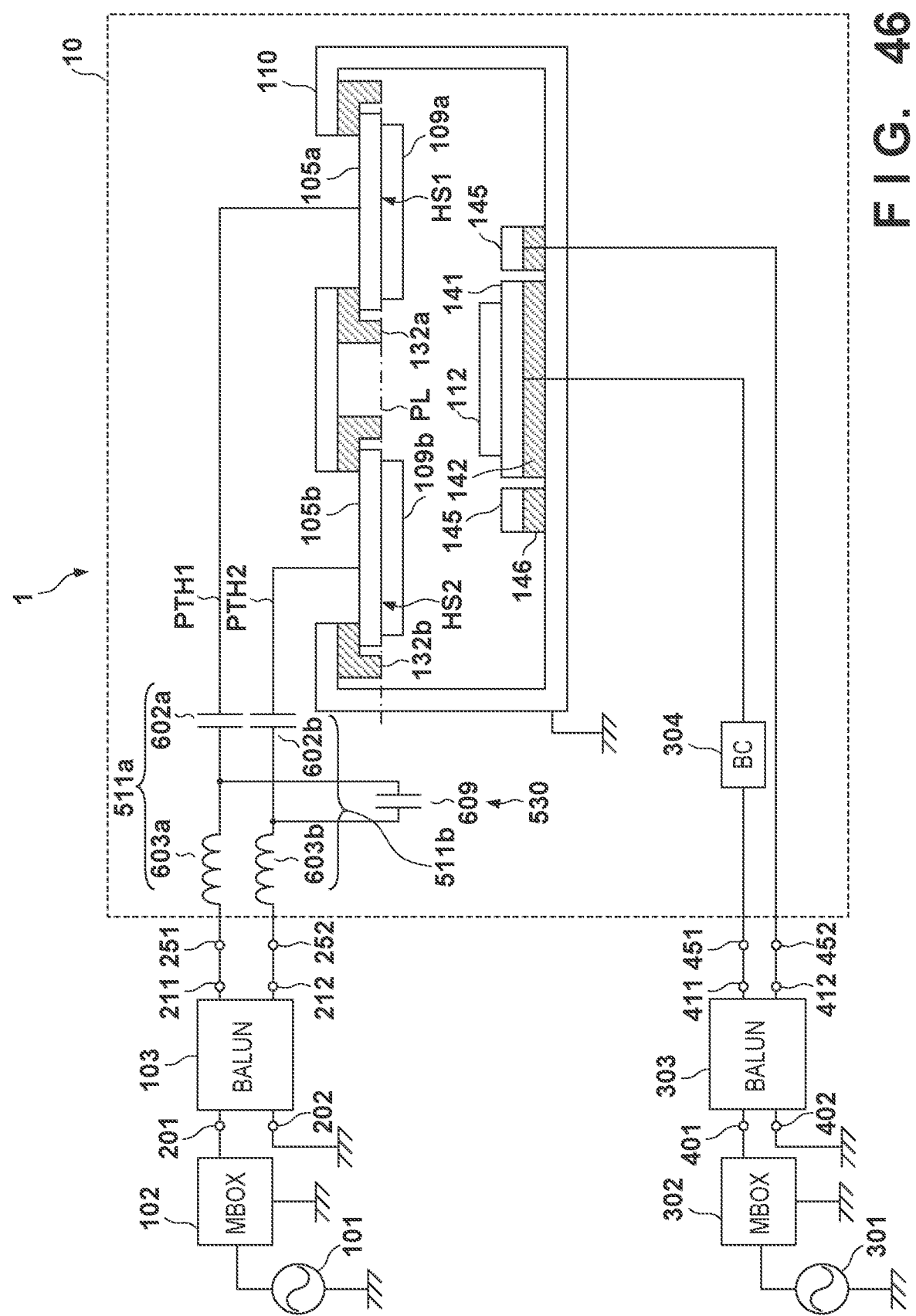
FIG. 46 is a view schematically showing the arrangement of a plasma processing apparatus 1 according to the 34th embodiment of the present invention.

FIG. 46 schematically shows the arrangement of a plasma processing apparatus 1 according to the 33rd embodiment of the present invention. Matters that are not mentioned as the 33rd embodiment can comply with the 30th embodiment. The plasma processing apparatus 1 according to the 33rd embodiment includes a capacitor 609 serving as a variable reactance 530 that connects a first path PTH1 and a second path PTH2. The plasma processing apparatus 1 can further include a reactance 511*a* (in this example, an inductor 603*a* and a capacitor 602*a*) arranged on the first path PTH1, and a reactance 511*b* (in this example, an inductor 603*b* and a capacitor 602*b*) arranged on the second path PTH2.

Note that in the 30th to 33rd embodiments described with reference to FIGS. 43 to 48, electrodes are arranged on the facing surfaces of targets 109*a* and 109*b*. However, these are not limited to the electrodes. A cylindrical substrate rotation holder in a plasma apparatus of a so-called carousel type (for example, Japanese Patent Laid-Open Nos. 2003-155556 and 62-133065) or a rectangular substrate tray in a plasma apparatus of a so-called inline type (for example, Japanese Patent No. 5824072 and Japanese Patent Laid-Open No. 2011-144450) may be arranged.

Figure 49:
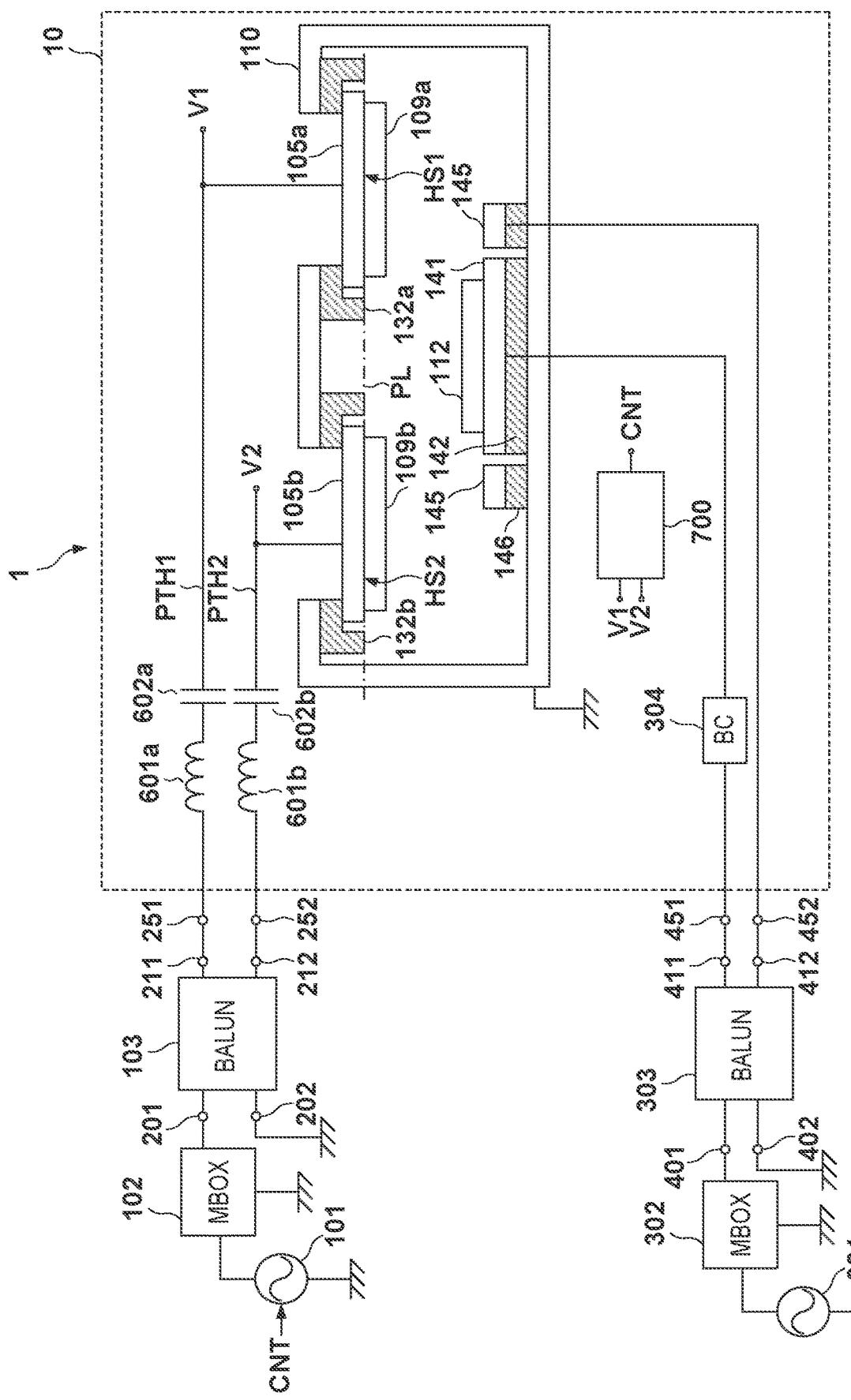
FIG. 49 is a view schematically showing the arrangement of a plasma processing apparatus 1 according to the 35th embodiment of the present invention.

An operation of adjusting the frequency of a high frequency generated by the high-frequency power supply 101 based on a first voltage V1 of a first electrode 105*a* and a second voltage V2 of a second electrode 105*b* will be described below with reference to FIGS. 49 to 53. FIG. 49 schematically shows the arrangement of a plasma processing apparatus 1 according to the 35th embodiment of the present invention. The plasma processing apparatus 1 according to the 35th embodiment has an arrangement in which a controller 700 is added to the plasma processing apparatus according to the 31st embodiment shown in FIG. 43. The controller 700 adjusts the frequency of a high frequency generated by a high-frequency power supply 101 based on a first voltage V1 of a first electrode 105*a* and a second voltage V2 of a second electrode 105*b* such that, for example, the first voltage V1 and the second voltage V2 become equal. For example, based on the first voltage V1 of the first electrode 105*a* and the second voltage V2 of the second electrode 105*b*, the controller 700 generates an instruction value CNT that adjusts the frequency of the high frequency generated by the high-frequency power supply 101 such that the value of an adjustment reactance changes. The instruction value CNT is supplied to the high-frequency power supply 101. The high-frequency power supply 101 changes the frequency of the high frequency generated by itself in accordance with the instruction value CNT. The controller 700 can include a measurement unit configured to measure the first voltage V1 that is the voltage of the first electrode 105*a* and the second voltage V2 that is the voltage of the second electrode 105*b*. Alternatively, for such measurement, a unit may be provided separately from the controller 700.

Figure 50:
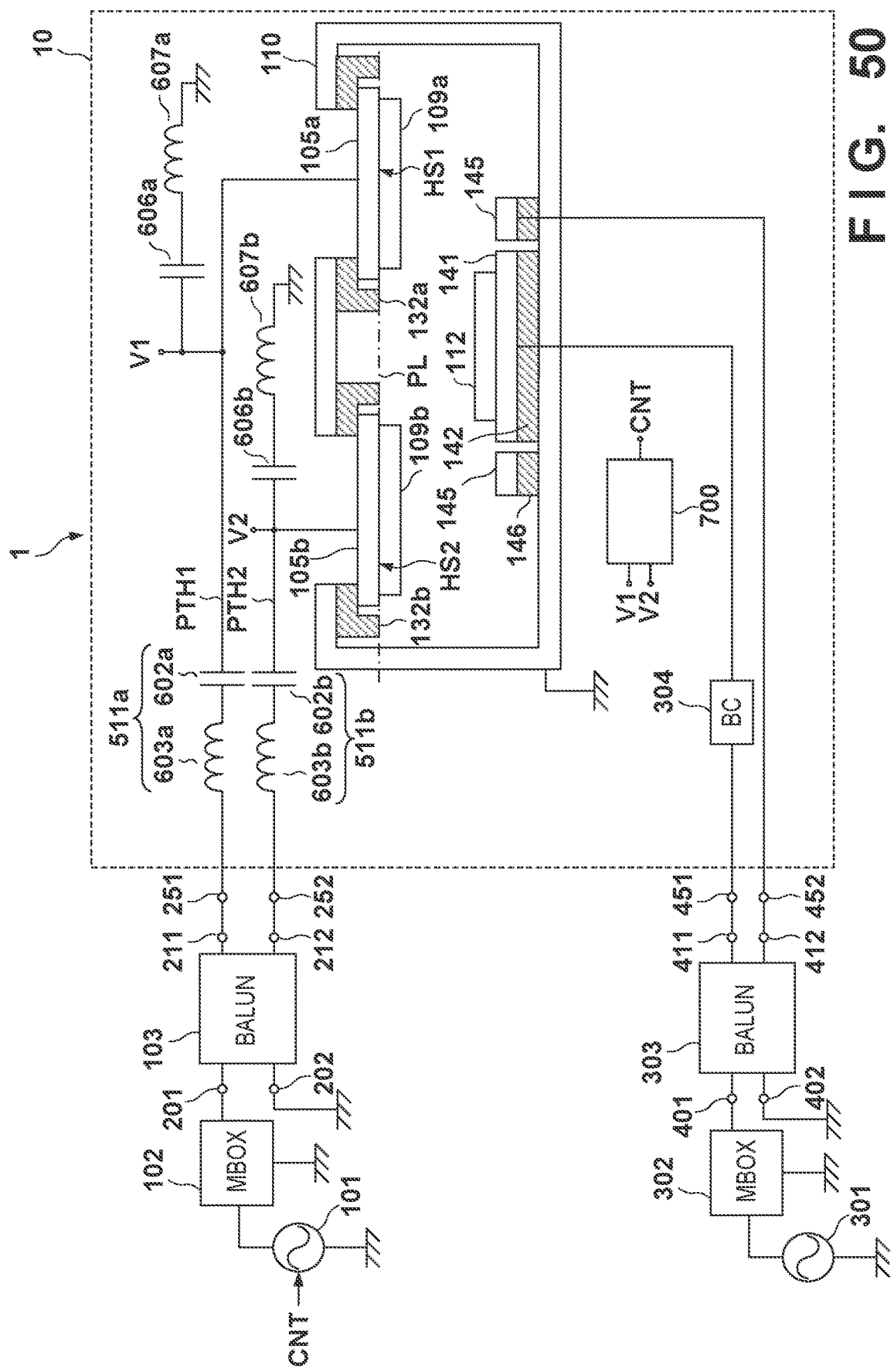
FIG. 50 is a view schematically showing the arrangement of a plasma processing apparatus 1 according to the 36th embodiment of the present invention.

FIG. 50 schematically shows the arrangement of a plasma processing apparatus 1 according to the 36th embodiment of the present invention. The plasma processing apparatus 1 according to the 36th embodiment has an arrangement in which a controller 700 is added to the plasma processing apparatus according to the 32nd embodiment shown in FIG. 44. The controller 700 adjusts the frequency of a high frequency generated by a high-frequency power supply 101 based on a first voltage V1 of a first electrode 105*a* and a second voltage V2 of a second electrode 105*b* such that, for example, the first voltage V1 and the second voltage V2 become equal. For example, based on the first voltage V1 of the first electrode 105*a* and the second voltage V2 of the second electrode 105*b*, the controller 700 generates an instruction value CNT that adjusts the frequency of the high frequency generated by the high-frequency power supply 101 such that the value of an adjustment reactance changes. The instruction value CNT is supplied to the high-frequency power supply 101. The high-frequency power supply 101 changes the frequency of the high frequency generated by itself in accordance with the instruction value CNT. The controller 700 can include a measurement unit configured to measure the first voltage V1 that is the voltage of the first electrode 105*a* and the second voltage V2 that is the voltage of the second electrode 105*b*. Alternatively, for such measurement, a unit may be provided separately from the controller 700.

Figure 51:
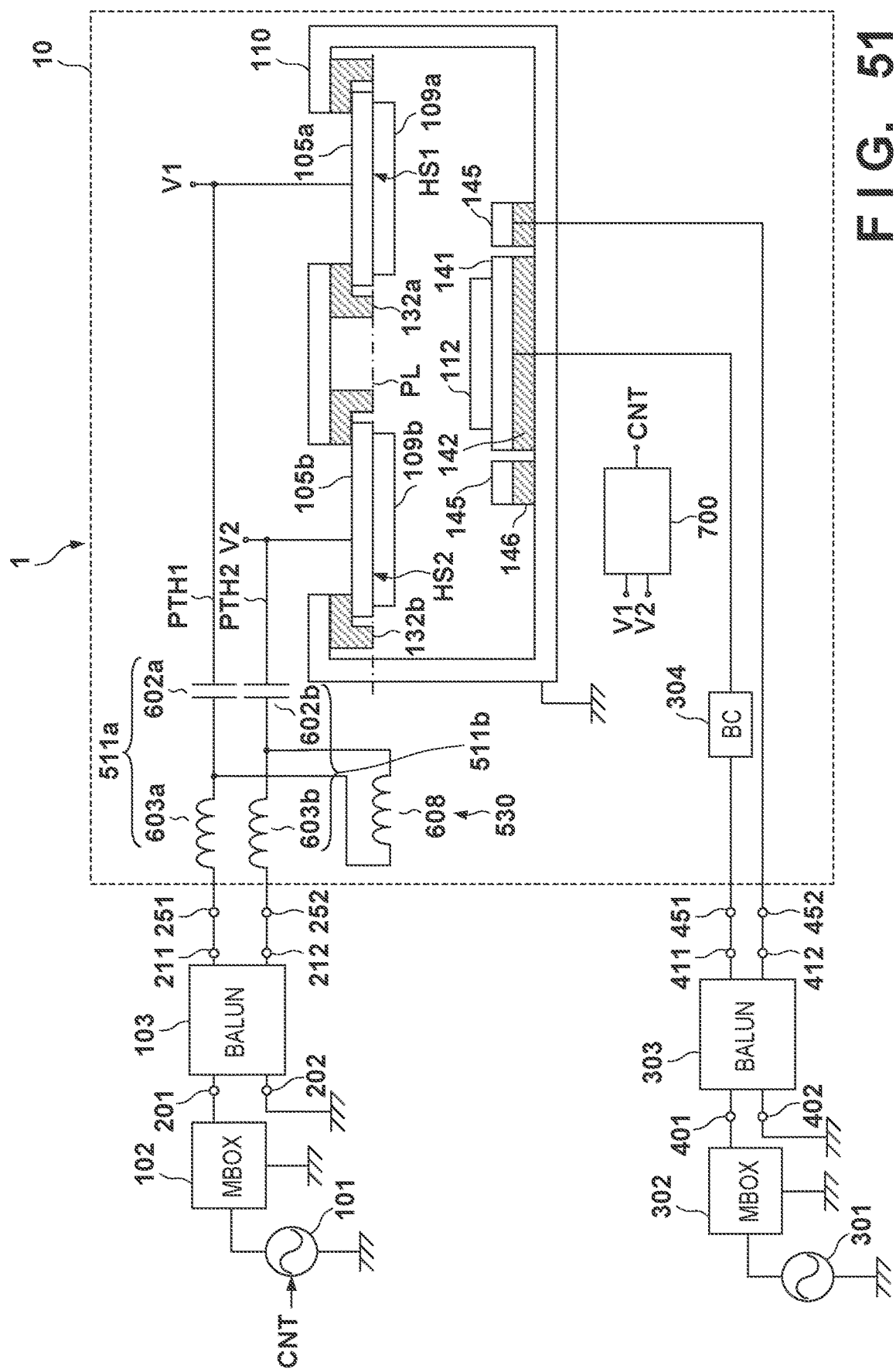
FIG. 51 is a view schematically showing the arrangement of a plasma processing apparatus 1 according to the 37th embodiment of the present invention.

FIG. 51 schematically shows the arrangement of a plasma processing apparatus 1 according to the 37th embodiment of the present invention. The plasma processing apparatus 1 according to the 37th embodiment has an arrangement in which a controller 700 is added to the plasma processing apparatus according to the 33rd embodiment shown in FIG. 45. The controller 700 adjusts the frequency of a high frequency generated by a high-frequency power supply 101 based on a first voltage V1 of a first electrode 105*a* and a second voltage V2 of a second electrode 105*b* such that, for example, the first voltage V1 and the second voltage V2 become equal. For example, based on the first voltage V1 of the first electrode 105*a* and the second voltage V2 of the second electrode 105*b*, the controller 700 generates an instruction value CNT that adjusts the frequency of the high frequency generated by the high-frequency power supply 101 such that the value of an adjustment reactance changes. The instruction value CNT is supplied to the high-frequency power supply 101. The high-frequency power supply 101 changes the frequency of the high frequency generated by itself in accordance with the instruction value CNT. The controller 700 can include a measurement unit configured to measure the first voltage V1 that is the voltage of the first electrode 105*a* and the second voltage V2 that is the voltage of the second electrode 105*b*. Alternatively, for such measurement, a unit may be provided separately from the controller 700.

Figure 52:
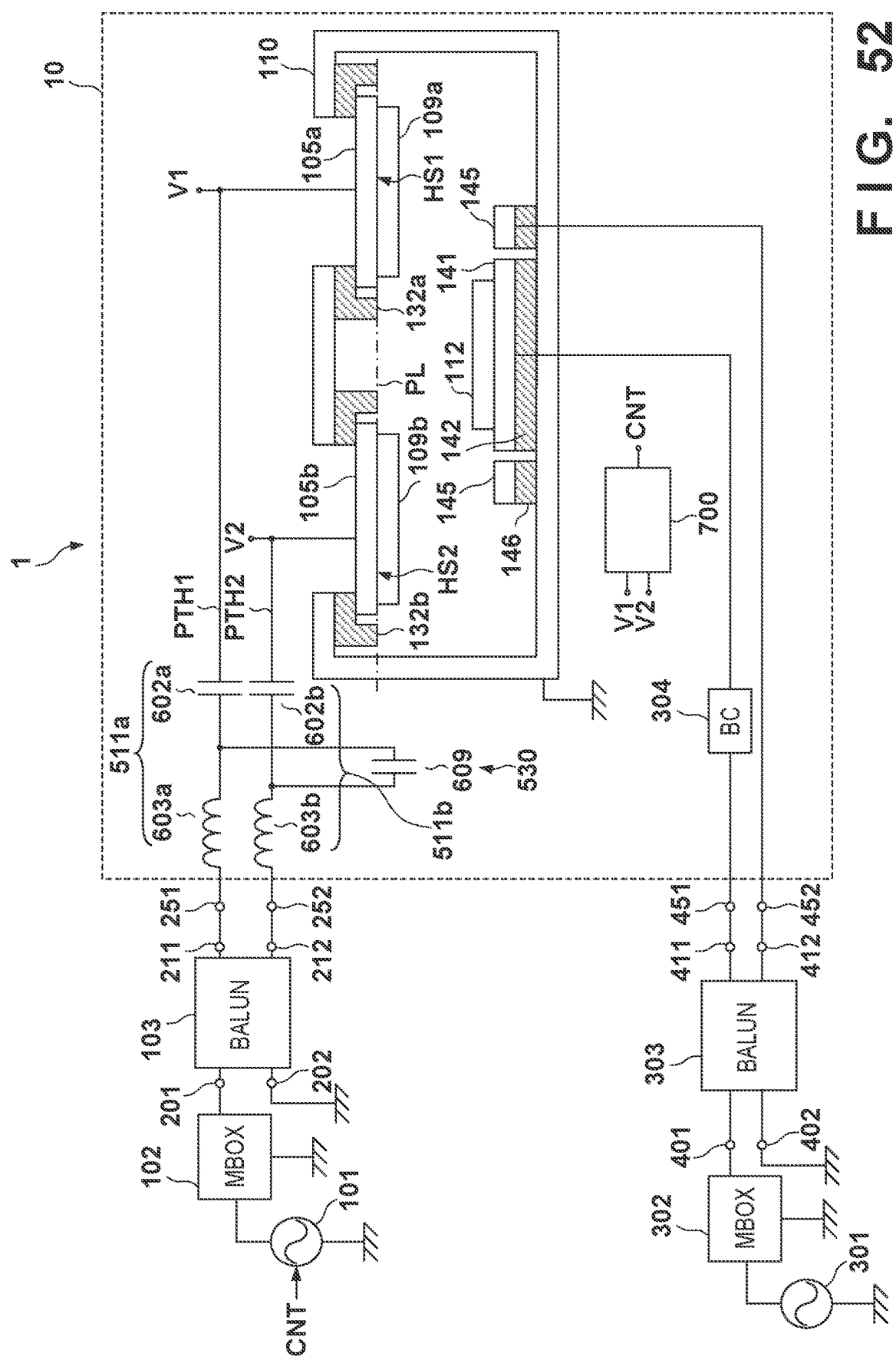
FIG. 52 is a view schematically showing the arrangement of a plasma processing apparatus 1 according to the 38th embodiment of the present invention.

FIG. 52 schematically shows the arrangement of a plasma processing apparatus 1 according to the 38th embodiment of the present invention. The plasma processing apparatus 1 according to the 38th embodiment has an arrangement in which a controller 700 is added to the plasma processing apparatus according to the 34th embodiment shown in FIG. 46. The controller 700 adjusts the frequency of a high frequency generated by a high-frequency power supply 101 based on a first voltage V1 of a first electrode 105a and a second voltage V2 of a second electrode 105b such that, for example, the first voltage V1 and the second voltage V2 become equal. For example, based on the first voltage V1 of the first electrode 105a and the second voltage V2 of the second electrode 105b, the controller 700 generates an instruction value CNT that adjusts the frequency of the high frequency generated by the high-frequency power supply 101 such that the value of an adjustment reactance changes. The instruction value CNT is supplied to the high-frequency power supply 101. The high-frequency power supply 101 changes the frequency of the high frequency generated by itself in accordance with the instruction value CNT. The controller 700 can include a measurement unit configured to measure the first voltage V1 that is the voltage of the first electrode 105a and the second voltage V2 that is the voltage of the second electrode 105b. Alternatively, for such measurement, a unit may be provided separately from the controller 700.

Figure 53:
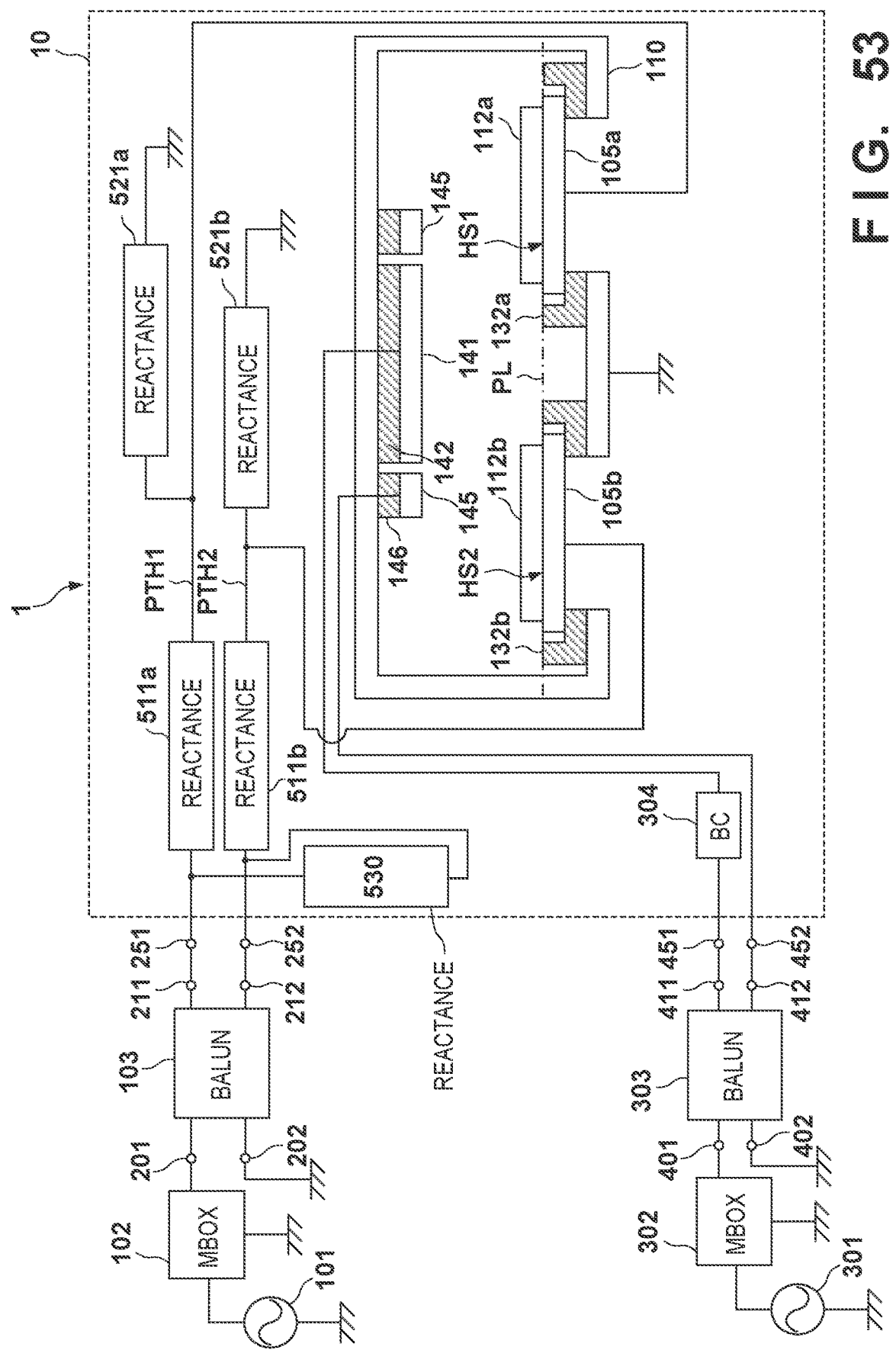
FIG. 53 is a view schematically showing the arrangement of a plasma processing apparatus 1 according to the 39th embodiment of the present invention.

FIG. 53 schematically shows the arrangement of a plasma processing apparatus 1 according to the 39th embodiment of the present invention. The plasma processing apparatus 1 according to the 39th embodiment can operate as an etching apparatus for etching substrates 112a and 112b. The plasma processing apparatus 1 according to the 39th embodiment is different from the plasma processing apparatus 1 according to the 30th embodiment in that a first electrode 105a and a second electrode 105b hold the first substrate 112a and the second substrate 112b as etching targets, respectively, and a third electrode 141 does not hold a substrate, and can have an arrangement similar to the plasma processing apparatus 1 according to the 30th embodiment concerning the remaining points.

In one arrangement example, as an adjustment reactance that affects the relationship between a first voltage applied to the first electrode 105a and a second voltage applied to the second electrode 105b, the plasma processing apparatus 1 includes at least one of (a) a reactance 511a arranged on a first path PTH1 that connects a first balanced terminal 211 and the first electrode 105a, (b) a reactance 521a arranged between the first electrode 105a and ground, (c) a reactance 511b arranged on a second path PTH2 that connects a second balanced terminal 212 and the second electrode 105b, (d) a reactance 521b arranged between the second electrode 105b and ground, and (e) a reactance 530 that connects the first path PTH1 and the second path PTH2.

By adjusting the frequency of a high frequency generated by a high-frequency power supply 101, the etching amount distribution of the first substrate 112a and the etching amount distribution of the second substrate 112b can be adjusted. Alternatively, by adjusting the frequency of a high frequency generated by the high-frequency power supply 101, the etching amount distribution of the first substrate 112a and the etching amount distribution of the second substrate 112b can be made equal.

Note that in the 35th to 39th embodiments described with reference to FIGS. 49 to 53, electrodes are arranged on the facing surfaces of targets 109a and 109b. However, these are not limited to the electrodes. A cylindrical substrate rotation holder in a plasma apparatus of a so-called carousel type (for example, Japanese Patent Laid-Open Nos. 2003-155556 and 62-133065) or a rectangular substrate tray in a plasma apparatus of a so-called inline type (for example, Japanese Patent No. 5824072 and Japanese Patent Laid-Open No. 2011-144450) may be arranged.

In the 35th to 39th embodiments described with reference to FIGS. 49 to 53, the controller 700 adjusts the frequency of a high frequency generated by the high-frequency power supply 101 based on the first voltage V1 of the first electrode 105a and the second voltage V2 of the second electrode 105b. In place of this arrangement, the controller 700 may be configured to adjust the frequency of a high frequency generated by the high-frequency power supply 101 based on a plasma intensity near the first electrode 105a and a plasma intensity near the second electrode 105b. The plasma intensity near the first electrode 105a can be detected by, for example, a photoelectric conversion device. Similarly, the plasma intensity near the second electrode 105b can be detected by, for example, a photoelectric conversion device. The controller 700 can be configured to adjust the frequency of a high frequency generated by the high-frequency power supply 101 based on the plasma intensity near the first electrode 105a and the plasma intensity near the second electrode 105b such that, for example, the plasma intensity near the first electrode 105a and the plasma intensity near the second electrode 105b become equal.

A plasma processing method according to the 40th embodiment of the present invention will be described next. The plasma processing method according to the 40th embodiment processes a substrate 112 in a plasma processing apparatus 1 according to any one of the 30th to 39th embodiments. The plasma processing method can include a step of adjusting the frequency of a high frequency generated by a high-frequency power supply 101 to adjust the relationship between a first voltage applied to a first electrode 105a and a second voltage applied to a second electrode 105b, and a step of processing the substrate 112 after the step of adjusting. The processing can include a step of forming a film on the substrate 112 by sputtering, or a step of etching the substrate 112.

Figure 54:
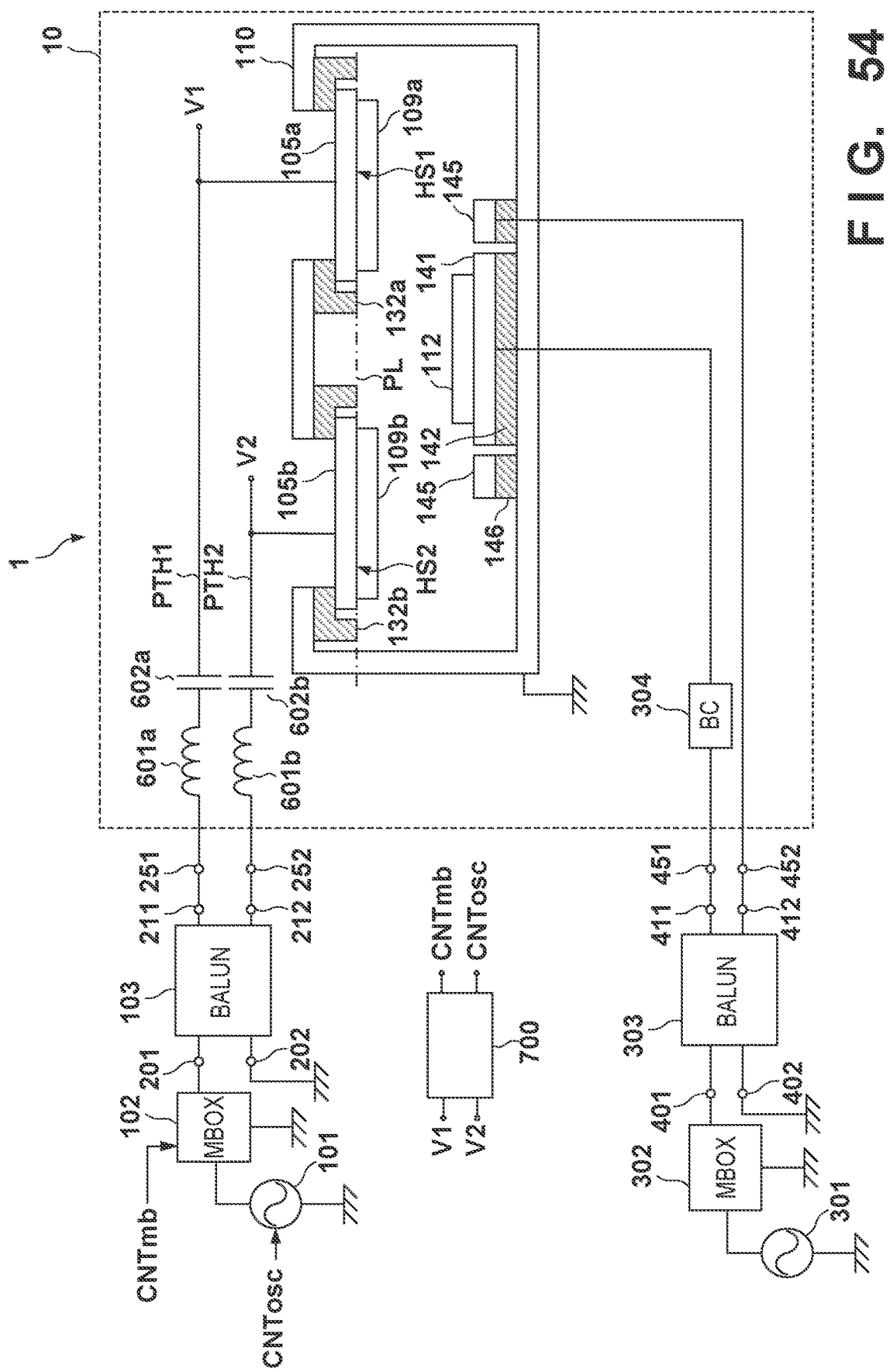
FIG. 54 is a view schematically showing the arrangement of a plasma processing apparatus 1 according to the 41st embodiment of the present invention.

FIG. 54 schematically shows the arrangement of a plasma processing apparatus 1 according to the 41st embodiment of the present invention. The plasma processing apparatus 1 according to the 41st embodiment has an arrangement in which a controller 700 is added to the plasma processing apparatus according to the 31st embodiment shown in FIG. 43. The controller 700 adjusts the frequency of a high frequency generated by a high-frequency power supply 101 based on a first voltage V1 of a first electrode 105a and a second voltage V2 of a second electrode 105b such that, for example, the first voltage V1 obtains a first target value, and the second voltage V2 obtains a second target value. For example, based on the first voltage V1 of the first electrode 105a and the second voltage V2 of the second electrode 105b, the controller 700 generates an instruction value CNTosc that adjusts the frequency of the high frequency generated by the high-frequency power supply 101 to change the value of an adjustment reactance such that the first voltage V1 obtains the first target value, and the second voltage V2 obtains the second target value. The instruction value CNTosc is supplied to the high-frequency power supply 101. The high-frequency power supply 101 changes the frequency of the high frequency generated by itself in accordance with the instruction value CNTosc. The controller 700 can include a measurement unit configured to measure the first voltage V1 that is the voltage of the first electrode 105a and the second voltage V2 that is the voltage of the second electrode 105b. Alternatively, for such measurement, a unit may be provided separately from the controller 700.

The controller 700 generates an instruction value CNTmb that controls an impedance matching circuit 102. When igniting plasma, the controller 700 controls the impedance matching circuit 102 such that the impedance matching circuit 102 obtains an impedance for ignition of plasma. In addition, the controller 700 changes the impedance of the impedance matching circuit 102 such that the plasma stabilizes after ignition of plasma. In a state in which the plasma is stable, the impedance of the impedance matching circuit 102 matches an impedance Rp−jXp (an impedance when the side of the first electrode 105a and the second electrode 105b (the side of a main body 10) is viewed from the side of a first balanced terminal 211 and a second balanced terminal 212) on the side of the main body 10 when plasma is generated. The impedance of the impedance matching circuit 102 at this time is Rp+jXp.

The controller 700 can be formed by, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components. The program can be provided by storing it in a memory medium (computer-readable memory medium) or via a communication network.

FIG. 40 shows the operation of the plasma processing apparatus 1 according to the 39th embodiment. This operation can be controlled by the controller 700. In step S401, the controller 700 supplies the instruction value CNTmb to the impedance matching circuit 102 such that the impedance of the impedance matching circuit 102 is set or changed to the impedance for ignition of plasma. The impedance matching circuit 102 sets or changes the impedance of its own in accordance with the instruction value CNTmb.

After that, in step S402 (ignition step), in a state in which the impedance of the impedance matching circuit 102 is set to the impedance for ignition of plasma, the controller 700 activates (ON) a high-frequency power supply 402 to generate a high frequency. The high frequency generated by the high-frequency power supply 402 is supplied to the first electrode 105a and the second electrode 105b via the impedance matching circuit 102, a balun 103, and the adjustment reactances (variable inductors 601a and 601b and capacitors 602a and 602b). Plasma is thus ignited.

In step S403 (matching step), the controller 700 changes the impedance of the impedance matching circuit 102 such that plasma stabilizes after ignition of plasma. More specifically, in step S403, the controller 700 decides the instruction value CNTmb such that the impedance at which plasma stabilizes is set to the impedance matching circuit 700, and supplies the instruction value CNTmb to the impedance matching circuit 700. The impedance matching circuit 102 sets or changes the impedance of its own in accordance with the instruction value CNTmb.

After that, in step S404, the controller 700 acquires the first voltage V1 of the first electrode 105a and the second voltage V2 of the second electrode 105b. After that, in step S405 (adjustment step), based on the first voltage V1 of the first electrode 105a and the second voltage V2 of the second electrode 105b, the controller 700 generates the instruction value CNTosc to adjust the values of the variable inductors 601a and 601b each serving as a variable reactance such that the first voltage V1 obtains the first target value, and the second voltage V2 obtains the second target value. The instruction value CNTosc is supplied to the high-frequency power supply 402. The high-frequency power supply 101 changes the frequency of the high frequency generated by itself in accordance with the instruction value CNTosc.

Figure 59:
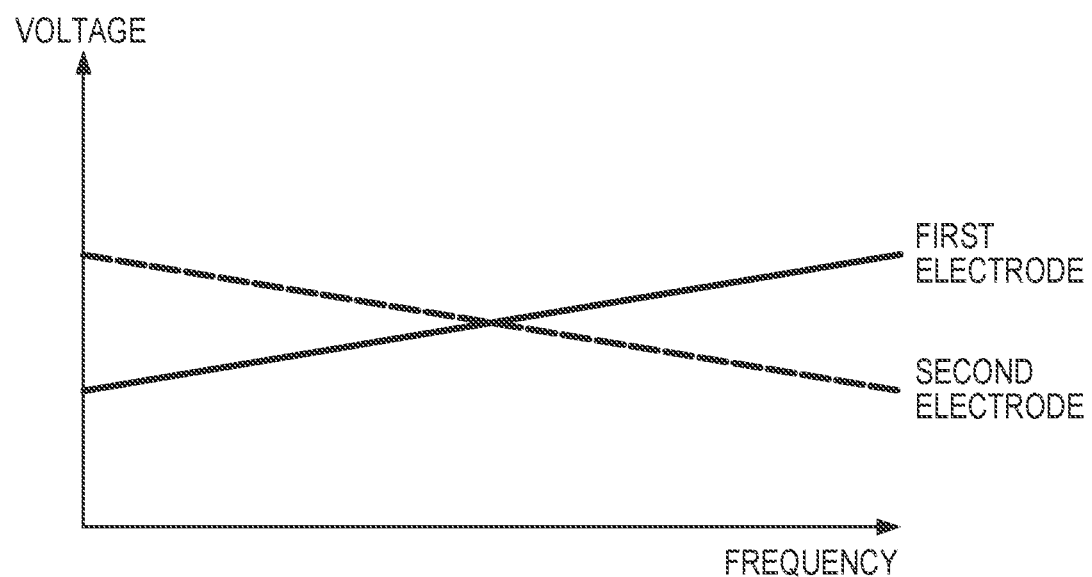
FIG. 59 is a view showing the relationship between the frequency of a high frequency generated by a high-frequency power supply and the voltages of a first electrode and a second electrode.

FIG. 59 shows the relationship between the frequency of the high frequency generated by the high-frequency power supply 101 and the voltages of the first electrode 105a and the second electrode 105b. This reactance corresponds to −XP described above. As shown in FIG. 59, the magnitude relationship between the voltages of the first electrode 105a and the second electrode 105b is reversed when the reactance of the adjustment reactance is changed by changing the frequency of the high frequency generated by the high-frequency power supply 101. In other words, the change curves of the voltages of the first electrode 105a and the second electrode 105b to the change of the frequency of the high frequency generated by the high-frequency power supply 101 exhibit characteristics crossing each other.

The characteristics shown in FIG. 59 can be decided by, for example, experiments or calculations in advance. In this case, in step S405, based on the characteristics, the first voltage V1 of the first electrode 105a, and the second voltage V2 of the second electrode 105b, the controller 700 can generate the instruction value CNTosc that adjusts the frequency of the high frequency generated by the high-frequency power supply 101 such that the first voltage V1 obtains the first target value, and the second voltage V2 obtains the second target value. If the characteristics shown in FIG. 59 are not decided in advance, in step S405, the controller 700 can finely adjust the instruction value CNTosc based on the first voltage V1 of the first electrode 105a and the second voltage V2 of the second electrode 105b.

After that, in step S407, the controller 700 acquires the first voltage V1 of the first electrode 105a and the second voltage V2 of the second electrode 105b. After that, in step S408, the controller 700 determines whether the first voltage V1 obtains the first target value, and the second voltage V2 obtains the second target value. If the first voltage V1 obtains the first target value, and the second voltage V2 obtains the second target value, the process advances to step S409. Otherwise, the process returns to step S405. In step S409 (processing step), the controller 700 controls to process the substrate 112. This control can include, for example, opening/closing a shutter (not shown) arranged between the target 109a and the substrate 112 and a shutter (not shown) arranged between the target 109b and the substrate 112. The processing shown in FIG. 40 may be executed manually.

Figure 55:
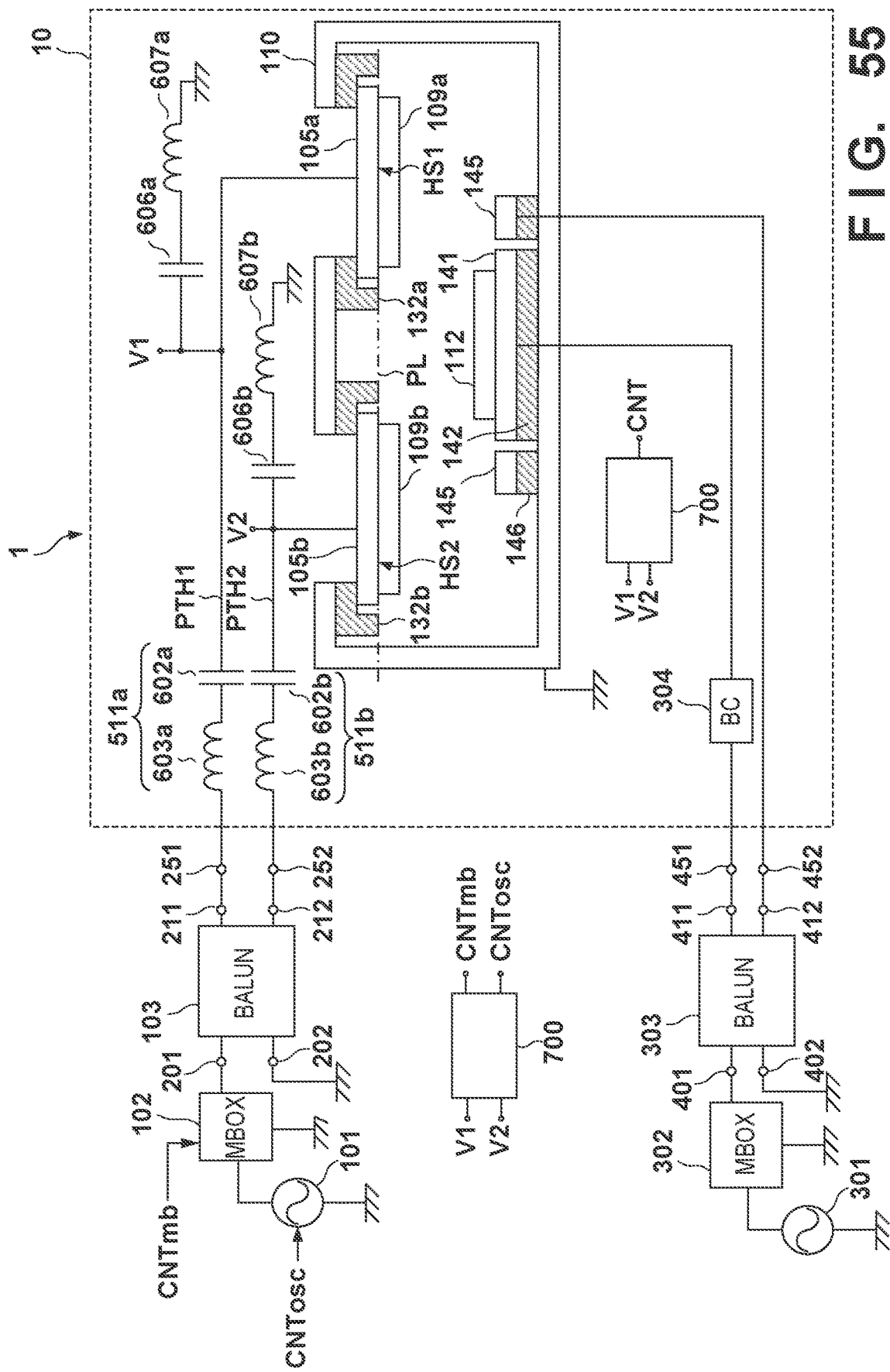
FIG. 55 is a view schematically showing the arrangement of a plasma processing apparatus 1 according to the 42nd embodiment of the present invention.

FIG. 55 schematically shows the arrangement of a plasma processing apparatus 1 according to the 42nd embodiment of the present invention. The plasma processing apparatus 1 according to the 42nd embodiment has an arrangement in which a controller 700 is added to the plasma processing apparatus according to the 32nd embodiment shown in FIG. 44. Matters that are not mentioned as the 42nd embodiment can comply with the 41st embodiment. The controller 700 adjusts the frequency of a high frequency generated by a high-frequency power supply 101 based on a first voltage V1 of a first electrode 105a and a second voltage V2 of a second electrode 105b such that, for example, the first voltage V1 obtains a first target value, and the second voltage V2 obtains a second target value. For example, based on the first voltage V1 of the first electrode 105a and the second voltage V2 of the second electrode 105b, the controller 700 generates an instruction value CNTosc that adjusts the frequency of the high frequency generated by the high-frequency power supply 101 to change the value of an adjustment reactance. The instruction value CNTosc is supplied to the high-frequency power supply 101. The high-frequency power supply 101 changes the frequency of the high frequency generated by itself in accordance with the instruction value CNTosc.

Figure 56:
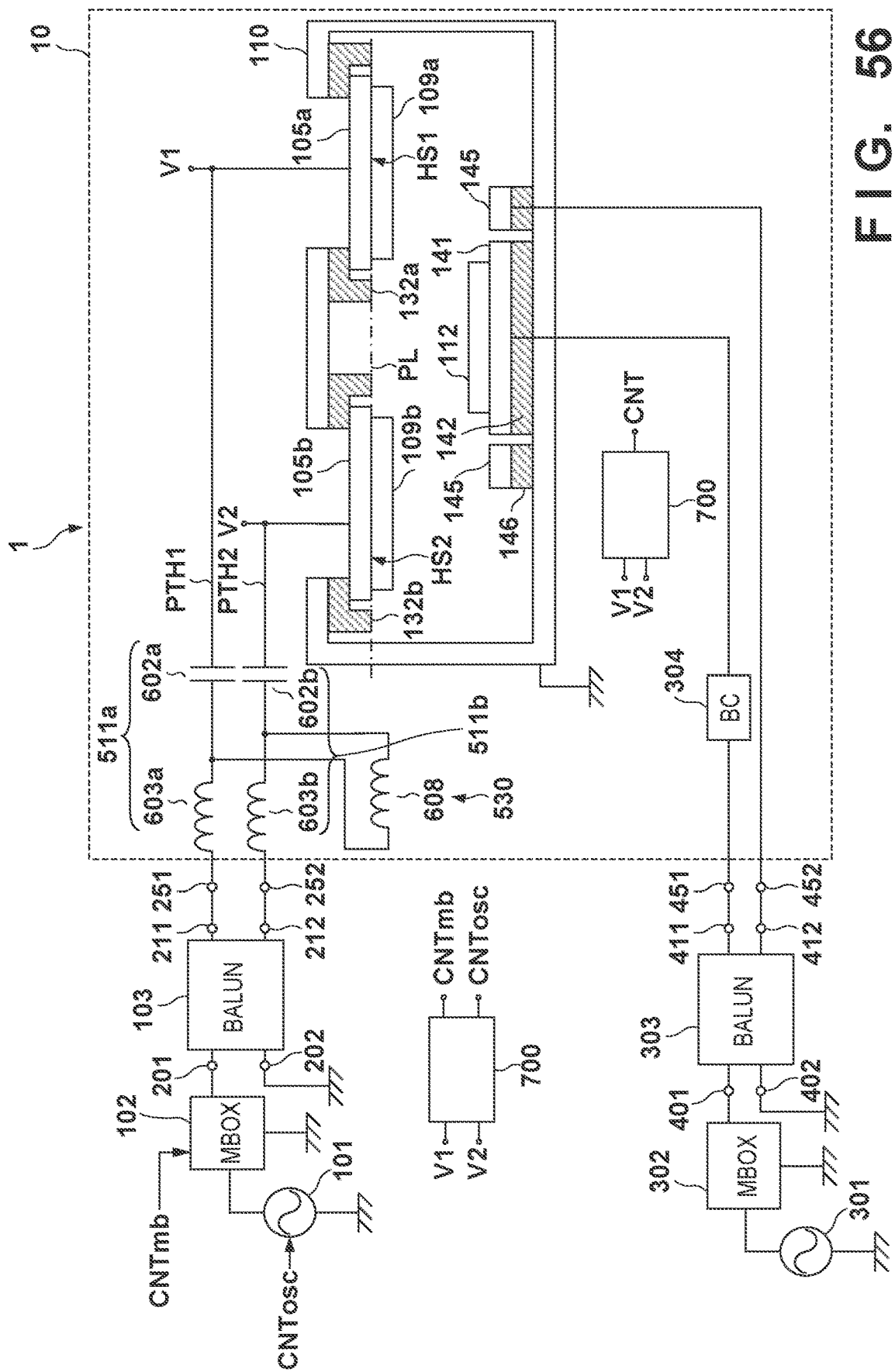
FIG. 56 is a view schematically showing the arrangement of a plasma processing apparatus 1 according to the 43rd embodiment of the present invention.

FIG. 56 schematically shows the arrangement of a plasma processing apparatus 1 according to the 43rd embodiment of the present invention. The plasma processing apparatus 1 according to the 43rd embodiment has an arrangement in which a controller 700 is added to the plasma processing apparatus according to the 33rd embodiment shown in FIG. 45. Matters that are not mentioned as the 43rd embodiment can comply with the 41st embodiment. The controller 700 adjusts the frequency of a high frequency generated by a high-frequency power supply 101 based on a first voltage V1 of a first electrode 105a and a second voltage V2 of a second electrode 105b such that, for example, the first voltage V1 obtains a first target value, and the second voltage V2 obtains a second target value. For example, based on the first voltage V1 of the first electrode 105a and the second voltage V2 of the second electrode 105b, the controller 700 generates an instruction value CNTosc that adjusts the frequency of the high frequency generated by the high-frequency power supply 101 to change the value of an adjustment reactance. The instruction value CNTosc is supplied to the high-frequency power supply 101. The high-frequency power supply 101 changes the frequency of the high frequency generated by itself in accordance with the instruction value CNTosc. The controller 700 can include a measurement unit configured to measure the first voltage V1 that is the voltage of the first electrode 105a and the second voltage V2 that is the voltage of the second electrode 105b. Alternatively, for such measurement, a unit may be provided separately from the controller 700.

Figure 57:
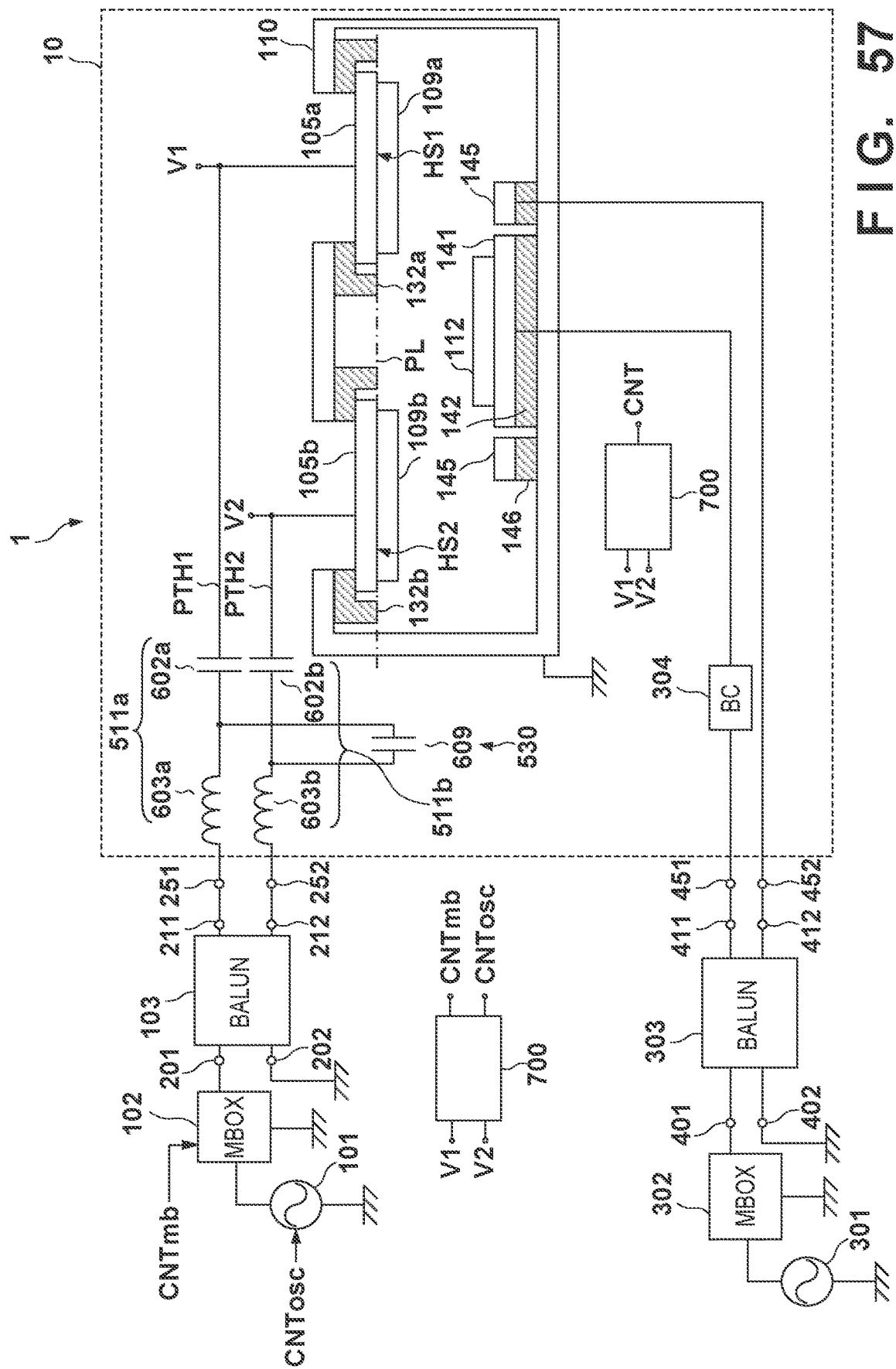
FIG. 57 is a view schematically showing the arrangement of a plasma processing apparatus 1 according to the 44th embodiment of the present invention.

FIG. 57 schematically shows the arrangement of a plasma processing apparatus 1 according to the 44th embodiment of the present invention. The plasma processing apparatus 1 according to the 44th embodiment has an arrangement in which a controller 700 is added to the plasma processing apparatus according to the 34th embodiment shown in FIG. 46. Matters that are not mentioned as the 42nd embodiment can comply with the 41st embodiment. The controller 700 adjusts the frequency of a high frequency generated by a high-frequency power supply 101 based on a first voltage V1 of a first electrode 105a and a second voltage V2 of a second electrode 105b such that, for example, the first voltage V1 obtains a first target value, and the second voltage V2 obtains a second target value. For example, based on the first voltage V1 of the first electrode 105a and the second voltage V2 of the second electrode 105b, the controller 700 generates an instruction value CNTosc that adjusts the frequency of the high frequency generated by the high-frequency power supply 101 to change the value of an adjustment reactance. The instruction value CNTosc is supplied to the high-frequency power supply 101. The high-frequency power supply 101 changes the frequency of the high frequency generated by itself in accordance with the instruction value CNTosc. The controller 700 can include a measurement unit configured to measure the first voltage V1 that is the voltage of the first electrode 105a and the second voltage V2 that is the voltage of the second electrode 105b. Alternatively, for such measurement, a unit may be provided separately from the controller 700.

Figure 58:
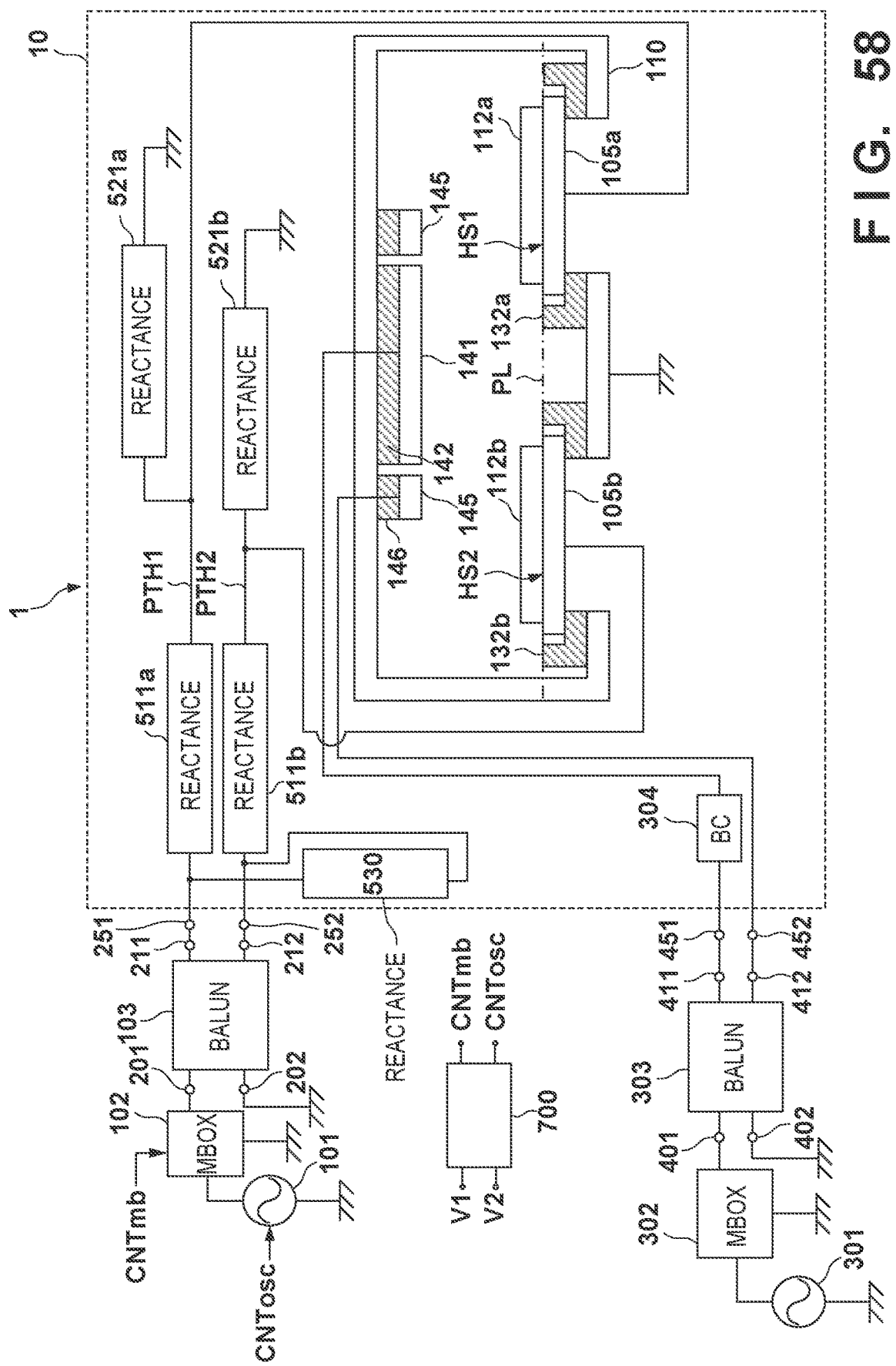
FIG. 58 is a view schematically showing the arrangement of a plasma processing apparatus 1 according to the 45th embodiment of the present invention.

FIG. 58 schematically shows the arrangement of a plasma processing apparatus 1 according to the 45th embodiment of the present invention. The plasma processing apparatus 1 according to the 45th embodiment can operate as an etching apparatus for etching substrates 112a and 112b. The plasma processing apparatus 1 according to the 45th embodiment can have an arrangement similar to the plasma processing apparatus 1 according to the 30th embodiment except a controller 700. Matters that are not mentioned as the 45th embodiment can comply with the 41st embodiment.

In one arrangement example, as an adjustment reactance that affects the relationship between a first voltage applied to a first electrode 105a and a second voltage applied to a second electrode 105b, the plasma processing apparatus 1 includes at least one of (a) a reactance 511a arranged on a first path PTH1 that connects a first balanced terminal 211 and the first electrode 105a, (b) a reactance 521a arranged between the first electrode 105a and ground, (c) a reactance 511b arranged on a second path PTH2 that connects a second balanced terminal 212 and the second electrode 105b, (d) a reactance 521b arranged between the second electrode 105b and ground, and (e) a reactance 530 that connects the first path PTH1 and the second path PTH2.

By adjusting the frequency of a high frequency generated by a high-frequency power supply 101, the etching amount distribution of the first substrate 112a and the etching amount distribution of the second substrate 112b can be adjusted. Alternatively, by adjusting the frequency of a high frequency generated by the high-frequency power supply 101, the etching amount distribution of the first substrate 112a and the etching amount distribution of the second substrate 112b can be made equal.

Note that in the 41st to 45th embodiments described with reference to FIGS. 54 to 58, electrodes are arranged on the facing surfaces of targets 109a and 109b. However, these are not limited to the electrodes. A cylindrical substrate rotation holder in a plasma apparatus of a so-called carousel type (for example, Japanese Patent Laid-Open Nos. 2003-155556 and 62-133065) or a rectangular substrate tray in a plasma apparatus of a so-called inline type (for example, Japanese Patent No. 5824072 and Japanese Patent Laid-Open No. 2011-144450) may be arranged.

In the 41st to 45th embodiments described with reference to FIGS. 54 to 58, the controller 700 adjusts the frequency of a high frequency generated by the high-frequency power supply 101 based on the first voltage V1 of the first electrode 105a and the second voltage V2 of the second electrode 105b. In place of this arrangement, the controller 700 may be configured to adjust the frequency of a high frequency generated by the high-frequency power supply 101 based on a plasma intensity near the first electrode 105a and a plasma intensity near the second electrode 105b. The plasma intensity near the first electrode 105a can be detected by, for example, a photoelectric conversion device. Similarly, the plasma intensity near the second electrode 105b can be detected by, for example, a photoelectric conversion device. The controller 700 can be configured to adjust the frequency of a high frequency generated by the high-frequency power supply 101 based on the plasma intensity near the first electrode 105a and the plasma intensity near the second electrode 105b such that, for example, the plasma intensity near the first electrode 105a and the plasma intensity near the second electrode 105b become equal.

Figure 60:
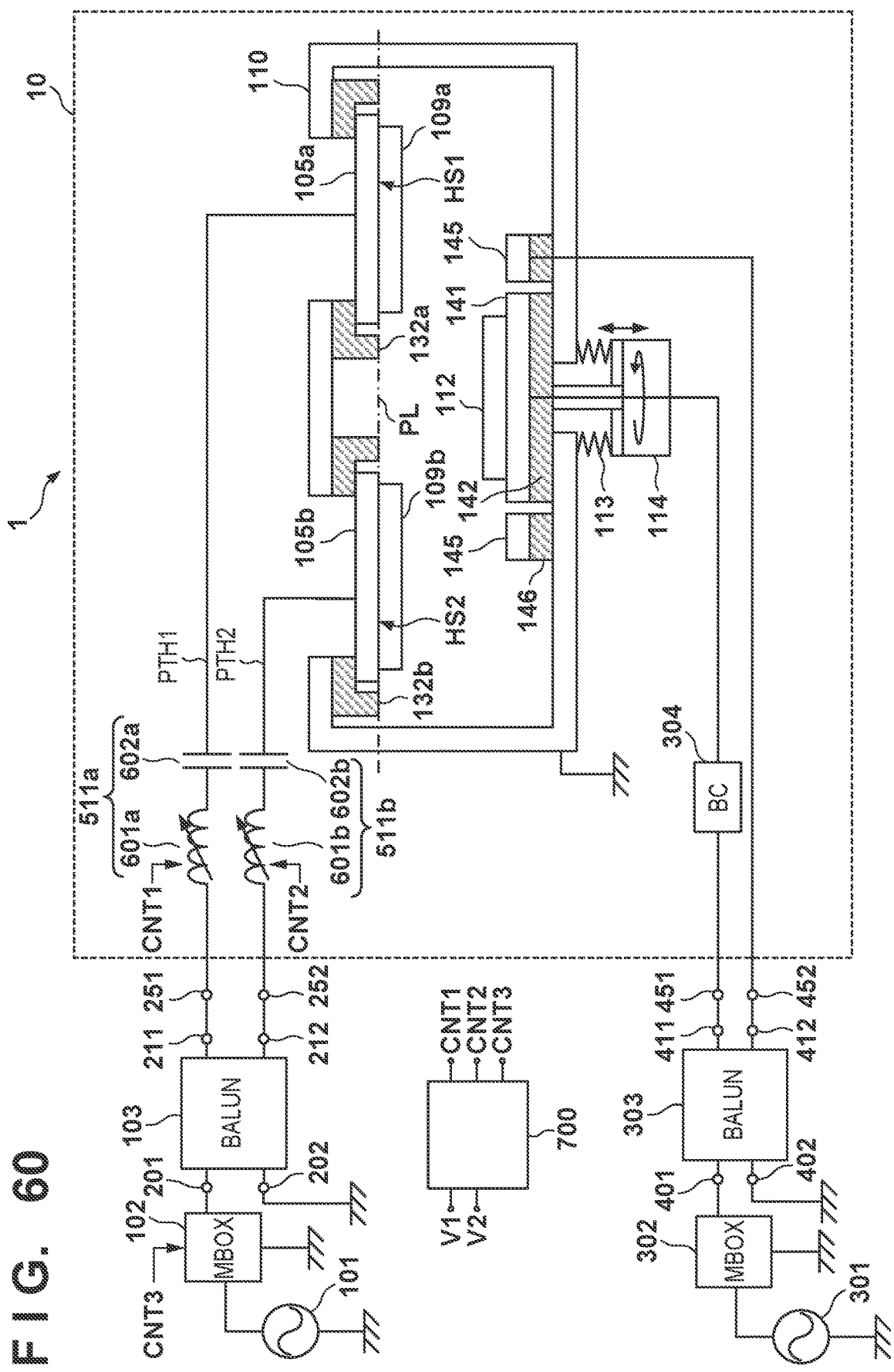
FIG. 60 is a view schematically showing the arrangement of a plasma processing apparatus 1 according to the 46th embodiment of the present invention.

FIG. 60 schematically shows the arrangement of a plasma processing apparatus 1 according to the 46h embodiment of the present invention. The plasma processing apparatus 1 according to the 46th embodiment is a modification of the plasma processing apparatuses 1 according to the 23rd to 29th embodiments described with reference to FIGS. 33 to 41. The plasma processing apparatus 1 according to the 46th embodiment further includes at least one of a mechanism configured to move a first electrode 141 holding a substrate 112 up and down and a mechanism configured to rotate the first electrode 141. In the example shown in FIG. 60, the plasma processing apparatus 1 includes a driving mechanism 114 including both the mechanism configured to move the first electrode 141 up and down and the mechanism configured to rotate the first electrode 141. A bellows 113 that forms a vacuum partition can be provided between a vacuum container 110 and the driving mechanism 114.

Figure 61:
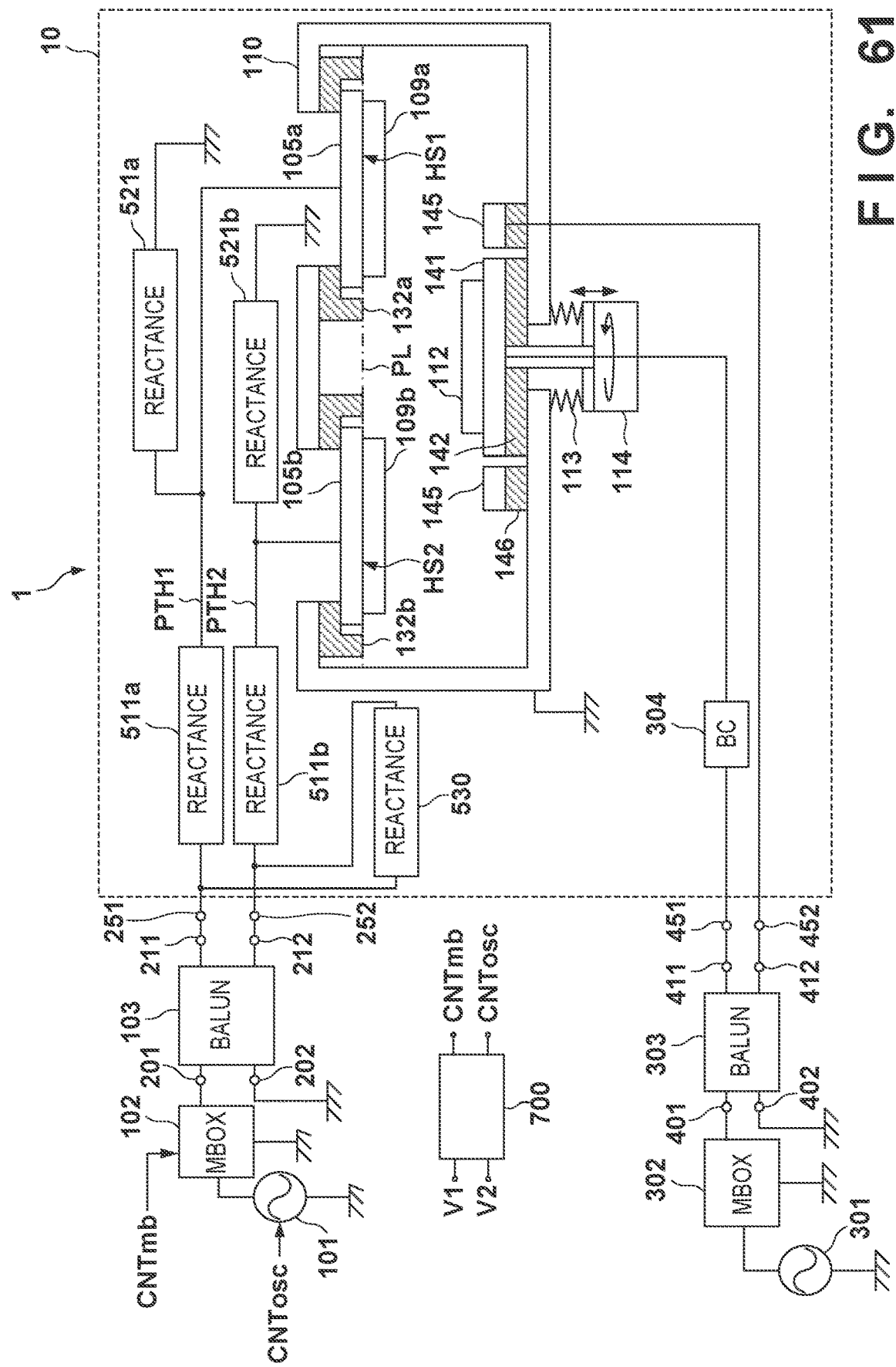
FIG. 61 is a view schematically showing the arrangement of a plasma processing apparatus 1 according to the 47th embodiment of the present invention.

FIG. 61 schematically shows the arrangement of a plasma processing apparatus 1 according to the 47th embodiment of the present invention. The plasma processing apparatus 1 according to the 47th embodiment is a modification of the plasma processing apparatuses 1 according to the 30th to 45th embodiments described with reference to FIGS. 42 to 59. The plasma processing apparatus 1 according to the 47th embodiment further includes at least one of a mechanism configured to move a first electrode 141 holding a substrate 112 up and down and a mechanism configured to rotate the first electrode 141. In the example shown in FIG. 61, the plasma processing apparatus 1 includes a driving mechanism 114 including both the mechanism configured to move the first electrode 141 up and down and the mechanism configured to rotate the first electrode 141. A bellows 113 that forms a vacuum partition can be provided between a vacuum container 110 and the driving mechanism 114.

The present invention is not limited to the above embodiments, and various changes and modifications can be made within the spirit and scope of the present invention. Therefore, to apprise the public of the scope of the present invention, the following claims are made.

REFERENCE SIGNS LIST

1 . . . plasma processing apparatus, 10 . . . main body, 101 . . . high-frequency power supply, 102 . . . impedance matching circuit, 103 . . . balun, 104 . . . blocking capacitor, 106 . . . first electrode, 107, 108 . . . insulator, 109 . . . target, 110 . . . vacuum container, 111 . . . second electrode, 112 . . . substrate, 201 . . . first unbalanced terminal, 202 . . . second unbalanced terminal, 211 . . . first balanced terminal, 212 . . . second balanced terminal, 251 . . . first terminal, 252 . . . second terminal, 221 . . . first coil, 222 . . . second coil, 223 . . . third coil, 224 . . . fourth coil, 511*a*, 511*b*, 521*a*, 521*b*, 530 . . . variable reactance, 700 . . . controller

The invention claimed is:

1. A plasma processing apparatus comprising:
an impedance matching circuit;
a balun including a first unbalanced terminal connected to the impedance matching circuit, a grounded second unbalanced terminal, a first balanced terminal, and a second balanced terminal;
a grounded vacuum container;
a first electrode electrically connected to the first balanced terminal;
a second electrode electrically connected to the second balanced terminal;
an adjustment reactance configured to affect a relationship between a first voltage applied to the first electrode and a second voltage applied to the second electrode;
a high-frequency power supply configured to supply a high frequency between the first unbalanced terminal and the second unbalanced terminal via the impedance matching circuit; and
a controller configured to control an impedance of the impedance matching circuit and a reactance of the adjustment reactance,
wherein the first electrode is configured to hold a first target, the second electrode is configured to hold a second target, the first electrode faces a space on a side of a substrate as a processing target via the first target, and the second electrode faces the space via the second target, and
wherein the adjustment reactance includes capacitance arranged on a path that connects the first electrode and ground, and capacitance arranged on a path that connects the second electrode and the ground.

2. The plasma processing apparatus according to claim 1, wherein the controller controls the impedance of the impedance matching circuit such that the impedance matches an impedance when a side of the first electrode and the second electrode is viewed from a side of the first balanced terminal and the second balanced terminal.

3. The plasma processing apparatus according to claim 1, wherein after plasma is ignited by controlling the impedance of the impedance matching circuit to an impedance for ignition of plasma, the controller controls the impedance of the impedance matching circuit such that the impedance matches an impedance when a side of the first electrode and the second electrode is viewed from a side of the first balanced terminal and the second balanced terminal.

4. The plasma processing apparatus according to claim 1, wherein the controller controls the reactance of the adjustment reactance such that a voltage of the first electrode obtains a first target value, and a voltage of the second electrode obtains a second target value.

5. A plasma processing apparatus comprising:
an impedance matching circuit;
a balun including a first unbalanced terminal connected to the impedance matching circuit, a grounded second unbalanced terminal, a first balanced terminal, and a second balanced terminal;
a grounded vacuum container;
a first electrode electrically connected to the first balanced terminal;
a second electrode electrically connected to the second balanced terminal;
an adjustment reactance configured to affect a relationship between a first voltage applied to the first electrode and a second voltage applied to the second electrode;
a high-frequency power supply configured to supply a high frequency between the first unbalanced terminal and the second unbalanced terminal via the impedance matching circuit; and
a controller configured to control an impedance of the impedance matching circuit and a reactance of the adjustment reactance,
wherein after plasma is ignited by controlling the impedance of the impedance matching circuit to an impedance for ignition of plasma, the controller controls the impedance of the impedance matching circuit such that the impedance matches an impedance when a side of the first electrode and the second electrode is viewed from a side of the first balanced terminal and the second balanced terminal,
wherein a magnitude relationship between a voltage of the first electrode and a voltage of the second electrode is capable of being reversed by changing the reactance of the adjustment reactance, and
wherein the controller controls the reactance of the adjustment reactance such that a difference between a voltage of the first electrode and a voltage of the second electrode obtains a target difference value.

6. The plasma processing apparatus according to claim 5, wherein the controller supplies an instruction value used to control the reactance of the adjustment reactance to the adjustment reactance, and the adjustment reactance changes the reactance of its own in accordance with the instruction value.

7. The plasma processing apparatus according to claim 5, wherein the high-frequency power supply can change a frequency of the high frequency, and the controller supplies an instruction value used to control a frequency of the high-frequency power supply to the high-frequency power supply such that the relationship is adjusted by changing the frequency.

8. The plasma processing apparatus according to claim 5, wherein the first electrode includes a first holding surface configured to hold a first member, the second electrode includes a second holding surface configured to hold a second member, and the first holding surface and the second holding surface belong to one plane.

9. The plasma processing apparatus according to claim 5, wherein the adjustment reactance further includes at least one of a reactance arranged on a first path that connects the first balanced terminal and the first electrode, a reactance arranged on a second path that connects the second balanced terminal and the second electrode, and a reactance that connects the first path and the second path.

10. The plasma processing apparatus according to claim 5, wherein the adjustment reactance further includes at least one of a first reactance arranged on a first path that connects the first balanced terminal and the first electrode, and a second reactance arranged on a second path that connects the second balanced terminal and the second electrode.

11. The plasma processing apparatus according to claim 10, wherein
the first reactance includes an inductor, and
the second reactance includes an inductor.

12. The plasma processing apparatus according to claim 10, wherein
the first reactance includes a capacitor, and
the second reactance includes a capacitor.

13. The plasma processing apparatus according to claim 1, wherein the controller controls the adjustment reactance based on the voltage of the first electrode and the voltage of the second electrode.

14. The plasma processing apparatus according to claim 5, wherein the controller controls the adjustment reactance based on a plasma intensity near the first electrode and a plasma intensity near the second electrode.

15. The plasma processing apparatus according to claim 5, further comprising:
a substrate holding portion configured to hold the substrate; and
a driving mechanism configured to rotate the substrate holding portion.

16. The plasma processing apparatus according to claim 5, wherein letting Rp be a resistance component between the first balanced terminal and the second balanced terminal when the side of the first electrode and the second electrode is viewed from the side of the first balanced terminal and the second balanced terminal, and X be an inductance between the first unbalanced terminal and the first balanced terminal, $1.5 \leq X/Rp \leq 5000$ is satisfied.

17. The plasma processing apparatus according to claim 5, wherein the balun includes a first coil that connects the first unbalanced terminal and the first balanced terminal, and a second coil that connects the second unbalanced terminal and the second balanced terminal.

18. The plasma processing apparatus according to claim 17, wherein the balun further includes a third coil and a fourth coil, which are connected between the first balanced terminal and the second balanced terminal, and the third coil and the fourth coil are configured to set a voltage of a connection node between the third coil and the fourth coil to a middle point between a voltage of the first balanced terminal and a voltage of the second balanced terminal.

19. A plasma processing method of processing a substrate in a plasma processing apparatus including an impedance matching circuit, a balun including a first unbalanced terminal connected to the impedance matching circuit, a grounded second unbalanced terminal, a first balanced terminal, and a second balanced terminal, a grounded vacuum container, a first electrode electrically connected to the first balanced terminal, a second electrode electrically connected to the second balanced terminal, an adjustment reactance configured to affect a relationship between a first voltage applied to the first electrode and a second voltage applied to the second electrode, and a high-frequency power supply configured to supply a high frequency between the first unbalanced terminal and the second unbalanced terminal via the impedance matching circuit, wherein the first electrode is configured to hold a first target, the second electrode is configured to hold a second target, the first electrode faces a space on a side of a substrate as a processing target via the first target, and the second electrode faces the space via the second target, and wherein the adjustment reactance includes capacitance arranged on a path that connects the first electrode and ground, and capacitance arranged on a path that connects the second electrode and the ground, the method comprising:
a matching step of controlling an impedance of the impedance matching circuit such that the impedance matches an impedance when a side of the first electrode and the second electrode is viewed from a side of the first balanced terminal and the second balanced terminal;
an adjustment step of adjusting the adjustment reactance to adjust the relationship; and
a processing step of processing the substrate after the adjustment step.

20. The plasma processing method according to claim 19, further comprising an ignition step of igniting plasma in a state in which the impedance of the impedance matching circuit is set to an impedance for ignition of plasma,
wherein the matching step is executed after the ignition step.

21. The plasma processing method according to claim 19, wherein the adjustment step comprises controlling the reactance of the adjustment reactance such that a voltage of the first electrode obtains a first target value, and a voltage of the second electrode obtains a second target value.

22. A plasma processing method of processing a substrate in a plasma processing apparatus including an impedance matching circuit, a balun including a first unbalanced terminal connected to the impedance matching circuit, a grounded second unbalanced terminal, a first balanced terminal, and a second balanced terminal, a grounded vacuum container, a first electrode electrically connected to the first balanced terminal, a second electrode electrically connected to the second balanced terminal, an adjustment reactance configured to affect a relationship between a first voltage applied to the first electrode and a second voltage applied to the second electrode, and a high-frequency power supply configured to supply a high frequency between the first unbalanced terminal and the second unbalanced terminal via the impedance matching circuit, the method comprising:
- an ignition step of igniting plasma in a state in which an impedance of the impedance matching circuit is set to an impedance for ignition of plasma;
- a matching step of controlling the impedance of the impedance matching circuit such that the impedance matches an impedance when a side of the first electrode and the second electrode is viewed from a side of the first balanced terminal and the second balanced terminal;
- an adjustment step of adjusting the adjustment reactance to adjust the relationship; and
- a processing step of processing the substrate after the adjustment step,
- wherein a magnitude relationship between a voltage of the first electrode and a voltage of the second electrode is capable of being reversed by changing the reactance of the adjustment reactance, and
- wherein the adjustment step comprises controlling the reactance of the adjustment reactance such that a difference between a voltage of the first electrode and a voltage of the second electrode obtains a target difference value.

23. The plasma processing method according to claim 22, wherein the adjustment step comprises supplying an instruction value used to control the reactance of the adjustment reactance to the adjustment reactance and changing the reactance of the adjustment reactance by the adjustment reactance in accordance with the instruction value.

24. The plasma processing method according to claim 22, wherein the high-frequency power supply can change a frequency of the high frequency, and the adjustment step comprises supplying an instruction value used to control a frequency of the high-frequency power supply to the high-frequency power supply such that the relationship is adjusted by changing the frequency.

25. A non-transitory computer readable memory medium storing a program configured to cause a computer to execute a plasma processing method of claim 22.

26. A plasma processing apparatus comprising:
- an impedance matching circuit;
- a balun including a first unbalanced terminal connected to the impedance matching circuit, a grounded second unbalanced terminal, a first balanced terminal, and a second balanced terminal;
- a grounded vacuum container;
- a first electrode electrically connected to the first balanced terminal;
- a second electrode electrically connected to the second balanced terminal;
- an adjustment reactance configured to affect a relationship between a first voltage applied to the first electrode and a second voltage applied to the second electrode;
- a high-frequency power supply configured to supply a high frequency between the first unbalanced terminal and the second unbalanced terminal via the impedance matching circuit; and
- a measurement unit configured to measure a voltage of the first electrode and a voltage of the second electrode,
- wherein the first electrode is configured to hold a first target, the second electrode is configured to hold a second target, the first electrode faces a space on a side of a substrate as a processing target via the first target, and the second electrode faces the space via the second target,
- wherein the adjustment reactance includes capacitance arranged on a path that connects the first electrode and ground, and capacitance arranged on a path that connects the second electrode and the ground, and
- wherein a reactance of the adjustment reactance is adjusted based on the voltage of the first electrode and the voltage of the second electrode, which are measured by the measurement unit.

27. The plasma processing apparatus according to claim 26, wherein the adjustment reactance includes a variable inductor and a variable capacitor.

* * * * *